(12) United States Patent
Hoffman et al.

(10) Patent No.: US 11,927,607 B2
(45) Date of Patent: Mar. 12, 2024

(54) CURRENT SENSOR

(71) Applicant: Analog Devices International Unlimited Company, Limerick (IE)

(72) Inventors: Brent William Hoffman, Mooresville, IN (US); Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/695,797

(22) Filed: Mar. 15, 2022

(65) Prior Publication Data

US 2023/0296652 A1 Sep. 21, 2023

(51) Int. Cl.
*G01R 19/00* (2006.01)
*G01R 15/18* (2006.01)
*H05K 1/18* (2006.01)

(52) U.S. Cl.
CPC ....... *G01R 19/0092* (2013.01); *G01R 15/181* (2013.01); *H05K 1/181* (2013.01); *H05K 2201/10151* (2013.01)

(58) Field of Classification Search
CPC .. G01R 19/0092; G01R 15/181; H05K 1/181; H05K 2201/10151
See application file for complete search history.

(56) References Cited

U.S. PATENT DOCUMENTS

| | | | |
|---|---|---|---|
| 6,313,623 B1 | 11/2001 | Kojovic et al. | |
| 6,624,624 B1 | 9/2003 | Karrer et al. | |
| 10,416,195 B2 | 9/2019 | Hurwitz et al. | |
| 10,859,605 B2 * | 12/2020 | Hurwitz | G01R 3/00 |
| 10,859,606 B2 * | 12/2020 | Takano | G01R 15/205 |
| 2004/0178875 A1 | 9/2004 | Saito | |
| 2005/0248430 A1 | 11/2005 | Dupraz et al. | |
| 2007/0152651 A1 | 7/2007 | Shiokawa et al. | |
| 2008/0007249 A1 | 1/2008 | Wilkerson et al. | |
| 2012/0049839 A1 | 3/2012 | Kiendl | |
| 2016/0116504 A1 | 4/2016 | Tang et al. | |
| 2016/0154027 A1 | 6/2016 | Claeys | |

(Continued)

FOREIGN PATENT DOCUMENTS

| | | |
|---|---|---|
| CN | 101625377 A | 1/2010 |
| CN | 109100558 A | 12/2018 |

(Continued)

OTHER PUBLICATIONS

International Search Report and Written Opinion in PCT/EP2023/054529, dated Jul. 31, 2023, 20 pages.

(Continued)

*Primary Examiner* — Farhana A Hoque
(74) *Attorney, Agent, or Firm* — ARENTFOX SCHIFF LLP

(57) ABSTRACT

A rate of change of current sensor includes two measurement coils, arranged on a substrate or printed circuit board. The coils form loops and progress substantially around a target measurement conductor. This ensures that the two measurement coils both receive the same electrostatic coupling from external conductors which are not the target of the measurement operation. Further, the two measurement coils are arranged such that the first coil and the second coil are, on average, the same distance to the current-carrying conductor of interest.

20 Claims, 26 Drawing Sheets

(56) References Cited

U.S. PATENT DOCUMENTS

| | | |
|---|---|---|
| 2016/0266171 A1 | 9/2016 | Walsh et al. |
| 2017/0356935 A1 | 12/2017 | Hurwitz |
| 2018/0120357 A1 | 5/2018 | Takenaka |
| 2019/0383859 A1 | 12/2019 | Hurwitz |
| 2020/0386792 A1 | 12/2020 | Rondot et al. |
| 2021/0351728 A1 | 11/2021 | Pollock et al. |

FOREIGN PATENT DOCUMENTS

| | | |
|---|---|---|
| EP | 2653876 B1 | 9/2014 |
| FR | 3055416 A1 | 3/2018 |
| WO | 2021136710 A1 | 7/2021 |

OTHER PUBLICATIONS

Ming et al., "Structure and modelling of four-layer screen-returned PCB Rogowski coil with very few turns for high-bandwidth SiC current measurement," IET Power Electronics, Jan. 30, 2020, vol. 13, No. 4, pp. 765-775.

Shi et al., "A Review of Traditional Helical to Recent Miniaturized Printed Circuit Board Rogowski Coils for Power-Electronic Applications," IEEE Transactions on Power Electronics, Apr. 2, 2020, vol. 35, No. 11, p. 12207-12222.

International Search Report and Written Opinion in PCT/EP2023/054530, dated Jul. 31, 2023, 12 pages.

\* cited by examiner

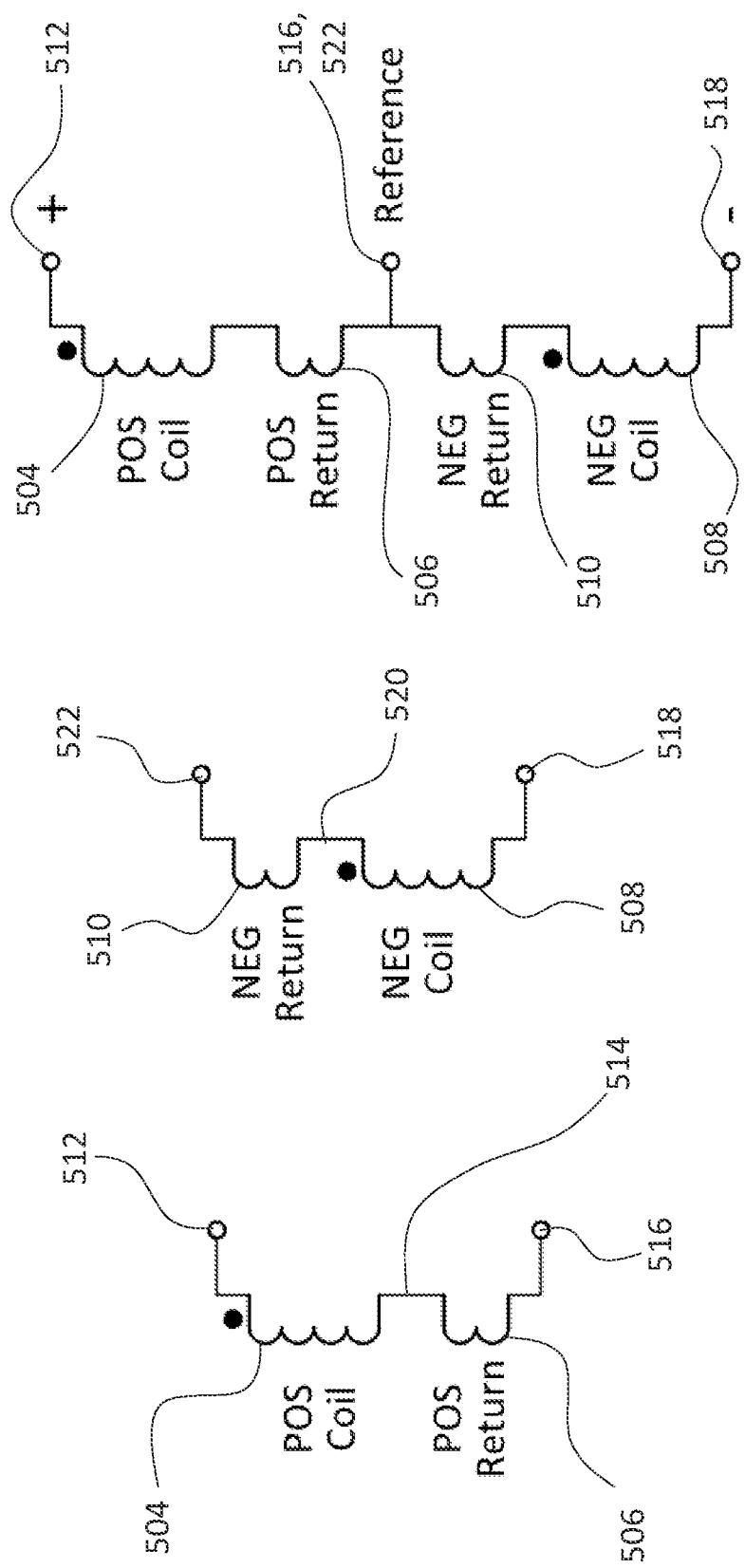

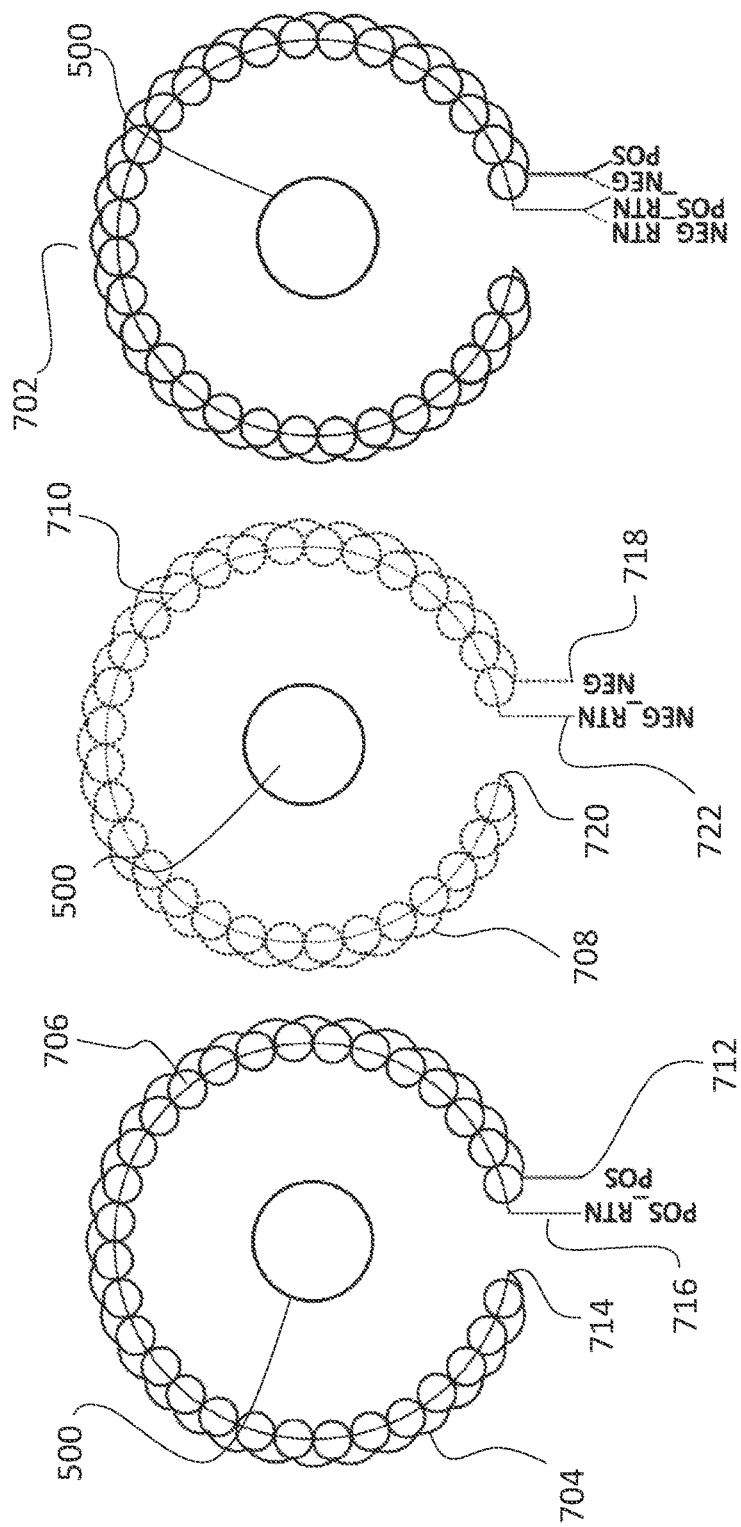

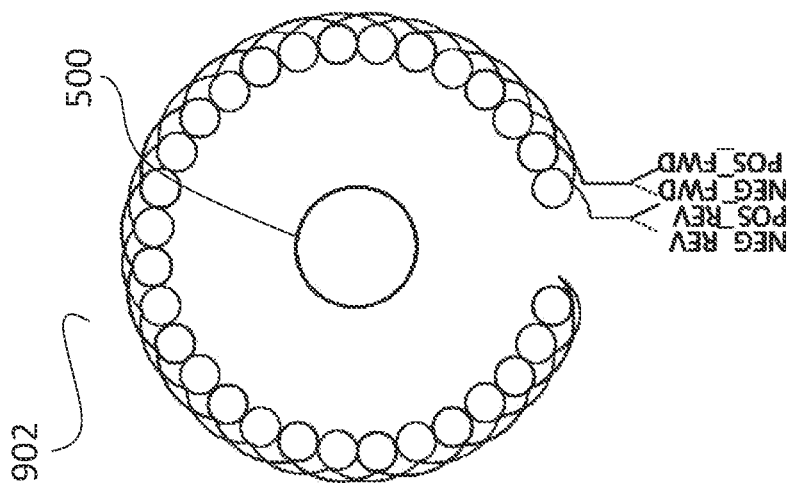
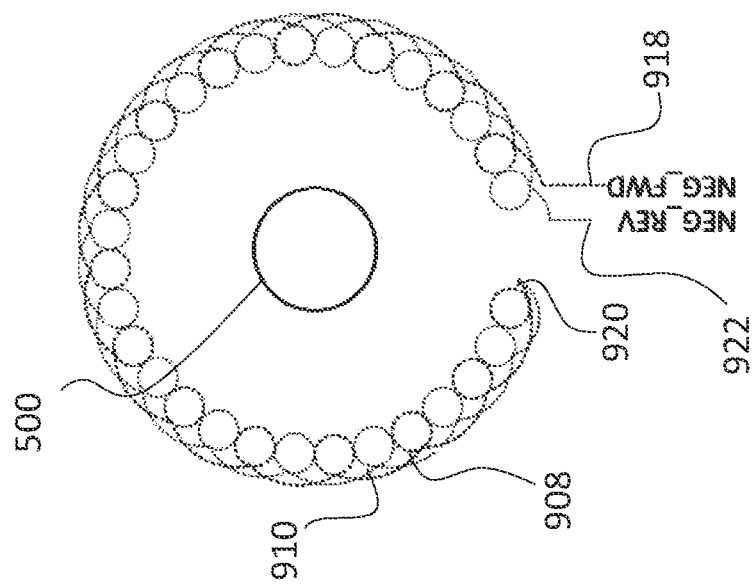
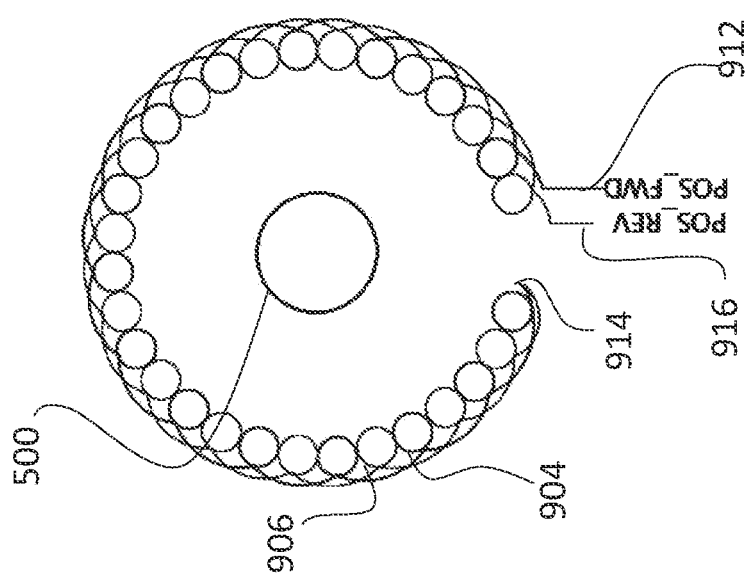
FIG. 9c
FIG. 9b
FIG. 9a

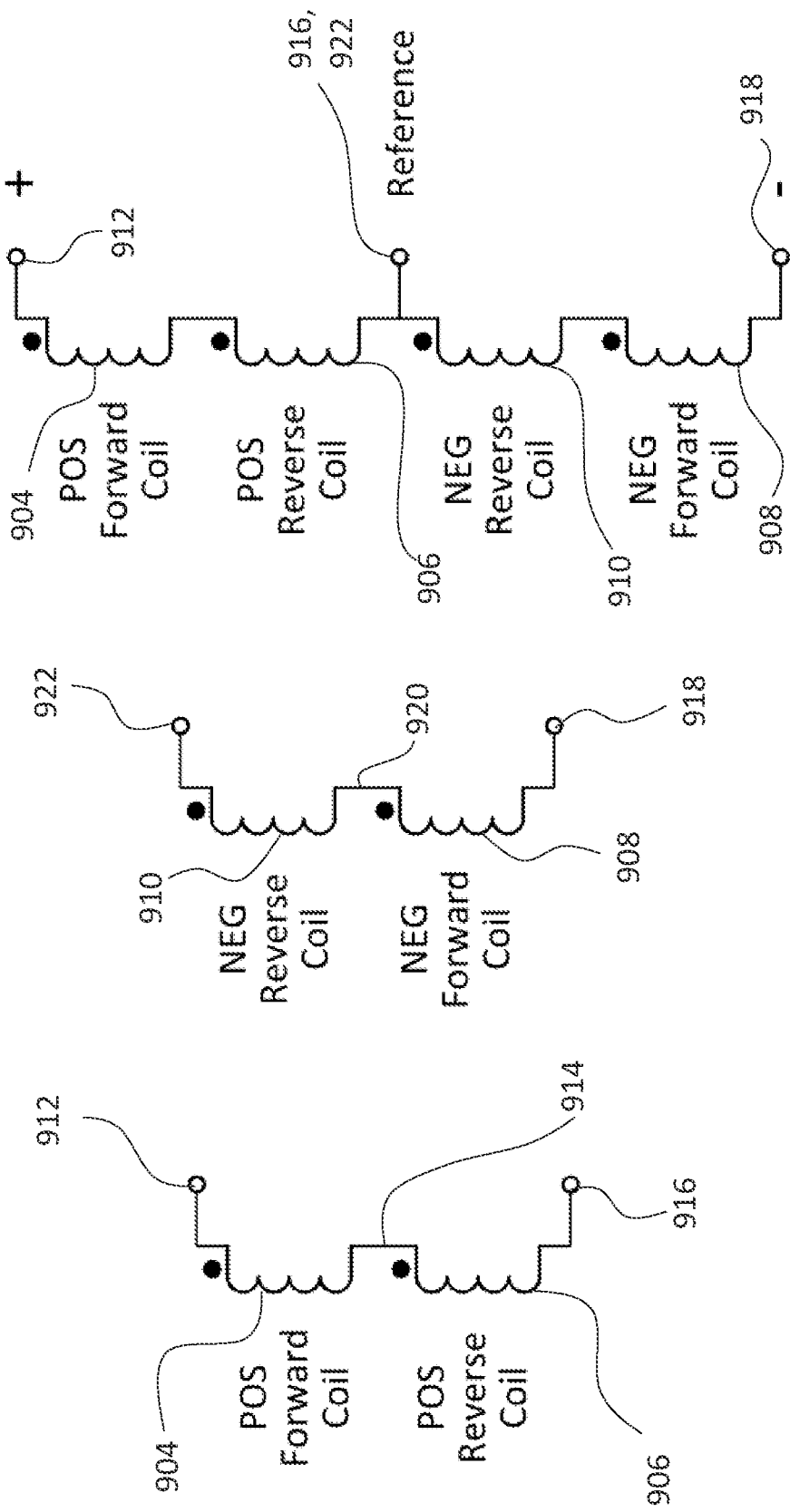

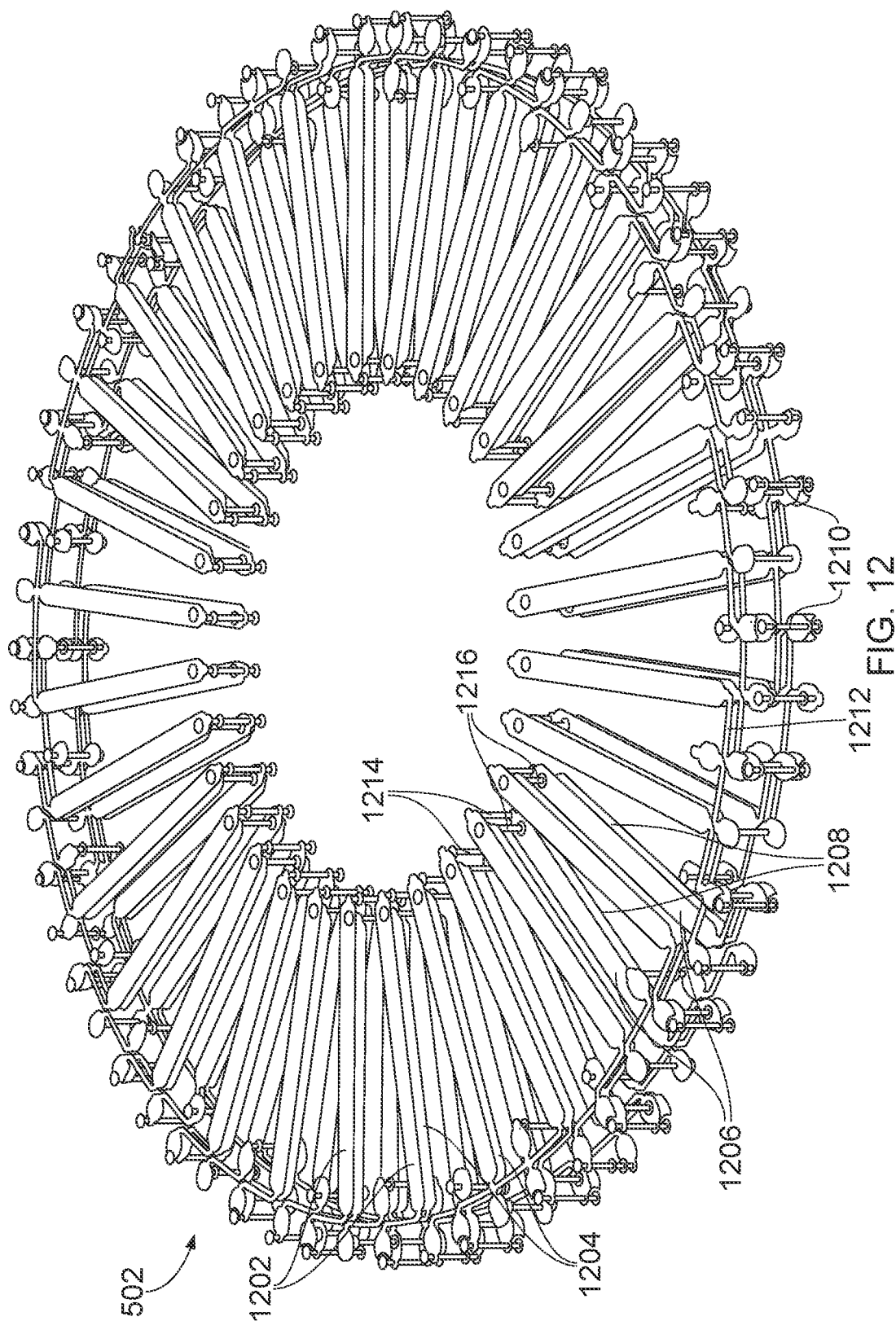

CURRENT SENSOR

TECHNICAL FIELD

The present disclosure relates to current sensors, and in particular to differential current sensors.

BACKGROUND

Current sensors detect and measure an electrical current passing through a conductor. They are used in many different applications, for example, to provide accurate current measurement in utility meters.

One type of current sensor uses a shunt resistor in series with the current-carrying conductor. The voltage drop across the resistor may be measured and, through knowledge of the resistance of the shunt, the current through the resistor may be calculated. However, at higher currents the temperature of the shunt may increase, changing the resistance of the shunt, and therefore providing an inaccurate current measurement. Further, as the shunt is located directly in the measured current path, isolating circuitry may be required between the shunt and the sensitive measurement and processing electronics.

Another type of current sensor uses an electromagnetic transducer to detect changes in a magnetic field generated by the current-carrying conductor. These rate of change of field current sensors, for example Rogowski coils, do not require any physical connection to the current-carrying conductor, and are therefore isolated from the current-carrying conductor without the need for any further isolating componentry.

However, as the rate of change of field sensor relies on the coupling of magnetic fields, they are susceptible to interference generated by other changing magnetic fields in the vicinity of the sensor. For example, a second current-carrying conductor, which is not the target of the measurement operation, may pass near the Rogowski coil. There may be some coupling of the magnetic field generated by this second current-carrying conductor into the Rogowski coil, affecting the measurement accuracy of the coil.

A compensation wire, compensation conductor, or return wire, returning from the end of the coil to the beginning, such that both terminals of the Rogowski coil are at the same end, may be used to cancel the effects of external transverse magnetic fields. The compensation conductor forms an opposing loop to the helical measurement coil, cancelling the effects of external fields. However, even with the compensation conductor to help with the rejection of external magnetic fields, the Rogowski coil may still be subject to external interference due to a conductor's electrostatic coupling into the coil.

A major challenge with Rogowski coils is this sensitivity to electrostatic or capacitive coupling from nearby alternating current (AC) conductors. For example, in a utility meter, electrostatic coupling may be prevalent due to the positioning of the AC bus bar which carries the current to be measured, but also carries the phase voltage which is typically 240V. With electrostatic coupling the voltage on the bus bar couples into the coil through stray capacitance, and because of the high voltage of the conductor only a small stray capacitance can result in an erroneous signal in the sensor.

The sensitivity of this coupling to the relative position of the coil to the conductor and from environment changes is also important if it is to be accounted for and nullified algorithmically. This is often practically impossible because of the variation and drift, so what is needed is to have less sensitivity to electrostatic coupling.

To reduce the effect of external electrostatic interference, shielding may be provided around the measurement coil. However, shielding the coil may introduce excessive manufacturing demands, as well as increasing the size of the measurement apparatus.

SUMMARY

There exists a need to provide an improved means of current measurement which reduces the effect of external fields on measurement accuracy, and/or reduces the effects of electrostatic coupling into the coil under all conditions of the conductor under test's position.

The present disclosure provides improved rate of change of current sensors, for example Rogowski coils, designed to reduce the impact of electrostatic noise coupling. The rate of change of current sensor, arranged to measure the current in a current-carrying conductor, includes two measurement coils, which are formed on a printed circuit board or substrate. The measurement coils may progress around substantially surround the current-carrying conductor, which can reduce sensitivity to the position of the current-carrying conductor, as well as providing a common-mode coupling of the noise fields, such that each measurement coil receives the same amount of electrostatic coupling. This common electrostatic coupling may then be easily cancelled or removed.

In a first aspect of the present disclosure, there is provided a rate of change of current sensor, the rate of change of current sensor comprising: a substrate, the substrate comprising a first layer and a second layer, wherein the substrate includes a path for at least one current-carrying conductor; a first plurality of measurement conductors, formed on the first layer of the substrate; a second plurality of measurement conductors, formed on the second layer of the substrate; a first plurality of vias, formed in the substrate, arranged to connect the ends of the first plurality of measurement conductors with the respective ends of the second plurality of measurement conductors, so as to form a first current measurement coil which progresses around the path in a first circumferential direction and a second current measurement coil which progresses around the path in a second circumferential direction, wherein each measurement conductor on the first layer of the substrate is aligned with a respective measurement conductor on the second layer of the substrate in a radial plane that is perpendicular to the surface of the substrate.

The first measurement coil and the second measurement coil may be interleaved, such that a first turn of the first measurement coil comprises a measurement conductor of the first plurality of measurement conductors and a measurement conductor of the second plurality of measurement conductors located in a first radial plane, and that a first turn of the second measurement coil comprises a measurement conductor of the first plurality of measurement conductors and a measurement conductor of the second plurality of measurement conductors in a second radial plane.

The first circumferential direction and the second circumferential direction may be the same circumferential direction.

The first circumferential direction and the second circumferential direction may be opposite circumferential directions.

The rate of change of current sensor may further comprise a third plurality of measurement conductors, formed on the first layer of the substrate; a fourth plurality of measurement conductors, formed on the second layer of the substrate; and a second plurality of vias; wherein the second plurality of vias are arranged to connect the ends of the third plurality of measurement conductors with respective ends of the fourth plurality of measurement conductors so as to form a first return coil and a second return coil, wherein a first end of the first return coil is coupled to a second end of the first measurement coil, the first return coil progressing around the path in a direction opposite to the first circumferential direction, wherein a first end of the second return coil is coupled to a second end of the second measurement coil, the second return coil progressing around the path in a direction opposite to the second circumferential direction, and wherein a first end of the first measurement coil is suitable for coupling to a measurement circuit and a first end of the second measurement coil is suitable for coupling to the measurement circuit.

The first measurement coil, the first return coil, the second measurement coil, and the second return coil may be interleaved, such that: a first turn of the first return coil comprises a measurement conductor of the third plurality of measurement conductors and a measurement conductor of the fourth plurality of measurement conductors located in a third radial plane; a first turn of the second return coil comprises a measurement conductor of the third plurality of measurement conductors and a measurement conductor of the fourth plurality of measurement conductors located in a fourth radial plane; and wherein the first radial plane, the third radial plane, the second radial plane and the fourth radial plane are arranged such that they are adjacent, in that order, in a circumferential direction.

A first end of the first measurement coil may be suitable for coupling to a measurement circuit and a first end of the second measurement coil may be suitable for coupling to the measurement circuit, the first measurement circuit configured to determine the current passing through a current-carrying conductor under measurement.

The rate of change of current sensor may further comprise: a first connection conductor for connecting the first end of the first measurement coil to the measurement circuit; and a second connection conductor for connecting the first end of the second measurement coil to the measurement circuit, wherein the first connection conductor and the second connection conductor are arranged to form a twisted-pair arrangement on the substrate.

The first measurement coil and the second measurement coil may be coupled to the measurement circuit using the first layer and a measurement layer of the substrate, wherein the dielectric distance between the first layer and the measurement layer is smaller than the dielectric distance between the first layer and the second layer.

The substrate may comprise more than two layers, wherein the first layer of the substrate and the second layer of the substrate are internal layers of the substrate, such that the current measurement coils are located on internal layers of the substrate, and wherein the substrate comprises a third layer and a fourth layer, the third layer and fourth layer located externally to the first and second layer of the substrate, the third and fourth layers comprising a shield configured to reduce electrostatic coupling to the current measurement coils.

The path may be a through-hole in the substrate, and the through-hole may be plated to provide shielding to the through-hole.

The first plurality of vias may comprise a first circle of vias at the inner ends of the measurement conductors of the first and second plurality of measurement conductors, wherein vias of the first circle of vias are alternately used to form the first and second measurement coils by connecting measurement conductors of the first and second plurality of measurement conductors; the second plurality of vias may comprise a second circle of vias concentric with the first circle of vias at the inner ends of the measurement conductors of the third and fourth plurality of measurement conductors, wherein vias of the second circle of vias are alternately used to form the first and second return coils by connecting measurement conductors of the third and fourth plurality of measurement conductors; wherein the first circle and the second circle are concentric circles.

The rate of change of current sensor may further comprise a first compensation conductor, coupled to the first measurement coil, the first compensation conductor progressing around the path in a circumferential direction opposite to the first circumferential direction; and a second compensation conductor, coupled to the second measurement coil, the second compensation conductor progressing around the path in a circumferential direction opposite to the second circumferential direction.

The current-carrying conductor may be provided on the substrate, routed on outer layers of the substrate and then through the centre of the first current measurement coil and the second current measurement coil.

In a second aspect of the disclosure there is provided A rate of change of current sensor, the rate of change of current sensor comprising: a substrate, the substrate comprising a first layer, a second layer, a third layer and a fourth layer, wherein the substrate includes a path for at least one current-carrying conductor; a first plurality of measurement conductors, formed on the first layer of the substrate; a second plurality of measurement conductors, formed on the second layer of the substrate; a third plurality of measurement conductors, formed on the third layer of the substrate; a fourth plurality of measurement conductors, formed on the fourth layer of the substrate; a first plurality of vias, formed in the substrate, arranged to connect respective ends of the first plurality of measurement conductors, the second plurality of measurement conductors, the third plurality of measurement conductors and the fourth plurality of measurement conductors, so as to form a first current measurement coil which progresses around the path in a first circumferential direction and a second current measurement coil which progresses around the path in a second circumferential direction, wherein each measurement conductor on the first layer of the substrate is aligned with a respective measurement conductor on the second layer of the substrate, the third layer of the substrate and the fourth layer of the substrate, such that the respective measurement conductors form a radial plane which is substantially perpendicular to the surface of the substrate.

The first measurement coil and the second measurement coil may be interleaved, such that a first turn of the first measurement coil comprises a measurement conductor of the first plurality of measurement conductors and a measurement conductor of the third plurality of measurement conductors which are located in a first radial plane, and that a first turn of the second measurement coil comprises a measurement conductor of the second plurality of measurement conductors and a measurement conductor of the fourth plurality of measurement conductors located in the first radial plane.

The rate of change of current sensor may further comprise: a fifth plurality of measurement conductors, formed on the first layer of the substrate; a sixth plurality of measurement conductors, formed on the second layer of the substrate; a seventh plurality of measurement conductors, formed on the third layer of the substrate; a eighth plurality of measurement conductors, formed on the fourth layer of the substrate; a second plurality of vias, formed on the substrate, wherein the second plurality of vias are arranged to connect respective ends of the fifth plurality of measurement conductors, the sixth plurality of measurement conductors, the seventh plurality of measurement conductors and the eighth plurality of measurement conductors so as to form a first return coil and a second return coil, wherein a first end of the first return coil is coupled to a second end of the first measurement coil, the first return coil progressing around the path in a direction opposite to the first circumferential direction, wherein a first end of the second return coil is coupled to a second end of the second measurement coil, the second return coil progressing around the path in a direction opposite to the second circumferential direction, and wherein a first end of the first measurement coil is suitable for coupling to a measurement circuit and a first end of the second measurement coil is suitable for coupling to the measurement circuit.

The first return coil and the second return coil may be interleaved, such that a first turn of the first return coil comprises a measurement conductor of the fifth plurality of measurement conductors and a measurement conductor of the seventh plurality of measurement conductors located in a second radial plane, and that a first turn of the second return coil comprises a measurement conductor of the sixth plurality of measurement conductors and a measurement conductor of the eighth plurality of measurement conductors located in the second radial plane, and wherein the second radial plane is adjacent to the first radial plane in a circumferential direction.

The rate of change of current sensor may further comprise a first compensation conductor, coupled to the first measurement coil, the first compensation conductor progressing around the path in a circumferential direction opposite to the first circumferential direction; and a second compensation conductor, coupled to the second measurement coil, the second compensation conductor progressing around the path in a circumferential direction opposite to the second circumferential direction.

In a third aspect of the disclosure, there is provided a rate of change of current sensor, the rate of change of current sensor comprising: a substrate, the substrate including a path for a current-carrying conductor; a first measurement coil formed on the substrate, arranged to surround the path in a first plane of the substrate; a second measurement coil formed on the substrate, arranged to surround the path in the first plane of the substrate; wherein the first measurement coil is interleaved with the second measurement coil in a circumferential direction around the path.

In a fourth aspect of the present disclosure, there is provided a rate of change of current sensor, the rate of change of current sensor comprising: a path for at least one current-carrying conductor; a first measurement coil, wherein the first measurement coil progresses around the path in a first circumferential direction, the first measurement coil having a first end and a second end; a first return coil, the first return coil having a first end and a second end, wherein the first end of the first return coil is coupled to the second end of the first measurement coil, wherein the first return coil progresses around the path in an opposite circumferential direction to the first circumferential direction; a second measurement coil, wherein the second measurement coil progresses around the path in a second circumferential direction, the second measurement coil having a first end and a second end; and a second return coil, the second return coil having a first end and a second end, wherein the first end of the second return coil is coupled to the second end of the second measurement coil, wherein the second return coil progresses around the path in an opposite circumferential direction to the second circumferential direction.

The first circumferential direction and the second circumferential direction may be the same circumferential direction or the first circumferential direction and the second circumferential direction may be opposite circumferential directions.

The first measurement coil, the second measurement coil, the first return coil and the second return coil may progress to substantially surround the path.

The rate of change of current sensor may be a differential rate of change of current sensor providing a differential output signal, wherein the first end of the first measurement coil provides a first signal of the differential output signal, and the first end of the second measurement coil provides a second signal of the differential output signal, the second end of the first return coil is coupled to the second end of the second return coil, and further coupled to a common reference signal.

The first measurement coil may comprise a first measurement coil segment and a second measurement coil segment; the first return coil may comprise a first return coil segment and a second return coil segment, wherein the first measurement coil segment may be coupled to the first return coil segment and the second measurement coil segment may be coupled to the second return coil segment; the second measurement coil may comprise a third measurement coil segment and a fourth measurement coil segment; the second return coil may comprise a third return coil segment and a fourth return coil segment, wherein the third measurement coil segment is coupled to the third return coil segment and the fourth measurement coil segment is coupled to the fourth return coil segment, and wherein each coil segment progresses substantially 180° circumferentially around the path.

Electrostatic shielding may be provided around the path, between the path and the measurement coils.

The first measurement coil and the second measurement coil may be formed on inner layers of a substrate, and electrostatic shielding may be formed on outer layers of the substrate.

The rate of change of current sensor may further comprise a first connection conductor and a second connection conductor, wherein the first end of the first measurement coil is suitable for coupling to a first node of a current measurement circuit using the first connection conductor and the first end of the second measurement coil is suitable for coupling to a second node of the current measurement circuit using the second connection conductor, wherein the first connection conductor and the second connection conductor are arranged using a twisted-pair arrangement.

In a fifth aspect of the disclosure, there is provided a rate of change of current sensor comprising: a substrate, wherein the substrate includes a path for at least one current-carrying conductor; a first measurement coil formed on the substrate, wherein the first measurement coil progresses around the path in a first circumferential direction to substantially surround the path, the first measurement coil having a first end and a second end; and a first return coil formed on the substrate, the first return coil having a first end and a second end, wherein the first end of the first return coil is coupled to the second end of the first measurement coil, wherein the first return coil progresses in an opposite circumferential direction to the first circumferential direction around the path, to substantially surround the path.

The first return coil may be arranged such that it follows the same circumferentially extending path as the first measurement coil.

The rate of change of current sensor may further comprise a path for a current-carrying conductor, the path through the centre of the first measurement coil and the first return coil.

In a sixth aspect of the disclosure, there is provided a rate of change of current sensor comprising: a substrate, wherein the substrate includes a path for at least one current-carrying conductor; a first measurement coil formed on the substrate, wherein the first measurement coil progresses around the path in a first circumferential direction; and a second measurement coil formed on the substrate, wherein the second measurement coil progresses around the path in a second circumferential direction The first measurement coil and the second measurement coil may be interleaved on the substrate, such that they both have the same average electrostatic coupling to a current-carrying conductor under measurement, wherein the current-carrying conductor follows the path.

The first measurement coil and the second measurement coil may be interleaved in radial planes perpendicular to the surface of the substrate, such that a first turn of the first measurement coil and a first turn of the second measurement coil are located in the same radial plane perpendicular to the surface of the substrate.

The first turn of the first measurement coil may be formed on a first layer and a third layer of the substrate, and the first turn of the second measurement coil may be formed on a second layer and a fourth layer of the substrate.

The first measurement coil and the second measurement coil may be interleaved, such that a first turn of the first measurement coil is located in a first radial plane perpendicular the surface of the substrate and a first turn of the second measurement coil is located in a second radial plane perpendicular to the surface of the substrate, and wherein the first radial plane and the second radial plane are adjacent to each other in a circumferential direction.

The rate of change of current sensor may further comprise a first compensation conductor formed on the substrate and coupled to the first measurement coil, wherein the first compensation conductor progresses around the path in a circumferential direction opposite to the first circumferential direction; and a second compensation conductor formed on the substrate and coupled to the second measurement coil, wherein the second compensation conductor progresses around the path in a circumferential direction opposite to the second circumferential direction.

The first circumferential direction and the second circumferential direction may be the same circumferential direction.

The first measurement coil may progress an integer multiple of 360° around the path and the second measurement coil may progress the same integer multiple of 360° around the path The rate of change of current sensor may further comprise a twisted-pair arrangement formed on the substrate, wherein the twisted-pair comprises a first connection conductor and a second connection conductor, the first connection conductor coupled to the first measurement coil and a first node, the second connection conductor coupled to the second measurement coil and a second node, the first connection conductor and the second conductor arranged on the substrate to alternately cross over each other, the first and second nodes being outputs from the rate of change of current sensor.

BRIEF DESCRIPTION OF THE DRAWINGS

Aspects of the disclosure will now be described by way of example only and with reference to the accompanying drawings, wherein like reference numerals refer to like parts, and wherein:

FIG. 6a is a simplified circuit view of the coil of FIG. 5a;

FIG. 6b is a simplified circuit view of the coil of FIG. 5b;

FIG. 6c is a simplified circuit view of FIG. 5c, including the coils of FIGS. 6a and 6b;

FIG. 7a is a schematic view of one coil of a rate of change of current sensor in which measurement coils are wound in the same direction;

FIG. 7b is a schematic view of another coil of a rate of change of current sensor in which measurement coils are wound in the same direction;

FIG. 7c is a schematic view of a rate of change of current sensor, including the coils of FIGS. 7a and 7b;

FIG. 8a is a simplified circuit view of the coil of FIG. 7a;

FIG. 9a is a schematic view of one coil of a rate of change of current sensor in which return coils are provided;

FIG. 9b is a schematic view of another coil of a rate of change of current sensor in which return coils are provided;

FIG. 9c is a schematic view of a rate of change of current sensor, including the coils of FIGS. 9a and 9b;

FIG. 10a is a simplified circuit view of the coil of FIG. 9a;

FIG. 10b is a simplified circuit view of the coil of FIG. 9b;

FIG. 10c is a simplified circuit view of FIG. 9c, including the coils of FIGS. 10a and 10b;

FIG. 12 is a three-dimensional view of the four-layer rate of change of current sensor of FIG. 11;

FIG. 15a is a schematic representation of a two-layer implementation of first coil of the current sensor of FIG. 5a;

FIG. 16a is a schematic representation of a first coil and second coil of the two-layer implementation of the current sensor of FIG. 7a;

DETAILED DESCRIPTION

Known Rogowski coils may be negatively impacted by both electrostatically and magnetically coupled noise, for example noise due to other current-carrying conductors being near to the Rogowski coil. The electrostatically coupled noise into a differential Rogowski coil may be different in each of the differential coils, meaning that it cannot be easily cancelled or removed. Further, solutions to remove magnetically coupled noise, for example using a compensation or return conductor, may be difficult to implement in printed circuit board implementations of a Rogowski coil.

Figure 1:
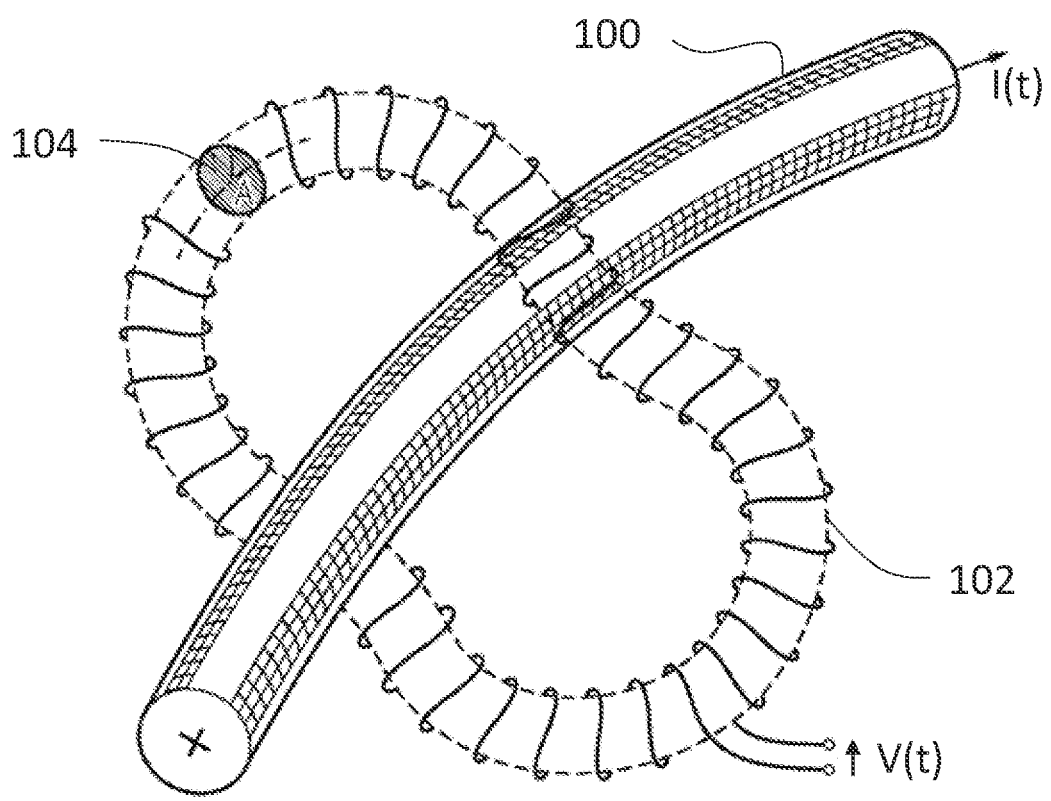
FIG. 1 is a schematic representation of a Rogowski coil.

FIG. 1 is a diagram of a known Rogowski coil. So as to measure the current I(t) flowing through a current-carrying conductor 100, a measurement coil 102 is arranged such that the current-carrying conductor 100 passes through the measurement coil. The measurement coil 102 is wound as a helix, such that a loop or turn of the helix encloses a cross sectional area 104, A. The current-carrying conductor 100 may be, for example, a bus bar.

As the current I(t) in the current-carrying conductor 100 changes, the field generated by the current also changes. The positioning of the measurement coil causes a voltage to be induced in the measurement coil 102 which is proportional to the rate of change of current, dI/dt. Therefore, integrating the output v(t) of the measurement coil provides a value proportional to the current. Each turn or loop of the coil forms a measurement area 104 in a plane perpendicular to the progression of the current-carrying conductor.

However, the voltage induced in the measurement coil may be affected by external conductors which the user is not intending to measure. As well as the loops of the coil which form the plurality of measurement areas 104, the progression of the coil itself also effectively forms a single loop in the plane of the current-carrying conductor. To address the coupling of magnetic fields into this single loop, a compensation conductor may be included.

Figure 2B:
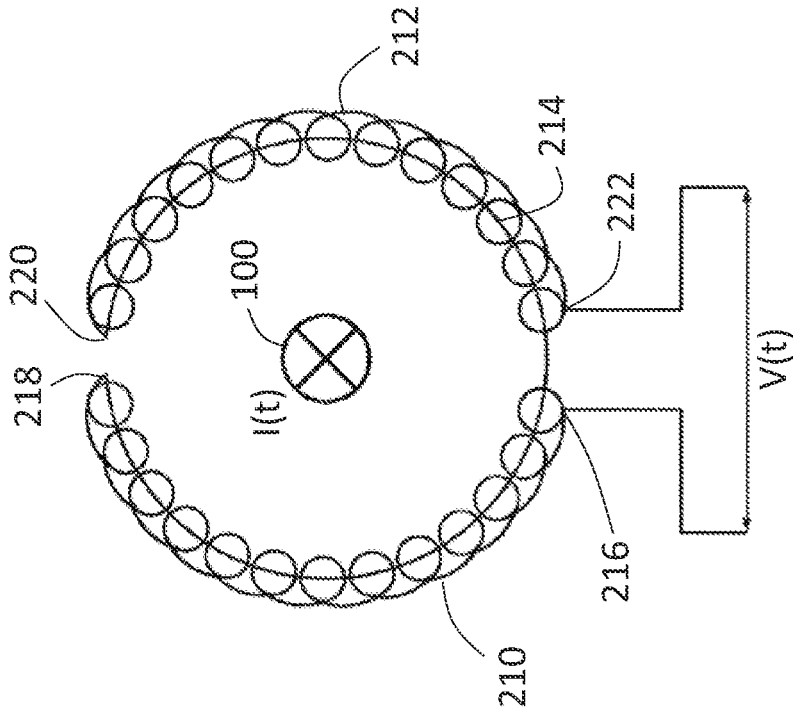
FIG. 2b is a schematic representation of a split or differential Rogowski coil with a compensation or return conductor.
Figure 2A:
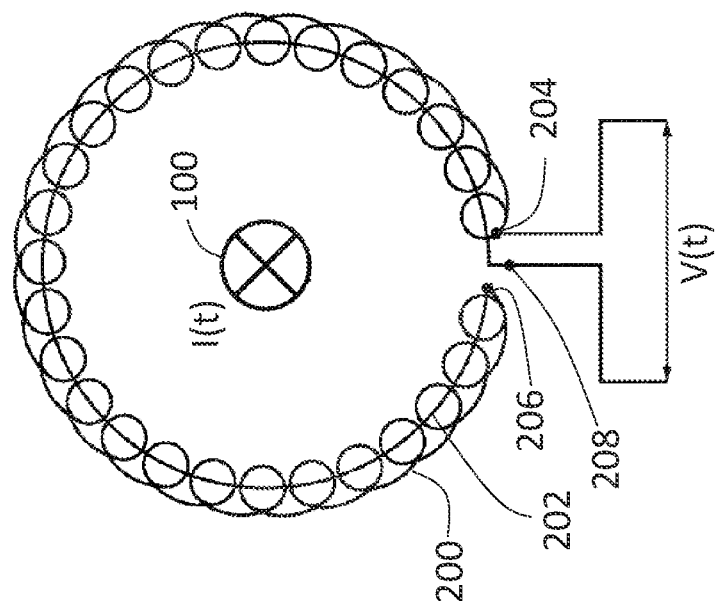
FIG. 2a is a schematic representation of a Rogowski coil with a compensation or return conductor.

A Rogowski coil including a compensation conductor is shown in FIG. 2a. The measurement coil 200 is formed as a near complete loop with an external circuit connection node 204 at one end of the coil. The other end of the coil is attached to the compensation conductor 202 at node 206. The compensation conductor 202 returns along the looped path formed by the measurement coil 200 to a second external circuit connection node 208. In some instances, the compensation conductor may be referred to as a return conductor or return wire.

The compensation conductor 202 forms a single turn loop in an opposite circumferential direction to the measurement coil 200, such that the compensation conductor 202 returns along, or through, the looped path formed by the measurement coil. This effectively results in the magnetic coupling in the compensation conductor 202 being the opposite to the magnetic coupling in the large single turn area of the measurement coil 200.

FIG. 2b shows a differential coil (or split/segmented coil) which may be used to reduce the effects of electrostatic coupling. The Rogowski coil is provided as two half coils 210, 212, such that each half coil progresses approximately 180°. The first half coil 210 may be referred to as coil-P and the second half coil 212 may be referred to as coil-N.

A first end of the first half coil 210 is coupled to a connection node 216. A second end of the first half coil 210 is coupled to a first end of a compensation conductor 214 at connection node 218. The second end of the compensation wire 214 is coupled to a first end of the second half coil 212 at a connection node 220. The second end of the second half coil 212 is coupled to connection node 222. Nodes 218 or 220 may be connected to ground or a common reference.

Each half coil is designed to sense the current differentially, but the electrostatic coupling is common-mode. By using a differential amplifier connected to the output of the coil, the electrostatic coupling may be rejected. However, any difference between the amount of electrostatic coupling between the two coil halves may translate to an error at the output of the differential amplifier. For example, any offset in the position of the current-carrying conductor 100—the current-carrying conductor being placed such that it is not centrally located between the two half coils—may cause the electrostatic coupling in coil-P 210 to be different to the electrostatic coupling in coil-N 212. Electrostatic coupling can be from AC voltage present on the current-carrying conductor or from nearby conductors which have AC voltage (dv/dt) signal.

Figure 3:
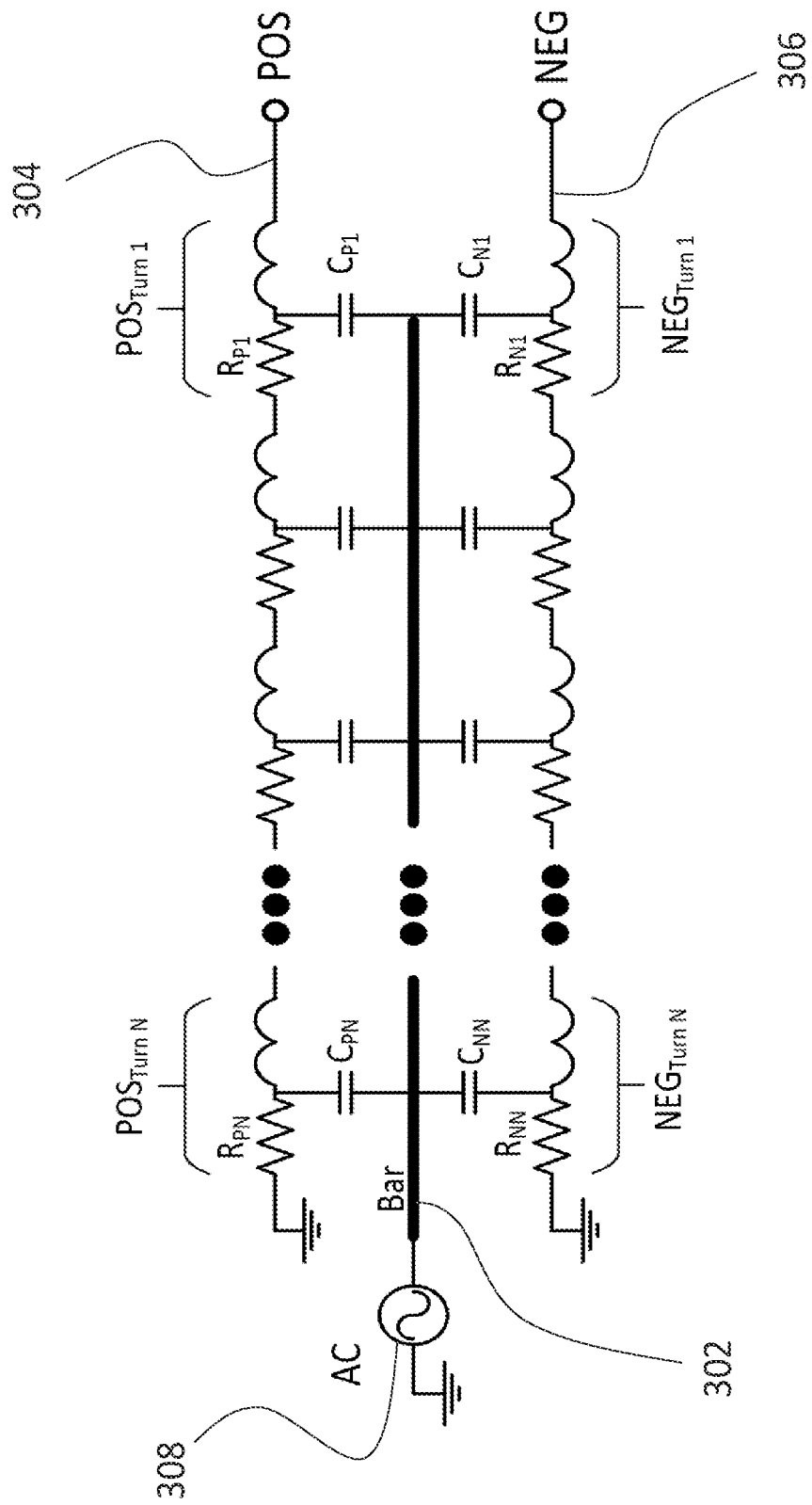
FIG. 3 is a schematic representation of the parasitic impedances present between a rate of change of current sensor and a current-carrying conductor under measurement.

FIG. 3 shows an example of the parasitic capacitances present between the current-carrying conductor, or bus bar, and the turns of the current measurement coils. Coil-P 304 is made up of a number of turns, or loops, $POS_{Turn1}$ to $POS_{TurnN}$. Coil-N 306 is made up of a number of turns, or loops, $NEG_{Turn1}$ to $NEG_{TurnN}$. Parasitic capacitances exist between the current-carrying conductor 302 and the measurement coils 304, 306 due to the physical proximity of the measurement coils and the current-carrying conductor. If an AC voltage exists on the current-carrying conductor, for example, AC voltage 308, an undesired voltage, may be injected into the current measurement coils through the parasitic capacitances.

Each turn of coil-P, $POS_{Turn1}$ to $POS_{TurnN}$, includes a respective parasitic resistance, $R_{P1}$ to $R_{PN}$ and a respective parasitic capacitance, $C_{P1}$ to $C_{PN}$. The parasitic resistances are caused by the resistance of the measurement coil, or, if the measurement coil is implemented on a printed circuit board (PCB), the resistance of the copper traces which make up the measurement coil. As noted, the parasitic capacitances are caused due to the proximity of the measurement coils and the current-carrying conductor or bus bar 302. Similarly, each turn of coil-N, $NEG_{Turn1}$ to $NEG_{TurnN}$, includes a respective parasitic resistance, $R_{N1}$ to $R_{NN}$ and a respective parasitic capacitance, $C_{N1}$ to $C_{NN}$.

Figure 4:
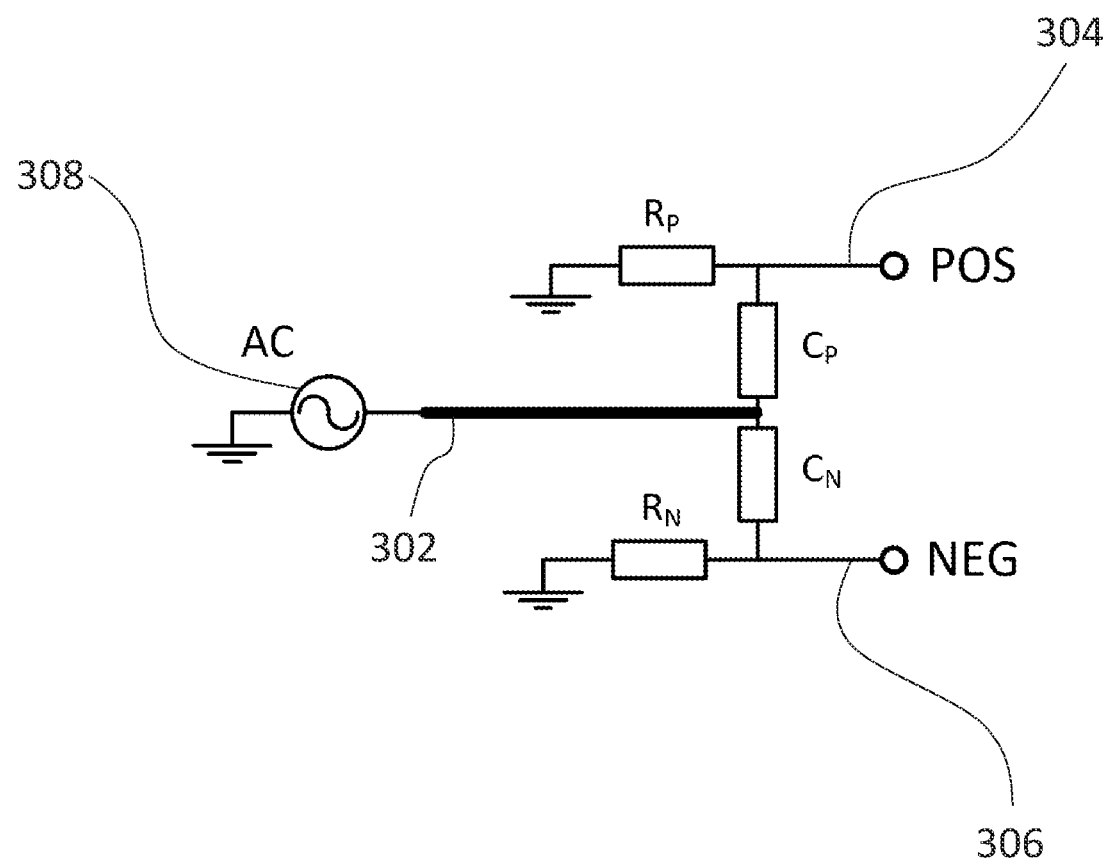
FIG. 4 is a simplified schematic representation of the parasitic impedances of FIG. 3.

FIG. 4 shows a simplified equivalent electrostatic model of the parasitic capacitances between the current-carrying conductor and measurement coils. The capacitances, $C_{P1}$ to $C_{PN}$ and $C_{N1}$ to $C_{NN}$ may be simplified as $C_P$ and $C_N$ respectively, such that $C_P$ represents the total parasitic capacitance between coil-P 304 and the current-carrying conductor 302 and $C_N$ represents the total parasitic capacitance between coil-N 306 and the current-carrying conductor 302. The resistances, $R_{P1}$ to $R_{PN}$ and $R_{N1}$ to $R_{NN}$ may be simplified as $R_P$ and $R_N$ respectively, such that $R_P$ represents the total resistance of coil-P 304 and $R_N$ represents the total resistance of coil-N. These parasitic component impedances are the Thevenin impedances at the frequency of interest.

The noise (false signal from the voltage on the conductor) coupled into coil-P 304 and coil-N 306 may be determined by the impedance divider between the corresponding parasitic components. Therefore, whenever $C_P \neq C_N$ or $R_P \neq R_N$, the induced noise into coil-P 304 and coil-N 306 due to the AC voltage 308 should be different. Any offset of the current-carrying conductor or bus bar 302, such that it is not in the centre of coil-P 304 and coil-N 306, may cause differences in the parasitic capacitances $C_P$ and $C_N$ due to the different relative position of the bus bar 302 to the coils. This results in the coupling in the measurement coils differing. Similarly, any differences in the parasitic resistances of the coils may result in the coupling into the coils differing. Electrostatic coupling can be from AC voltage present on the current-carrying conductor or from nearby conductors which have AC voltage (dv/dt) signal.

Providing a differential coil which includes two full coils, i.e. coils which each progress 360°, or approximately 360°, may greatly reduce the sensitivity to the position of the current-carrying conductor 100, by providing a closer match of the parasitic capacitances between each coil and the current-carrying conductor 302 regardless of the position of the current-carrying conductor 302. 360° routing may allow the two coils to be positioned such that both, on average, are the same distance to the current-carrying conductor. This also ensures that each coil receives the same common-mode electrostatic coupling, as they follow the same path.

However, whilst providing a current measurement coil which improves the balance of electrostatic coupling, it may still be important to provide a coil which rejects external magnetic fields So as to provide balanced electrostatic noise coupling, which may be cancelled at external measurement circuitry, a number of rate of change of current sensor layouts are proposed.

Figure 5A:
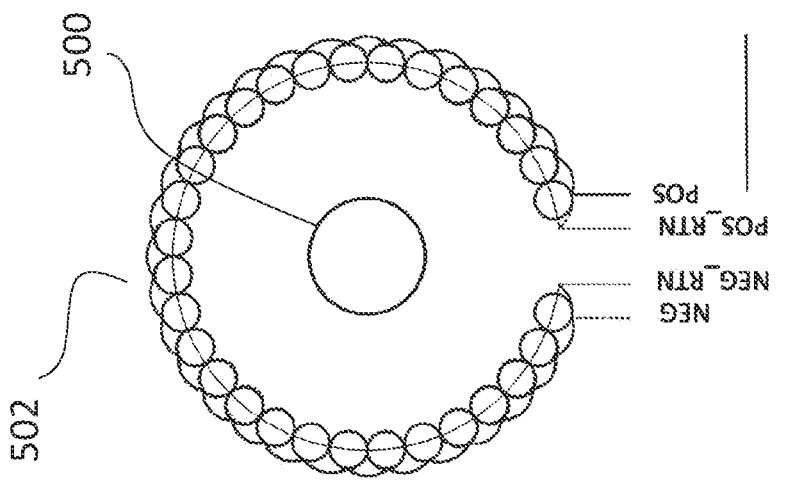
FIG. 5a is a schematic view of one coil of a rate of change of current sensor in which measurement coils are wound in an opposite direction.
Figure 5B:
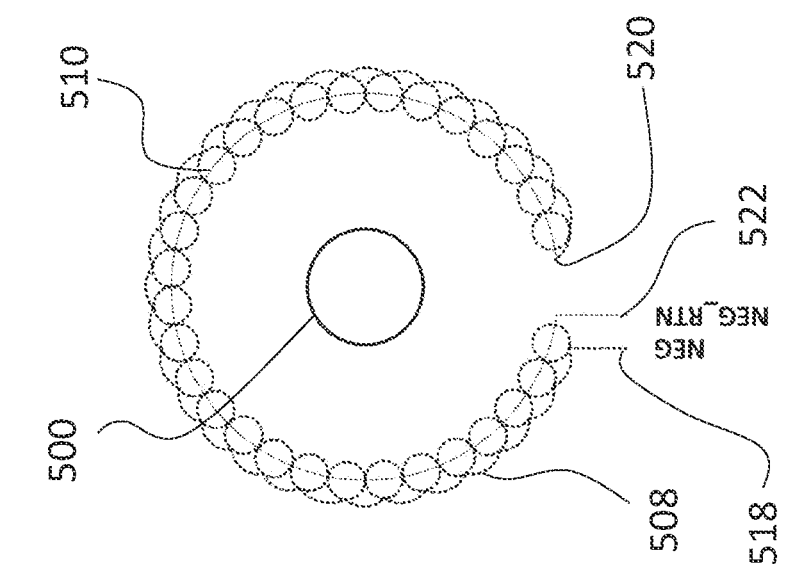
FIG. 5b is a schematic view of another coil of a rate of change of current sensor in which measurement coils are wound in an opposite direction.
Figure 5C:
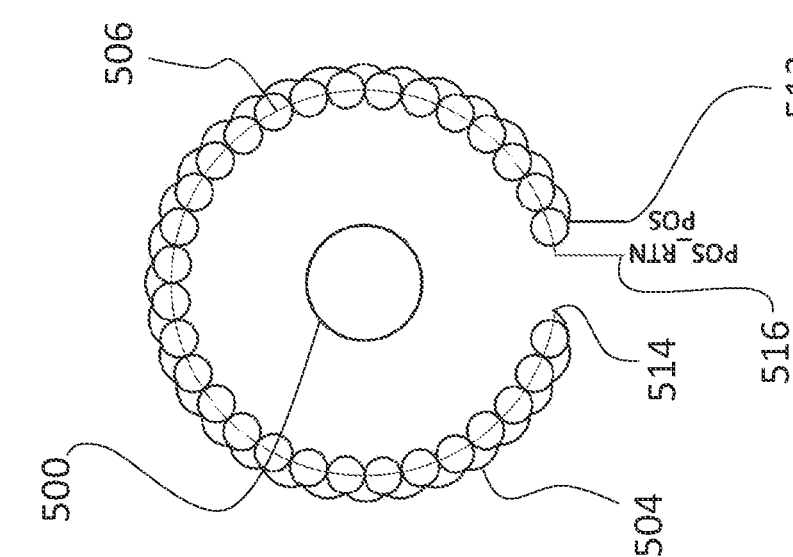
FIG. 5c is a schematic view of a rate of change of current sensor, including the coils of FIGS. 5a and 5b.

FIGS. 5a, 5b and 5c show diagrams of a differential rate of change of current sensor 502 for measuring the current in a current-carrying conductor 500. A path, hole or aperture may be provided for the current-carrying conductor 500. FIG. 5c shows the complete rate of change of current sensor, including coil-P, coil-N and their respective compensation conductors. FIG. 5a shows a first measurement coil, coil-P 504, and its respective first compensation conductor 506. FIG. 5b shows a second measurement coil, coil-N 508, and its respective second compensation conductor 510. The advancement path of measurement coil-P 504 is in the opposite circumferential direction to the advancement path of measurement coil-N 508, such that the first measurement coil and the second measurement coil progress in substantially opposite directions.

The first end of first measurement coil-P 504 begins at terminal or node 512 and progresses or travels in an anti-clockwise direction relative to the current-carrying conductor 500 (or in an alternative implementation, in a clockwise direction), terminating at second end or node 514. First compensation conductor 506 travels or progresses in the opposite direction to coil-P 504 from node 514 to node 516, clockwise relative to the current-carrying conductor 500 in the example represented in FIG. 5a. The first end 514 of compensation conductor 506 is coupled to the second end 514 of measurement coil-P 504.

The first end of second measurement coil-N 508 begins at terminal 518 and progresses or travels in a clockwise direction relative to the current-carrying conductor 500 (or in an alternative implementation, in an anti-clockwise direction), terminating at second end or node 520. Second compensation conductor 510 travels or progresses in the opposite direction to coil-N 508 from node 520 to node 522, anti-clockwise relative to the current-carrying conductor 500 represented in FIG. 5b. The first end 514 of compensation conductor 510 is coupled to the second end 520 of measurement coil-N 508.

The schematic diagram of FIGS. 5a-5c show both coil-P 504 and coil-N progressing substantially around the current-carrying conductor 500 such that they surround the path for the current-carrying conductor. Surrounding the path may be defined as the measurement coil progressing between 180° and 360° around the path. For example, progressing substantially 360° may provide superior balanced coupling, as shown in FIG. 4. Substantially 360° may be slightly less than 360°, limited by the pitch of the measurement conductors which extend radially. Progressing more than 180° may still provide coupling which is improved, with a greater common-mode component than circuits where the coils do not progress more than 180°. The measurement coil may progress more than 360°, for example, N*360°, where N is a positive integer. In this way, the electrostatic coupling into each coil would still be the same. By providing a sensor with two measurement coils which progress across substantially the same area of a substrate the parasitic capacitances $C_P$ and $C_N$ may be similar or the same. In some instances, nodes 516 and 522 may be coupled together, and to a common reference, for example ground (although it may be any suitable reference voltage). Further differential measurement circuitry may allow the common electrostatically coupled noise in the first measurement coil 504 and the second measurement coil 508 to be cancelled.

Simplified circuit diagrams of the coils of FIGS. 5a-5c are shown in FIGS. 6a-6c. Notably, the second end 516 of the first compensation conductor 506 may be coupled to the second end 522 of the second compensation conductor 510. The sensor may further be coupled to circuitry for converting the rate of change of current detected by the current measurement coils to a current measurement, through coupling differential terminals 512 and 518 to the current measurement circuitry. The current measurement circuit is not the subject of the present disclosure and so is not described further herein. The skilled person will appreciate that there are many known differential current measurement circuits that may be used.

The first end 512 of the first measurement coil 504 may provide a first signal of a differential output signal of the rate of change of current sensor and the first end 518 of the second measurement coil 508 may provide a second signal of a differential output signal. The differential output signal may be provided or coupled to further differential circuitry.

Whilst FIGS. 5a-6c show a sensor in which the current measurement coils progress in substantially opposite circumferential directions, sensors may be implemented in which the current measurement coils progress in substantially the same circumferential direction.

For example, FIGS. 7a, 7b and 7c show diagrams of a differential rate of change of current sensor 702 for measuring the current in a current-carrying conductor 500. FIG. 7c shows the complete rate of change of current sensor, including coil-P, coil-N and their respective compensation conductors. FIG. 7a shows a first measurement coil, coil-P 704, and its respective first compensation conductor 706. FIG. 7b shows a second measurement coil, coil-N 708, and its respective second compensation conductor 710. The advancement path of measurement coil-P 704 is in the same circumferential direction to the advancement path of measurement coil-N 708.

The first end of first measurement coil-P 704 begins at terminal or node 712 and progresses or travels in an anti-clockwise direction relative to the current-carrying conductor 500 (or in an alternative implementation, in a clockwise direction), terminating at second end or node 714. First compensation conductor 706 travels or progresses in the opposite direction to coil-P 704 from node 714 to node 716, clockwise relative to the current-carrying conductor 500 in the example represented in FIG. 7a. The first end 714 of compensation conductor 706 is coupled to the second end 714 of measurement coil-P 704.

The first end of second measurement coil-N 708 begins at terminal 718 and progresses or travels in an anti-clockwise direction relative to the current-carrying conductor 500 (or in an alternative implementation, in a clockwise direction), terminating at second end or node 720. Second compensation conductor 710 travels or progresses in the opposite direction to coil-N 708 from node 720 to node 722, clockwise relative to the current-carrying conductor 500 represented in FIG. 7b. The first end 714 of compensation conductor 710 is coupled to the second end 720 of measurement coil-N 708.

The first and second measurement coils progressing in the same direction may improve electrostatic coupling balance compared to the measurement coils progressing in an opposite direction. Starting both coils in the same direction relative to the coil centre (either both clockwise or both anti-clockwise) should keep each turn of each coil at the same proximity to the current-carrying conductor.

Figure 8C:
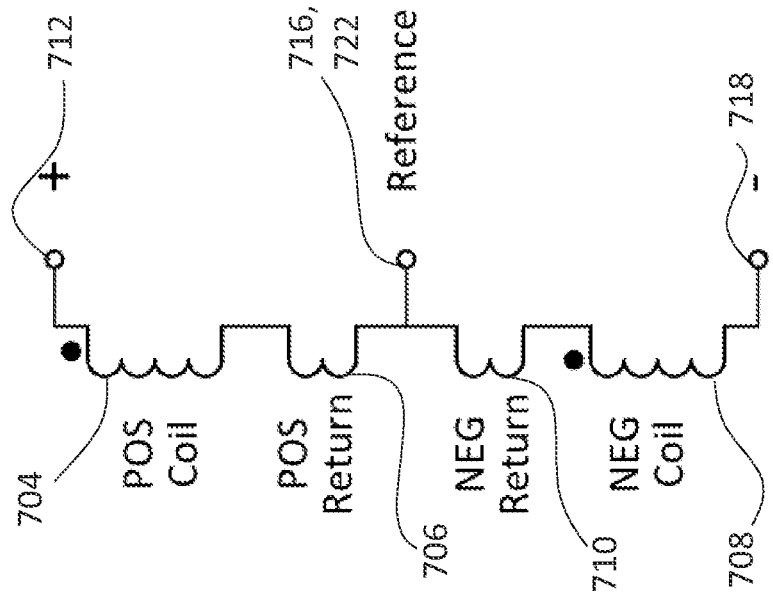
FIG. 8c is a simplified circuit view of FIG. 7c, including the coils of FIGS. 8a and 8b.
Figure 8B:
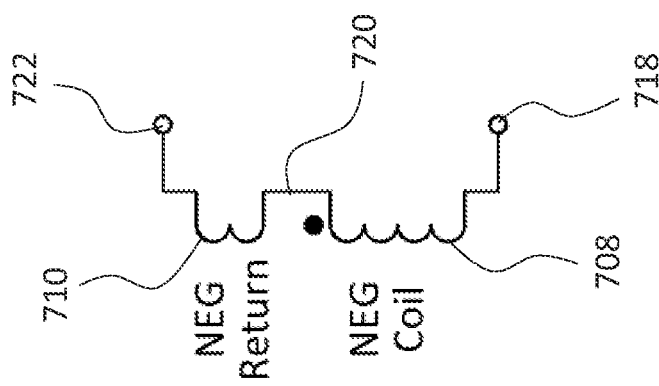
FIG. 8b is a simplified circuit view of the coil of FIG. 7b.
Figure 8A:
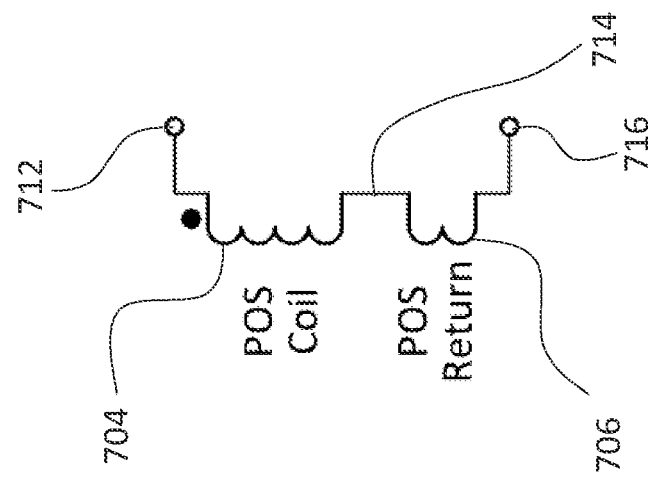

Simplified circuit diagrams of the coils of FIGS. 7a-7c are shown in FIGS. 8a-8c. Notably, the second end 716 of the first compensation conductor 706 may be coupled to the second end 722 of the second compensation conductor 710. The sensor may further be coupled to circuitry for converting the rate of change of current detected by the current measurement coils to a current measurement, through coupling differential terminals 712 and 718 to the current measurement circuitry. The current measurement circuit is not the subject of the present disclosure and so is not described further herein. The skilled person will appreciate that there are many known differential current measurement circuits that may be used.

The first end 712 of the first measurement coil 704 may provide a first signal of a differential output signal of the rate of change of current sensor and the first end 718 of the second measurement coil 708 may provide a second signal of a differential output signal. The differential output signal may be provided or coupled to further differential circuitry.

The rate of change of current sensor implementations of FIGS. 5a-8c may provide a sensor with improved electrostatic coupling balance, due to the provision of two coils which both progress on substantially the same route around the path for the current-carrying conductor 500. Furthermore, the sensor should have good magnetic cancellation, through the provision of two compensation wires. However, in some circumstances, it may also be desirable to provide a sensor with improved current sensing sensitivity, whilst still retaining the magnetic cancellation provided by the compensation wires.

For example, FIGS. 9a, 9b and 9c show diagrams of a differential rate of change of current sensor 902 for measuring the current in a current-carrying conductor 500. The rate of change of current sensor includes four current measurement coils, which may be referred to as two forward and two return coils. FIG. 9c shows the complete rate of change of current sensor, including coil-P, coil-N and their respective return coils. FIG. 9a shows a first measurement coil, coil-P 904, and its respective first return coil 906. FIG. 9b shows a second measurement coil, coil-N 908, and its respective second return coil 910.

The return coils have been referred to as such for clarity, however it should be understood that the return coils act to measure the current in the current-carrying conductor in the same manner as the measurement coils. The return coils may therefore also be considered to be measurement coils, or they may be considered to be part of their respective measurement coil The compensation return wire has been replaced with a secondary coil referred to as the return or reverse coil. Similar to the designs described earlier, the first measurement coil and second measurement coil start their circumferential progression in the same direction (anti-clockwise in this example). They travel together maintaining spatial symmetry for the complete advancement. They then each connect to respective return or reverse coils which travel back following the same advancement path but in the clockwise direction. The first measurement coil and second measurement coil turns and first return coil and second return coil turns are interleaved along the advancement path as can be seen in FIGS. 9a-9c. In total, this creates essentially four individual coils which combine to produce the desired Rogowski coil.

The first end of first measurement coil-P 904 begins at terminal or node 912 and progresses or travels in an anti-clockwise direction around the path for the current-carrying conductor 500 (or in an alternative implementation, in a clockwise direction), terminating at second end or node 914. First return coil 906 travels or progresses in the opposite direction to coil-P 904 from node 914 to node 916, clockwise around the path for the current-carrying conductor or the current-carrying conductor 500 in the example represented in FIG. 9*a*. The first end 914 of the first return coil 906 is coupled to the second end 914 of measurement coil-P 904. A rate of change of current sensor may be provided that includes a measurement coil and return coil, so as to provide an increased number of coil turns whilst still providing cancellation of the magnetic fields.

The first end of second measurement coil-N 908 begins at terminal 918 and progresses or travels in a clockwise direction around the path for current-carrying conductor 500 (or in an alternative implementation, in an anti-clockwise direction), terminating at second end or node 920. Second return coil 910 travels or progresses in the opposite direction to coil-N 908 from node 920 to node 922, anti-clockwise around the path for the current-carrying conductor 500 represented in FIG. 9*b*. The first end 914 of the second return coil 910 is coupled to the second end 920 of measurement coil-N 908.

In this implementation the measurement coils progress in the same circumferential direction relative to each other, however, the coils may alternatively progress in the opposite direction relative to each other. The schematic diagram of FIGS. 9*a*-9*c* show both coil-P 904 and coil-N 908 progressing substantially around the path for the current-carrying conductor 500, so as to surround the path. By providing a sensor with two measurement coils the parasitic capacitances $C_P$ and $C_N$ may be similar or the same. In some instances, nodes 916 and 922 may be coupled together, and to a common reference, for example ground. Similarly, return coils 906, 910 may progress substantially around the path for the current-carrying conductor 500, so as to surround the path Simplified circuit diagrams of FIGS. 9*a*-9*c* are shown in FIGS. 10*a*-10*c*. Notably, the second end 916 of the first return coil 906 may be coupled to the second end 922 of the second return coil 910. The sensor may further be coupled to circuitry configured to convert the rate of change of current detected by the current measurement coils to a current measurement, by coupling differential terminals 912, 918 to the current measurement circuitry.

By providing a return coil in place of the compensation conductor, a greater number of turns may be provided in the same amount of space, which may improve the coil sensitivity to the rate of change of current in the current-carrying conductor under measurement. The first measurement coil and the second measurement coil may have balanced electrostatic coupling, and the first return coil and the second return coil may have balanced electrostatic coupling, such that the electrostatic coupling may be cancelled in further measurement circuitry. Further, the first return coil may act as the compensation conductor for the first measurement coil, as it progresses in an opposite circumferential direction to the first measurement coil, and the second return coil may act as the compensation conductor for the second measurement coil.

Due to the increased number of turns (the return coils also acting to sense the current in the current-carrying conductor) the output voltage at the output terminals 912, 918 may be greater than a system which provides compensation conductors in place of the return coils.

PCB Implementations of a Rate of Change of Current Sensor

A rate of change of current sensor may be implemented on a PCB or substrate. Advantageously, providing the rate of change of current sensor on a PCB may allow the rate of change of current sensor to be provided on the same circuit board as other parts of a current measurement apparatus, for example on the same circuit board as current measurement circuitry, amplifiers, comparators, integrators.

However, when attempting to implement a current measurement coil, such as those presented in FIGS. 5*a*-10*c*, on a PCB, there can be difficulties with routing the two coils such that they are, on average, the same distance from the current-carrying conductor. It may therefore be difficult to ensure that the capacitive coupling provided between each coil and the measurement conductor is the same, as outlined in FIGS. 3 and 4. There exists a need to provide a current measurement coil, implemented on a PCB, which achieves the desired balance of parasitic capacitances, such that the electrostatic coupling into each of the coils is equal and the coupling can be cancelled by a differential amplifier stage. If the coils were in different areas, the electrostatic coupling may not be the same and may not be fully cancelled or removed at the output. In addition this is made even more challenging as while trying to make a coil that improves the balance of electrostatic coupling, it is still desirable to provide a coil that rejects external magnetic fields.

Four-Layer Implementation

FIGS. 5*a*-6*c* present a rate of change of current sensor 502 comprising two current measurement coils 504, 508 and two compensation conductors 506, 510, where the current measurement coils progress in opposite directions. This rate of change of current sensor may be implemented across four layers of a substrate or PCB.

Figure 11:
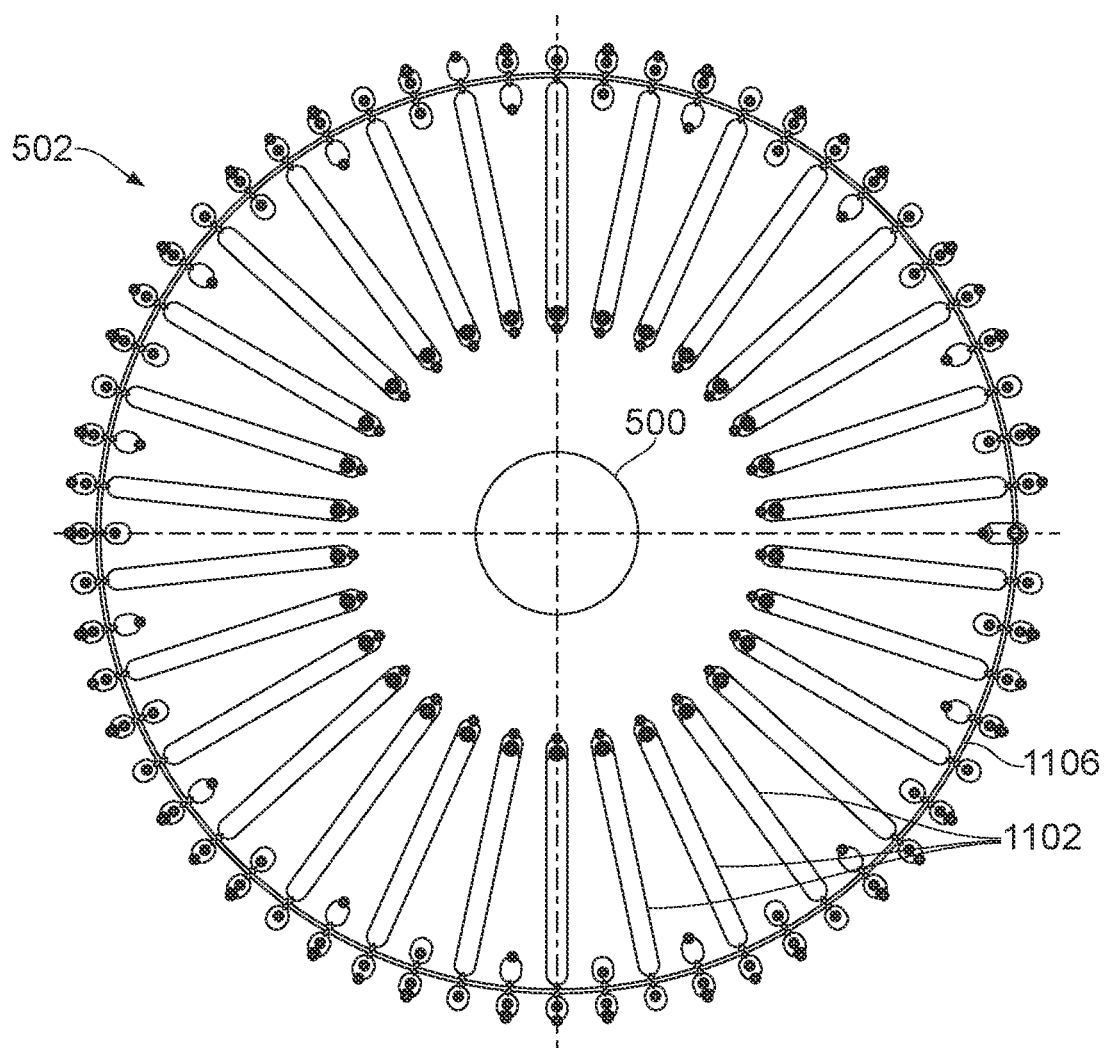
FIG. 11 is a plan view of a schematic of a four-layer rate of change of current sensor according to FIGS. 5a-5c.

FIG. 11 shows a 2-dimensional top view of a PCB implementation of the rate of change of current sensor 502, including two measurement coils (coil-P and coil-N) which both progress substantially around a path for a current-carrying conductor 500. Progressing substantially around the current-carrying conductor 500 may result in the current measurement coils progressing substantially around the path, so as to surround the path. Each measurement coil is formed, in part, by a number of conductive measurement coil tracks/traces (also referred to as measurement conductors) 1102. The measurement conductors 1102 may be radial elements, in that they may extend in a radial direction from the centre of the PCB, from the current-carrying conductor 500, or from the position of a path or aperture. The plane in which they extend is perpendicular to the surface, or major surface, of the substrate. The Rogowski coil-like structure may include a hole, aperture or path in the substrate/circuit board at the centre of the coil, allowing a current-carrying conductor to be passed through the path. The plurality of measurement conductors 1102 are arranged to circumferentially surround the path. Circumferential progression of the coil may take place at the outer circumference, using circumferential progression conductors, or "kinks", 1106. These circumferential progression conductors allow the measurement coils to progress circumferentially relative to the current-carrying conductor 500, as outlined in the description relating to FIGS. 5*a*-5*c*

FIG. 12 shows a 3-dimensional view of the PCB traces and vias for the rate of change of current sensor of FIG. 11. The radial measurement conductors are distributed across four layers of the substrate of the PCB. For example, a first plurality of measurement conductors 1202 are located on a first layer of the board. In this example the first layer is the upper-most layer represented. A second plurality of measurement conductors 1204 are located on a second layer of the circuit board, which in this example is a layer that is below (in the direction perpendicular, or normal, to the plane of the PCB substrate) the first layer. A third plurality of measurement conductors 1206 are located on a third layer of the circuit board, which in this example is a layer that is below (in the direction perpendicular, or normal, to the plane of the PCB substrate) the second layer. A fourth plurality of measurement conductors 1208 are located on a fourth layer of the circuit board, which in this example is a layer that is below (in the direction perpendicular, or normal, to the plane of the PCB substrate) the third layer and is the lower-most layer represented.

Whilst the radial elements are distributed across four layers of the circuit board, the circuit board itself is not necessarily a four-layer circuit board. For example, the circuit board may have more than four layers, such as a circuit board with six, eight or ten layers.

Each respective measurement conductor of the first plurality of measurement conductors 1202 is aligned with a respective measurement conductor from the second, third and fourth plurality of measurement conductors, 1204, 1206, 1208. These respective measurement conductors are aligned in a radial plane which is perpendicular to the surface of the substrate, the surface of the substrate being the major surface of the substrate. Conceptually, a plane passing through the respective measurement conductors of the plurality of measurement conductors 702, 704, 706, and 708 may be referred to throughout this disclosure as a "radial plane", since it is a plane that extends in the radial direction of the coil, normal/perpendicular to the plane of the substrate.

The rate of change of current sensor 502 further comprises a first plurality of vias that include a plurality of outer circumference vias 1210 and a plurality of inner circumference vias 1214, 1216. Respective measurement conductors of the first, second, third and fourth plurality of measurement conductors are connected to respective vias of the plurality of outer circumference vias 1210. The outer circumference vias 1210 are formed around the outer circumference of the measurement conductors. The outer circumference vias 1210 may include at least a conductive lining (and may optionally be completely filled with conductive material) and couple measurement conductors on one layer of the circuit board with measurement conductors on another layer of the circuit board, by way of circumferential progression conductors 1212.

Respective measurement conductors are also connected to the inner circumference vias 1214, 1216. The inner circumference vias may be provided in two circles, such that a first circle of vias 1214 has a first diameter and a second circle of vias 1216 has a second diameter, with the first circle and the second circle being concentric circles. The diameter of the first circle of vias 1214 may be smaller than the diameter of the second circle of vias 1216. In this example, the first circle of vias 1214 are formed closer to the centre of the circle formed by the groups of measurement conductors than the second circle of vias 1216, although "first" and "second" are merely labelling terms. The first circle of vias 1214 and second circle of vias 1216 may each include at least a conductive lining (and may optionally be completely filled with conductive material) and couple respective measurement conductors of one of the pluralities of measurement conductors with measurement conductors of a second of the pluralities of measurement conductors.

A turn of each coil, forming a complete loop, similar to that of 104 of FIG. 1, is formed by two measurement conductors on different layers of the circuit board from different ones of the pluralities of measurement conductors, connected by one of the first circle of vias 1214 or the second circle of vias 1216. For example, a measurement conductor from the first plurality of measurement conductors 1202, a measurement conductor from the second plurality of measurement conductors 1204, a measurement conductor from the third plurality of measurement conductors 1206 and a measurement conductor from the fourth plurality of measurement conductors 1208 together form part of a turn of the first measurement coil (coil-P) 504 and a turn of the second measurement coil (coil-N) 508, along with vias from the first circle of vias 1214, the second circle of vias 1216 (on the inner circumference of the coil) and outer circumference vias 1210 (on the outer circumference of the coil). Circumferential progression of the coil is provided at the outer circumference, using connecting regions 1212, alternatively known as "kinks" or circumferentially extending conductors.

Simply implementing the two measurement coils separately, for example, by implementing coil-P on layers 1 and 2 of a PCB and coil-N on layers 3 and 4 of a circuit board might lead to poor balance. The coils would be located in different areas (e.g. the average mid-point of the two coils in the direction perpendicular to the plane of the substrate would be different), such that the parasitic capacitances described with respect to FIGS. 3 and 4 would be different. The same is true if coil-N was implemented on a first circuit board and coil-P implemented on a second circuit board.

Instead, coil-N and coil-P are interleaved. This means that coil-N and coil-P are, on average, the same distance from the current-carrying conductor or bus bar of interest, and the electrostatic coupling into each coil is the same (e.g. the average mid-point of the two coils in the direction perpendicular to the pane of the substrate is substantially the same) and that they have the same average electrostatic coupling.

Figure 13A:
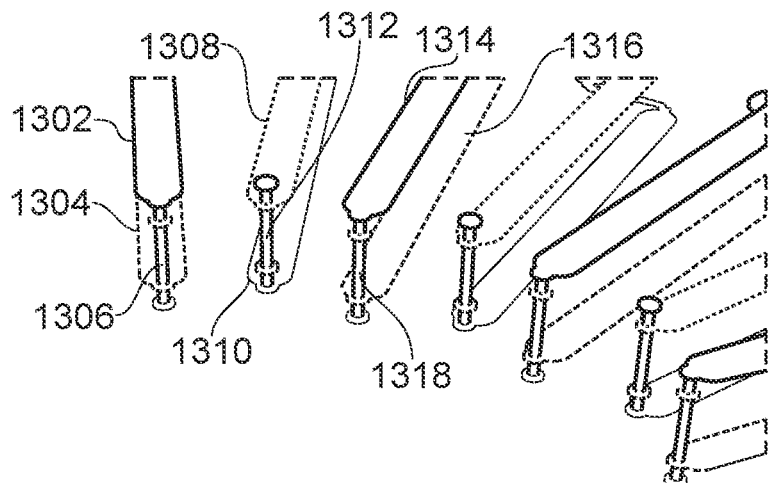
FIG. 13a is a subsection of the four-layer rate of change of current sensor of FIG. 11, showing only conductors relating to a first measurement coil.
Figure 13B:
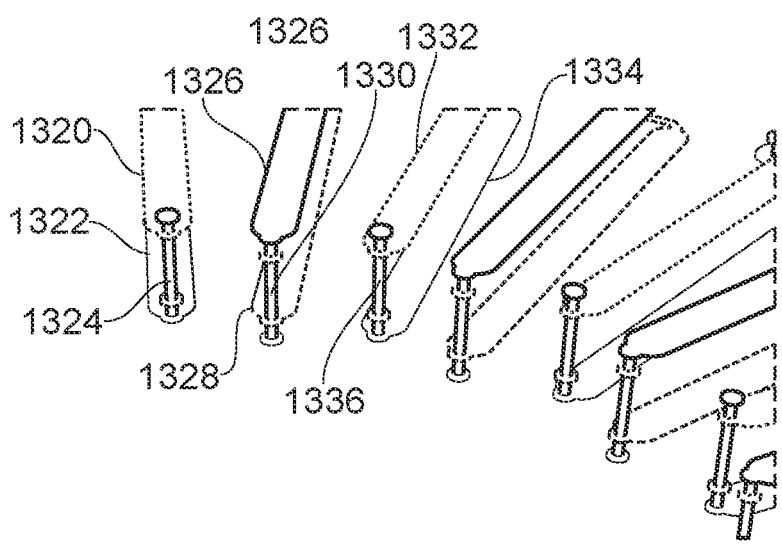
FIG. 13b is a subsection of the four-layer rate of change of current sensor of FIG. 11, showing only conductors relating to a second measurement coil.
Figure 13C:
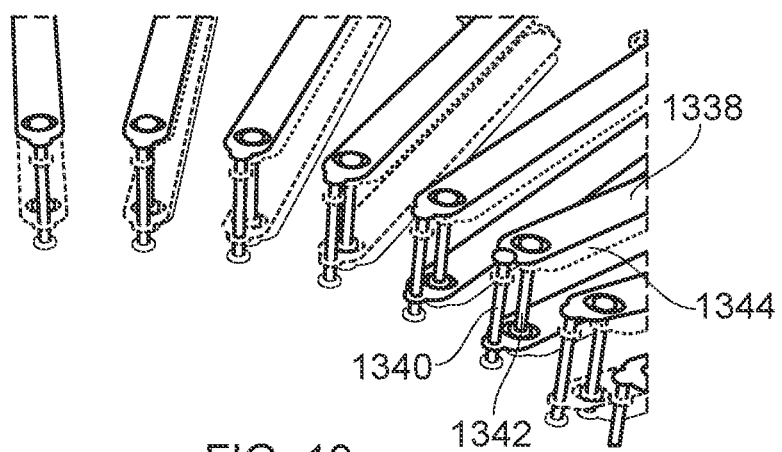
FIG. 13c is a subsection of the four-layer rate of change of current sensor of FIG. 11, showing conductors relating to both the first measurement coil and the second measurement coil.
Figure 14A:
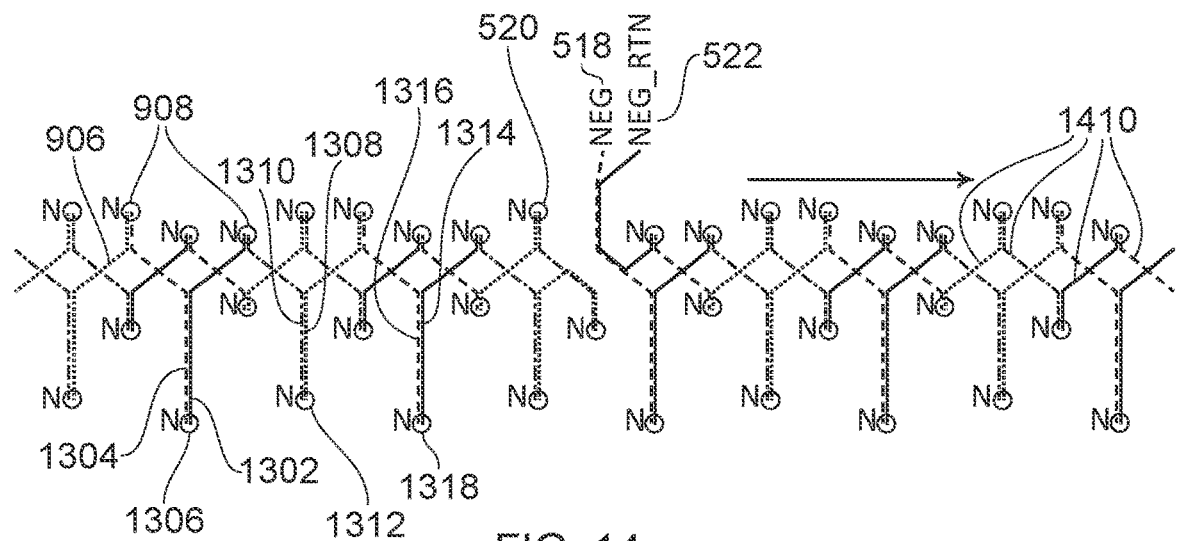
FIG. 14a is a schematic representation of a first coil of the current sensor of FIG. 11.
Figure 14B:
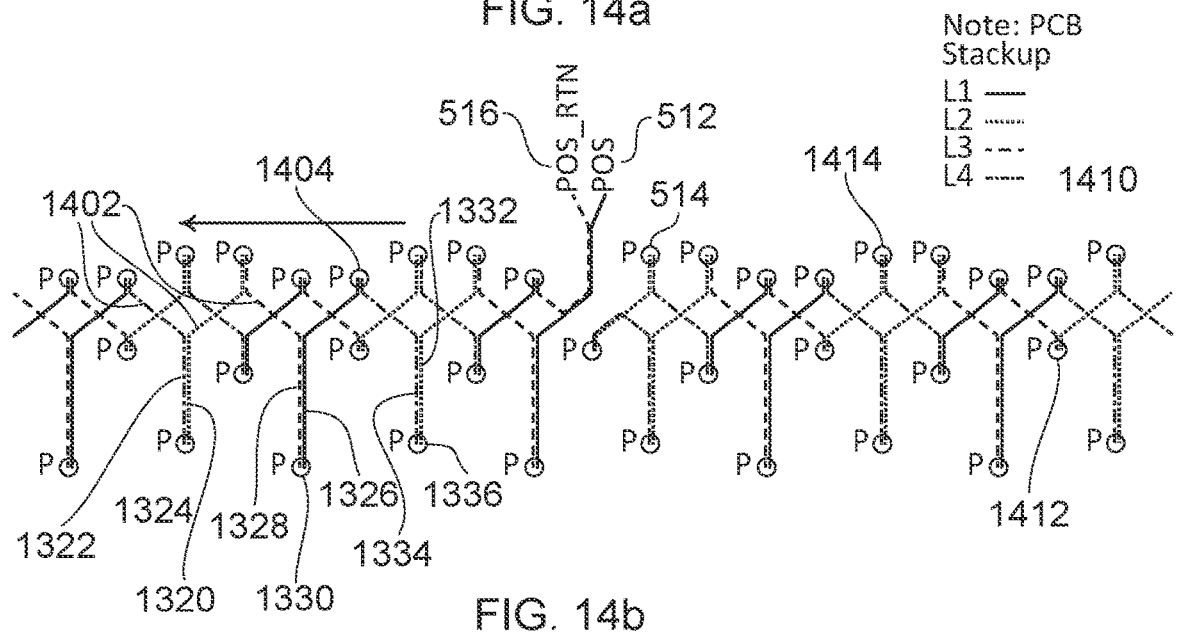
FIG. 14b is a schematic representation of a second coil of the current sensor of FIG. 11.
Figure 14C:
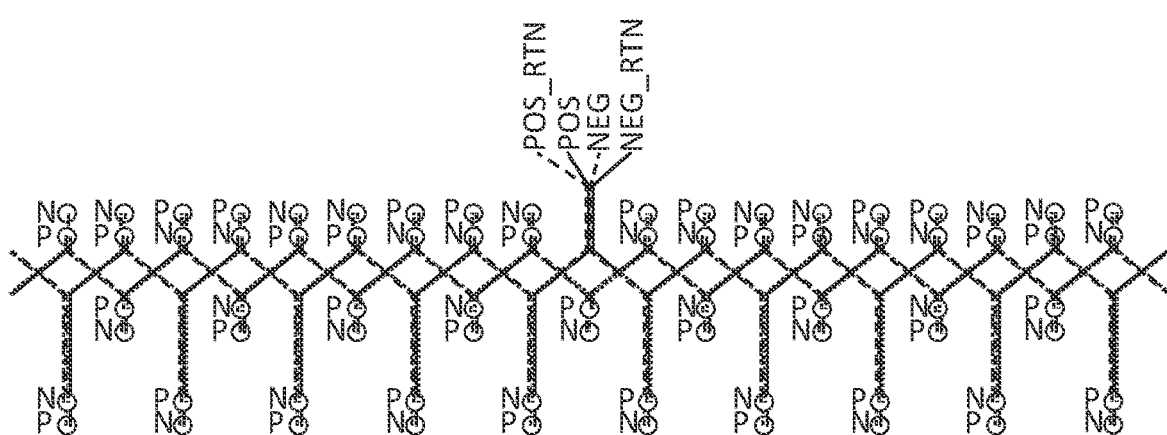
FIG. 14c is a schematic representation of the change of current sensor according to FIG. 11, including both the first and second coils of FIGS. 14a and 14b.

FIGS. 13*a*-13*c* show a subsection of FIG. 12. For ease of explanation, FIG. 13*a* shows only the measurement conductors which form part of second measurement coil-N and FIG. 13*b* shows only the measurement conductors which form part of first measurement coil-P. FIG. 13*c* shows the measurement conductors of both coil-N and coil-P (and is therefore a true subsection of FIG. 12). Further, FIGS. 14*a*, 14*b* and 14*c* represent simplified schematic diagrams of the PCB implementations of FIGS. 13*a*, 13*b* and 13*c*. Whilst FIGS. 14*a*-14*c* show the coils arranged linearly (i.e., progressing in a straight line from right to left, or left to right, as if the coils have been straightened out, rather than encircling the central aperture), this is done only for simplicity of presentation. It will be appreciated that the radial conductor elements are actually arranged in a circle around the central aperture, and the vias located at the inner and outer edges are also arranged in circles, such that the vias mark the inner and outer circumferences of the measurement conductors as in FIGS. 11 and 12.

A first turn of coil-N (as seen in FIG. 13*a*) comprises measurement conductor 1302, formed on the first layer of the PCB of the first plurality of measurement conductors 1202, and measurement conductor 1304 formed on the third layer of the PCB of the third plurality of measurement conductors 1206, connected at a first end (an end closer to the aperture, path or current-carrying conductor) of the measurement conductors by an inner circumference via 1306 of the first circle of vias 1214. A second turn of coil-N comprises measurement conductor 1308 formed on the second layer of the PCB of the second plurality of measurement conductors 1204, and measurement conductor 1310 formed on the fourth layer of the PCB of the fourth plurality of measurement conductors 1208, connected by an inner circumference via 1312 of the second circle of vias 1216. A third turn of coil-N comprises measurement conductor 1314 formed on the first layer of the PCB of the first plurality of measurement conductors 1202, and measurement conductor 1316 formed on the third layer of the PCB of the third plurality of measurement conductors 1206, connected by inner circumference via 1318 of the first circle of vias 1204. Notably, the measurement conductors which make up part of a turn of coil-N are in the same plane perpendicular to the surface of the circuit board. For example, measurement conductor 1302 and measurement conductor 1304 are centred on the same radially extending plane, where the plane is perpendicular to the surface of the board. Vias are also connected at the respective second ends of the measurement conductors (the outer circumference vias 1210 of FIG. 12) such that the second ends of the radial elements are coupled to vias on the exterior circumference. However, these outer circumference vias are not shown in this figure for ease of understanding.

A first turn of coil-P (as seen in FIG. 13b) comprises measurement conductor 1320, formed on the second layer of the PCB of the second plurality of measurement conductors 1204, and measurement conductor 1322, formed on the fourth layer of the PCB of the fourth plurality of measurement conductors 1208, connected by an inner circumference via 1324 of the second circle of vias 1216. A second turn of coil-P comprises measurement conductor 1326 formed on the first layer of the PCB of the first plurality of measurement conductors 1202, and measurement conductor 1328, formed on the third layer of the PCB of the third plurality of measurement conductors 1206, connected by an inner circumference via 1330 of the first circle of vias 1214. A third turn of coil-P comprises measurement conductor 1332, formed on the second layer of the PCB of the second plurality of measurement conductors 1204, and measurement conductor 1334, formed on the fourth layer of the PCB of the fourth plurality of measurement conductors 1208, connected by an inner circumference via 1336 of the second circle of vias 1216. As with coil-N, the measurement conductors which form each turn of coil-P are in the same radial plane. Outer circumference vias are not shown in FIG. 13b for ease of understanding.

As can be seen from FIG. 13c, when these two measurement coils are implemented on a four-layer circuit board, they are arranged such that the turns of coil-N (FIG. 13a) are in the same radially extending plane as the turns of coil-P (FIG. 13b), such that they are interleaved. For example, a first group of measurement conductors includes measurement conductors 1302, 1304, 1320, 1322. This group of measurement conductors is located in a first radial plane perpendicular to a major surface of the circuit board or substrate. A second group of measurement conductors includes measurement conductors 1308, 1310, 1326 and 1328. The second group of measurement conductors are located in a second radial plane perpendicular to a major surface of the circuit board or substrate. A third group of measurement conductors includes measurement conductors 1314, 1316, 1332 and 1334 located in a third radial plane perpendicular to a major surface of the circuit board or substrate. Each group of measurement conductors includes two measurement conductors which form part of coil-N and two measurement conductors which form part of coil-P.

A part of a turn of coil-P and part of a turn of coil-N are located in the same plane. Measurement conductor 1302, implemented on the first layer of the circuit board, and measurement conductor 1304, implemented on the third layer of the circuit board form part of coil-N. Measurement conductor 1320, implemented on the second layer of the circuit board, and measurement conductor 1322, implemented on the fourth layer of the circuit board form part of coil-P. For each successive turn, the layers which coil-N occupies and the layers which coil-P occupies are swapped. For example, the second turn of coil-N includes measurement conductor 1308 implemented on the second layer of the circuit board and measurement conductor 1310 implemented on the fourth layer. The second turn of coil-P includes measurement conductor 1326 implemented on the first layer of the circuit board and measurement conductor 1328 implemented on the third layer of the circuit board.

This arrangement results in part of the first turn of coil-N being arranged on layers one and three and part of the first turn of coil-P being arranged on layers two and four. For the second turn, the measurement conductors of coil-N are arranged on layers two and four and the measurement conductors of coil-P are arranged on layers one and three. This alternating pattern, where the layers used to route each coil alternate, continues as the coils progress around the circuit board. Described in another way, for a first turn of coil-N and coil-P, coil-N comprises measurement conductors of the first plurality of measurement conductors 1202 and the third plurality of measurement conductors 1206 and coil-P comprises the measurement conductors of the second plurality of measurement conductors 1204 and the fourth plurality of measurement conductors 1208. For a second turn of coil-N and coil-P, coil-N comprises the measurement conductors of the second plurality of measurement conductors 1204 and the fourth plurality of measurement conductors 1208 and coil-P comprises measurement conductors of the first plurality of measurement conductors 1202 and the third plurality of measurement conductors 1206. Each turn, the coils alternate the measurement conductors used.

This interleaved arrangement may provide improved electrostatic coupling performance. For example, there may be an external, interfering, AC voltage carrying (dv/dt) conductor near to the top surface of the PCB, or generally an undesired field present just above the PCB. As both coils include the same number of turns on the first layer of the PCB the same electrostatic coupling should occur in each coil.

Compensation conductors 1206, 1210 may be included around the perimeter of the circuit board. For example, the compensation conductor may take the form of a meandering conductor located near, and wound between, the outer circumference vias 1210 of the coils.

The vias at the inner circumference may be arranged as two concentric circles 1214, 1216 so as to allow the four measurement conductors which form a group of measurement conductors to be connected in the same radial plane in which the group of measurement conductors is formed. Coil-N uses the first circle of vias 1214 and the second circle of vias 1216 of the inner circumference vias alternately. Coil-P uses the first circle of vias 1214 and the second circle of vias 1216 of the inner circumference vias alternately.

For example, the measurement conductors of 1302, 1304 of coil-N are connected using via 1306 of the first circle of vias 1214 and the measurement conductors 1320, 1322 of coil-P are connected using the via 1324 of the second circle of vias 1216. The measurement conductors 1308, 1310 of coil-N are connected using the via 1312 of the second circle of vias 1216 and the measurement conductors 1326, 1328 of coil-P are connected using via 1330 of the first circle of vias 1214. In general, measurement conductors of the first plurality of measurement conductors 1202 and the third plurality of measurement conductors 1206 may be connected using a first circle via 1214. Measurement conductors of the second plurality of measurement conductors 1204 and the fourth plurality of measurement conductors 1208 may be connected using a second circle via 1216. Whilst the vias have been described in this manner, they may also be connected in the opposite manner, for example measurement conductors of the first plurality of measurement conductors 1202 and the third plurality of measurement conductors 1206 may be connected using a second circle via 1216 and measurement conductors of the second plurality of measurement conductors 1204 and the fourth plurality of measurement conductors 1208 may be connected using a first circle via 1214. As each coil, coil-N and coil-P, use the same number of first circle vias and second circle vias in this alternating manner, the area enclosed by the coils remains, on average, the same. This ensures that the coils may provide balanced coupling from the current-carrying conductor under measurement.

FIG. 14*a* shows the conductive PCB traces which make up coil-N and its respective first compensation conductor. FIG. 14*b* shows the conductive PCB traces which make up coil-P and the second compensation conductor. FIG. 14*c* shows how coil-N and coil-P may be combined to form a differential rate of change of current sensor. Many of the features of FIGS. 14*a*-14*c* are the same as those of FIGS. 13*a*-13*c*, however, FIGS. 14*a*-14*c* show more clearly the connections at the outer circumference of the coils, and the arrangement of the compensation conductors. A legend is provided on the figure, wherein measurement conductors on different layers of the substrate are represented using different line formats. Measurement conductors are represented as being adjacent to each other, rather than directly in the same radial plane, for ease of understanding.

At the exterior circumference, circumferential progression of coil-P may be provided using circumferentially progressing elements which connect the measurement conductors to respective outer circumference vias. These circumferential progression conductors allow the measurement coils to progress from a connection node in a circumferential direction and to connect to further measurement conductors.

For example, coil-P 504 progresses from connection node 512 to node 514 in a counter-clockwise direction using the circumferentially extending conductors 1402. Outer circumference vias 1404 connect circumferentially extending conductors on one layer of the circuit board to those on another layer of the circuit board, allowing the circumferentially extending conductors 1402 to connect measurement conductors in one plane which is perpendicular to a major surface of the circuit board to measurement conductors in another plane.

Coil-N progresses from connection node 518 to node 520 in a clockwise direction relative to the current-carrying conductor using the circumferentially extending conductors 1406 connected to outer circumference vias 1408.

A first compensation conductor 506 and a second compensation conductor 510 are also provided on the schematics of FIGS. 14*a*-14*c*. The first compensation conductor is provided such that it meanders adjacent to the circumferential conductors 1402 of coil-P, returning from node 514 to node 516, in the opposite circumferential direction to coil-P. The second compensation conductor is provided such that it meanders adjacent to the circumferential conductors 1406 of coil-N. Closely following the circumferentially extending elements of the respective measurement coil in this manner ensures that the single loop formed by the compensation conductors are the same, or as similar as possible, to the single loops formed by the measurement coils.

The compensation conductors are formed over four layers of the circuit board, alternating between these layers. Compensation conductors are formed from conductive traces 1410 on the circuit board which progress circumferentially. The compensation conductor traces 1410 run over four layers of the circuit board, alternating between first outer circumference vias 1412 and second outer circumference vias 1414.

Whilst the above four-layer implementation has been described with the current measurement coils progressing in opposite directions, the current measurement coils may also be implemented such that they progress in the same direction, as outlined in FIGS. 7*a*-7*c*.

Two-Layer Implementation

As well as the rate of change of current sensor described above in which the measurement coils are implemented in opposite directions or senses across four layers of a circuit board, a differential current sensor may also be implemented across two layers of a circuit board. For example, the implementation of FIGS. 5*a*-5*c* may be implemented across two layers of a circuit board, such that coil-N and coil-P are interleaved in the plane parallel to the major surface of the circuit board, rather than being interleaved in the plane perpendicular to the major surface of the circuit board, as in FIGS. 11-14. Beneficially, two-layer circuit board implementations may provide simplified manufacturing demands compared to four-layer circuit board implementations as well as lowering the cost to produce the rate of change of current sensor whilst still maintaining good performance with respect to the rejection of noise coupling.

Figure 15A:
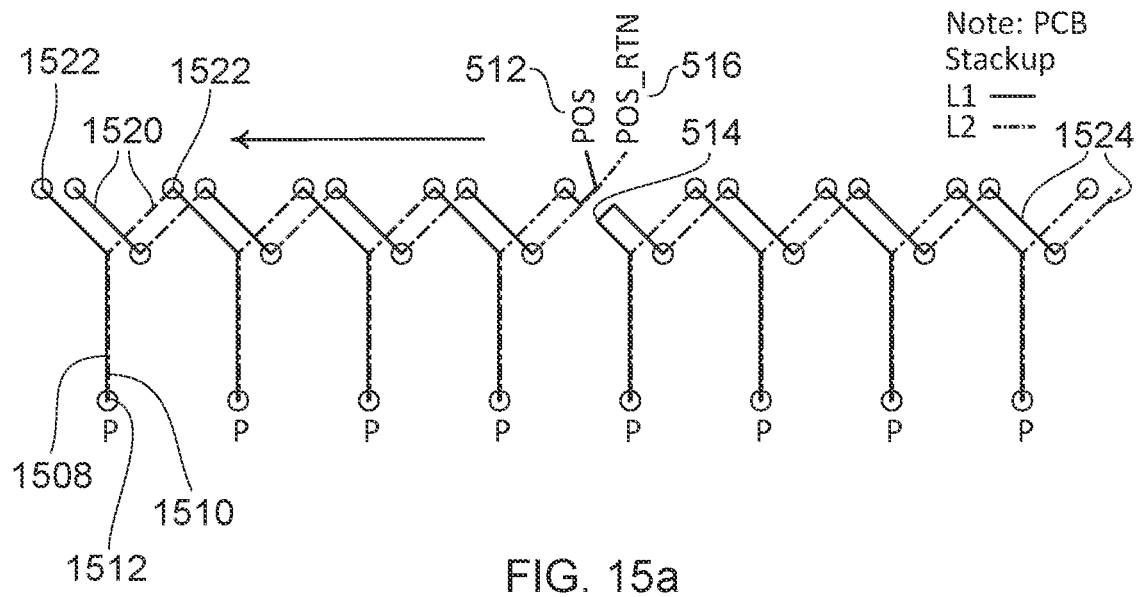
Figure 15B:
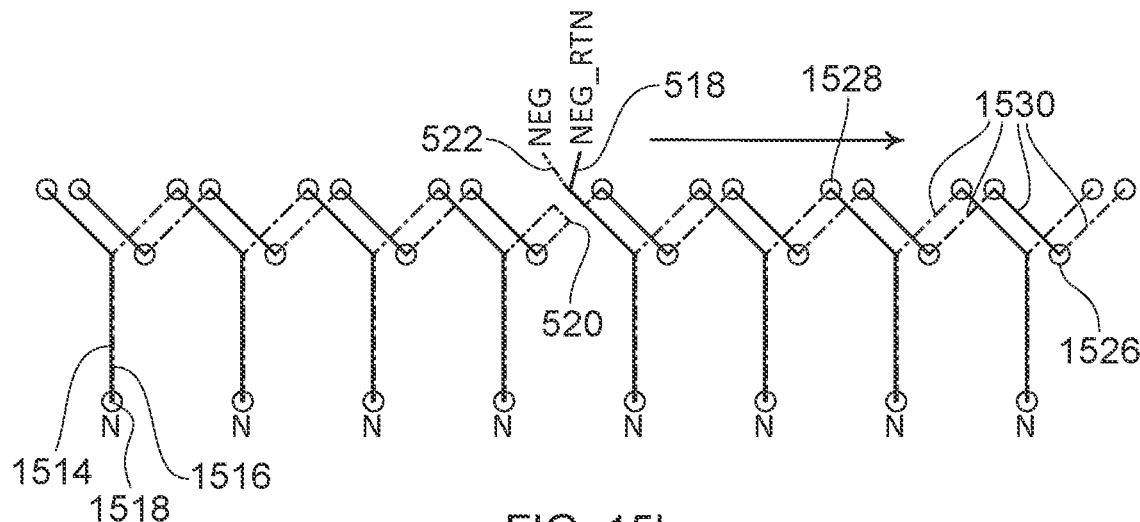
FIG. 15b is a schematic representation of two-layer representation of a second coil of the current sensor of FIG. 5b.
Figure 15C:
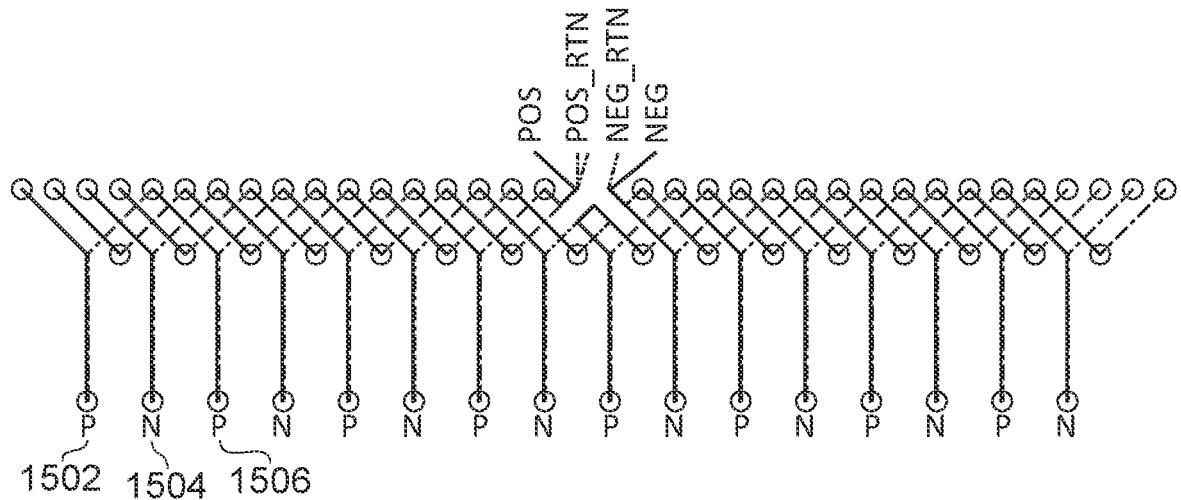
FIG. 15c is a schematic representation of the two-layer implementation of the rate of change of current sensor according to FIG. 5c, including both the first and second coils of FIGS. 15a and 15b.

FIGS. 15*a*-15*c* show schematic representations of a subsection of a two-layer implementation of the rate of change of current sensor according to FIGS. 5*a*-5*c*, in which a first and second measurement coil progress in opposite directions around the central path for the current-carrying conductor 500. Whilst FIGS. 15*a*-15*c* show the coils arranged linearly (i.e., progressing in a straight line from right to left, or left to right, as if the coils have been straightened out, rather than encircling the central aperture), this is done only for simplicity of presentation. It will be appreciated that the radial conductor elements are actually arranged in a circle around a central aperture or path, and the vias located at the inner and outer edges are also arranged in circles, such that the vias mark the inner and outer circumferences of the measurement conductors. Some aspects of the two-layer implementation are the same as those in the four-layer implementation, and the description with respect to FIGS. 11-14 should also be kept in mind when considering the description of the two-layer-implementation.

FIG. 15*a* shows a schematic diagram of a subsection of first measurement coil-P 504 and its first compensation conductor 506. FIG. 15*b* shows a schematic diagram of a subsection of second measurement coil-N 508 and second compensation conductor 510. FIG. 15*c* shows a schematic diagram including the features of both FIGS. 15*a* and 15*b*, implemented across two layers of a circuit board. A legend is provided on the figure, wherein measurement conductors on different layers of the substrate are represented using different line formats. Measurement conductors are represented as being adjacent to each other, rather than directly in the same radial plane, for ease of understanding.

Coil-N and coil-P are arranged across the two layers of the circuit board and are interleaved such that a turn of coil-N is formed in a radially extending plane which is perpendicular to the surface of the circuit board, followed by a turn of coil-P formed in a different radially extending plane perpendicular to the surface of the circuit board. For example, a first turn of coil-P 1502 is formed on two layers of the circuit board, then a first turn of coil-N 1504 is formed on two layers of the circuit board in an adjacent radial plane to the first turn of coil-P, then a second turn of coil-P 1506 is formed on two layers of the circuit board in the next adjacent radial plane to the first turn of coil-N. Interleaving the turns of the measurement coils in this way allows the measurement coils to both progress substantially around the path for the current-carrying conductor 500, whilst still maintaining, on average, the same distance to the current-carrying conductor of interest. The turns of coil-P and turns of coil-N are adjacent, such that a turn of coil-P is in a different, but adjacent, radially extending plane to a turn of coil-N.

A first plurality of measurement conductors may be located on the first layer of the substrate or circuit board, and a second plurality of measurement conductors may be located on the second layer of the circuit board. Each respective measurement conductor of the first plurality of measurement conductors is aligned with a respective measurement conductor of the second plurality of measurement conductors in a plane perpendicular to the surface of the substrate, the plane extending radially. A turn of the first measurement coil-P 504 may comprise a measurement conductor 1508 of the first plurality of measurement conductors and a measurement conductor 1510 of the second plurality of measurement conductors. These measurement conductors 1508, 1510 are formed in the same radially extending plane (i.e. a plane perpendicular to the surface of circuit board). The measurement conductor 1508 on the first layer and the measurement conductor 1510 on the second layer may be connected by an inner circumference via 1512.

A turn of second measurement coil-N 508 may comprise by a measurement conductor 1514 of the first plurality of measurement conductors and a measurement conductor 1516 of the second plurality of measurement conductors. The measurement conductor 1514 on the first layer and the measurement conductor 1516 on the second layer may be connected by an inner circumference via 1518.

At the exterior circumference, circumferential progression of coil-P may be provided using circumferentially progressing elements which connect the measurement conductors to respective outer circumference vias. These circumferential progression conductors allow the measurement coils to progress from a connection node in a circumferential direction and to connect to further measurement conductors.

For example, first measurement coil-P 504 progresses from connection node 512 to node 514 in a counter-clockwise direction around the path for the current-carrying conductor 500 using the circumferentially extending conductors 1520. Outer circumference vias 1522 connect circumferentially extending conductors on one layer of the circuit board to those on another layer of the circuit board, allowing the circumferentially extending conductors 1520 to connect measurement conductors in one radial plane to measurement conductors in an adjacent radial plane.

Second measurement coil-N 508 progresses from connection node 518 to node 520 in a clockwise direction around the path for the current-carrying conductor 500.

A first compensation conductor 506 and a second compensation conductor 510 are also provided in the schematics of FIGS. 15a-15c. The first compensation conductor is provided such that it meanders adjacent to the circumferential conductors 1520 of coil-P, returning from node 514 to node 516, in the opposite circumferential direction to coil-P. The second compensation conductor is provided such that it meanders adjacent to the circumferential conductors of coil-N, returning from node 520 to 522, in the opposite circumferential direction to coil-N. Closely following the circumferentially extending elements of the respective measurement coil in this manner may result in the single loop formed by the compensation conductors being the same, or as similar as possible, to the single loops formed by the measurement coils.

The compensation conductors are formed over two layers of the circuit board, alternating between these layers. Compensation conductors are formed from conductive traces on the circuit board 1524 which progress circumferentially. The compensation conductor traces 1524 run over two layers of the circuit board, alternating between first outer circumference vias 1526 and second outer circumference vias 1528.

The compensation conductors may be formed over two layers of the circuit board, such that the compensation conductors comprise segments of conductor formed in an alternating sequence on the first and second layers of the circuit board. This may be seen in FIGS. 15a-15c, in which segments 1524 of the first compensation conductor are formed on a first layer of the circuit board and a second layer of the circuit board in an alternating pattern. This pattern continues, such that a compensation conductor is formed from a number of circumferentially progressing segments 1524 arranged on alternating layers of the circuit board.

The second compensation coil is formed in a similar manner, using segments 1530 on the first and second layers of the circuit board.

FIGS. 11-15 relate to implementations of a rate of change of current sensor in which the two measurement coils are arranged to progress in opposite circumferential directions, as in FIGS. 5a-5c. However, they may also be implemented such that the measurement coils progress in the same circumferential direction, as in FIGS. 7a-7c.

Opposite direction measurement coils may not fully eliminate capacitive coupling that may be caused by the imperfect matching of the parasitic impedances shown in FIGS. 3 and 4 resulting from interfering conductors which are not symmetrically centred on the coil. For example, if the parasitic impedances of $POS_{Turn1}$ equalled the parasitic impedances of $NEG_{Turn1}$, and the same was true for all turns of the coil-P and coil-N up to turn N, then there should be perfect impedance balance such that no differential voltage would exist between the first and second measurement coils. However, if the current-carrying conductor is mis-centred such that it was physically closer to $POS_{Turn1}$ than to $NEG_{Turn1}$, then the parasitic capacitance to the current-carrying conductor for each turn will be slightly different, which will result in a mismatch of impedances in the equivalent circuit of FIG. 4. Routing the coils in opposite directions may result in the coils following different paths.

Therefore, a potential solution to further improve the balance of the parasitic impedances is to route both coils in a near identical manner from the terminals of a differential measurement circuit which may be connected to the connection nodes of the coils. Starting both coils such that they follow the same circumferential direction around the centre of the coil (for example, both coil-N and coil-P progressing clockwise or both coil-N and coil-P progressing anti-clockwise) may keep each turn of the coils at the same distance from the current-carrying conductor or interferer, and which may keep the terminals or connection nodes of the coils (e.g., 718, 712, 716 and 722) close to each other.

Progressing both coils in the same direction may allow them to follow the same path, maintaining spatial symmetry for the complete advancement of the coils, in that both coils travel together. It may further allow the connection nodes 712, 716, 718 and 722 to be positioned at the same side of the coil, which can make it easier to connect a measurement circuit, as all connection nodes are close together.

Figure 16A:
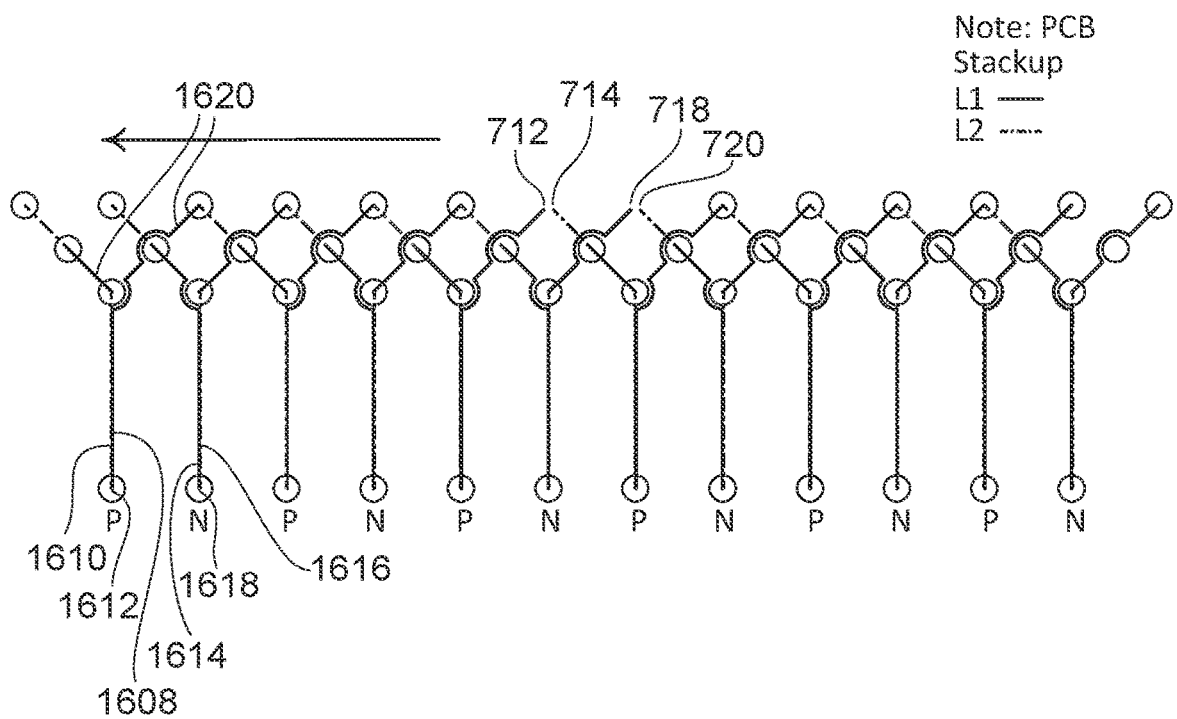
Figure 16B:
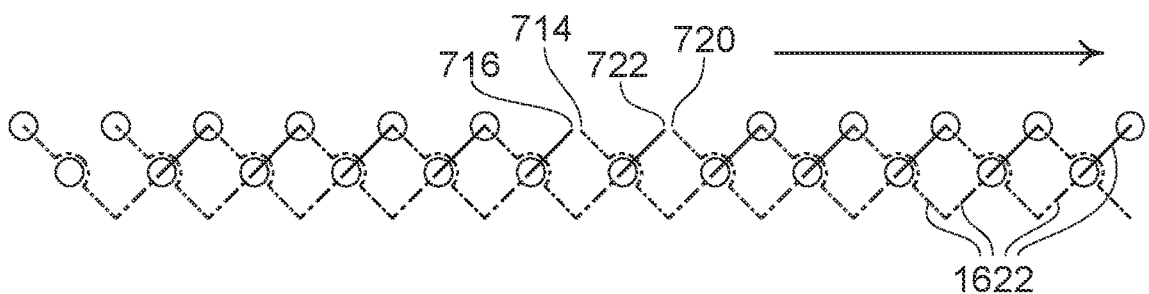
FIG. 16b is a schematic representation of a second coil of the two-layer implementation of the current sensor of FIG. 7b.
Figure 16C:
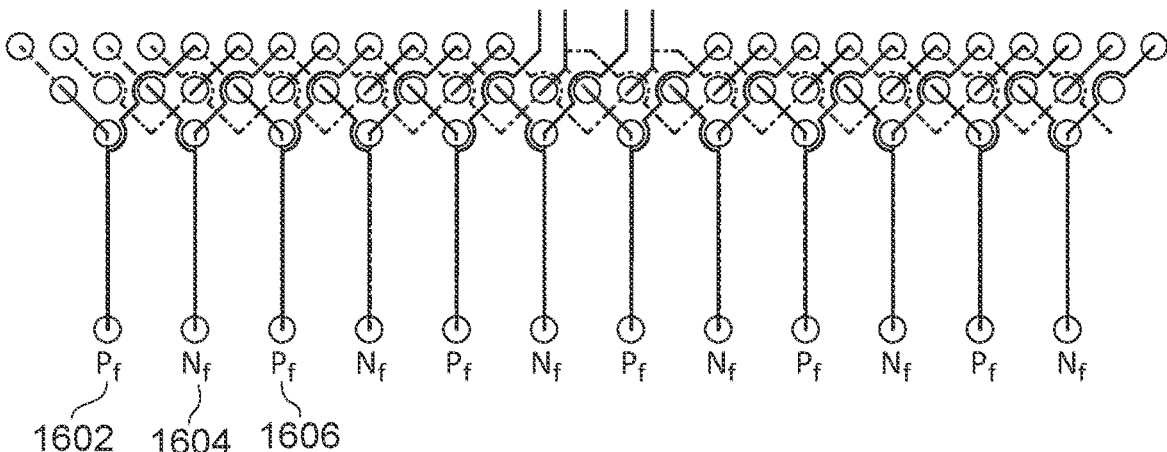
FIG. 16c is a schematic representation of the rate of change of current sensor according to FIG. 7c, including both the first and second coils of FIGS. 16a and 16b.

FIGS. 16a-16c show schematic diagrams of the arrangement of a two-layer same direction implementation according to FIGS. 7a-7c. FIG. 16a shows the conductive traces which make up both first measurement coil-P 704 and second measurement coil-N 708. FIG. 16b shows the conductive traces which make up the compensation conductors for coil-N and coil-P. FIG. 16c shows the complete rate of change of current sensor, including both coil-N, coil-P and their respective compensation conductors. A legend is provided on the figure, wherein measurement conductors on different layers of the substrate are represented using different line formats. Measurement conductors are represented as being adjacent to each other, rather than directly in the same radial plane, for ease of understanding.

Whilst FIGS. 16a-16c show the coils arranged linearly (i.e., progressing in a straight line from right to left, or left to right, as if the coils have been straightened out, rather than encircling the central aperture or path 500), this is done only for simplicity of presentation. It will be appreciated that the radial conductor elements are actually arranged in a circle around the path for the current-carrying conductor 500, and the vias located at the inner and outer edges are also arranged in circles, such that the vias mark the inner and outer circumferences of the measurement conductors. Some aspects of the two-layer implementation are the same as those in the four-layer and two-layer opposite direction implementations, and the description with respect to FIGS. 11-15 should also be kept in mind when considering the description of the two-layer same direction implementation.

Coil-N and coil-P are arranged across the two layers of the circuit board and are interleaved such that a first turn of coil-N is formed in a radially extending plane which is perpendicular to the surface of the circuit board, followed by a first turn of coil-P formed in a radially extending plane perpendicular to the surface of the circuit board, and adjacent in the circumferential direction to the first turn of coil-N. For example, a first turn of coil-P 1602 is formed on two layers of the circuit board, then a turn of coil-N 1604 is circumferentially adjacent to the first turn of coil-P 1602 and formed on two layers of the circuit board, then a second turn of coil-P 1606 is circumferentially adjacent to the first turn of coil-N and formed on two layers of the circuit board. Interleaving the turns of the measurement coils in this way allows the measurement coils to both progress around the path or circuit board, whilst still maintaining, on average, the same distance to the current-carrying conductor of interest. For example, progressing substantially around the path, for example 360°. The turns of coil-P and turns of coil-N are circumferentially adjacent, such that a turn of coil-P is in a different, but circumferentially adjacent, radially extending plane to a turn of coil-N.

A first plurality of measurement conductors may be located on the first layer of the substrate or circuit board, and a second plurality of measurement conductors may be located on the second layer of the circuit board. Respective measurement conductors of the first plurality of measurement conductors and the second plurality of measurement conductors are located in the same radially extending plane perpendicular to the surface of the substrate. A turn of coil-P comprises a measurement conductor 1608 of the first plurality of measurement conductors and a measurement conductor 1610 of the second plurality of measurement conductors. These measurement conductors are formed in the same radially extending plane (i.e., plane perpendicular to the surface of circuit board). The measurement conductor 1608 of the first plurality of measurement conductors and the measurement conductor 1610 of the second plurality of measurement conductors may be connected by an inner circumference via 1612, the inner circumference via being located in the same radial plane as the measurement conductors.

A turn of coil-N comprises by a measurement conductor 1614 of the first plurality of measurement conductors and a measurement conductor 1616 of the second plurality of measurement conductors. The measurement conductor 1614 on the first layer and the measurement conductor 1616 on the second layer may be connected by an inner circumference via 1618, the inner circumference via being located in the same radial plane as the measurement conductors.

At the exterior circumference, circumferential progression of coil-P may be provided using circumferentially progressing elements which connect the measurement conductors to respective outer circumference vias. These circumferential progression conductors allow the measurement coils to progress from a connection node in a circumferential direction and to connect to further measurement conductors.

For example, coil-P 704 progresses from connection node 712 to node 714 in a counter-clockwise direction around the current-carrying conductor using the circumferentially extending conductors 1620. The circumferentially extending conductors connect to vias at the outer circumference, which allow connection of measurement conductors in one radially extending plane to radially extending elements in a different radially extending plane. Coil-N progresses from connection node 718 to node 720 in an anti-clockwise direction around the current-carrying conductor. Whilst this diagram shows both measurement coils progressing in an anti-clockwise direction, the measurement coils may alternatively both progress in a clockwise direction.

A first compensation conductor 706 and a second compensation conductor 710 are also provided on the schematics of FIGS. 16a-16c. The first compensation conductor is provided such that it meanders adjacent to the circumferential progression conductors 1620 of coil-P, returning from node 714 to node 716, in the opposite circumferential direction to coil-P. The second compensation conductor is provided such that it meanders adjacent to the circumferential progression conductors 1620 of coil-N. Closely following the circumferentially extending elements of the respective measurement coil in this manner may mean that the single loop formed by the compensation conductors are the same, or as similar as possible, to the single loops formed by the measurement coils.

The compensation conductors are formed over two layers of the circuit board, alternating between these layers. Compensation conductors are formed from conductive traces on the circuit board 1622 which progress circumferentially. The compensation conductor traces 1622 run over two layers of the circuit board.

Compensation conductors may provide at least some magnetic immunity to external transverse fields by forming a cancelling loop opposite to the advancement of the coil. This compensation conductor may be replaced with a secondary coil, or return coil, without sacrificing magnetic immunity. Therefore, in some implementations, the rate of change of current sensor may not include a compensation conductor, but instead include further coils, as shown in FIGS. 9a-9c. Providing further coils in this manner may allow more turns to be included in the current sensor, as the turns of the return coils also provide current measurement. Including a greater number of coil turns may provide increased sensitivity to the current under measurement, providing a greater output voltage for the same current being measured.

Figure 17:
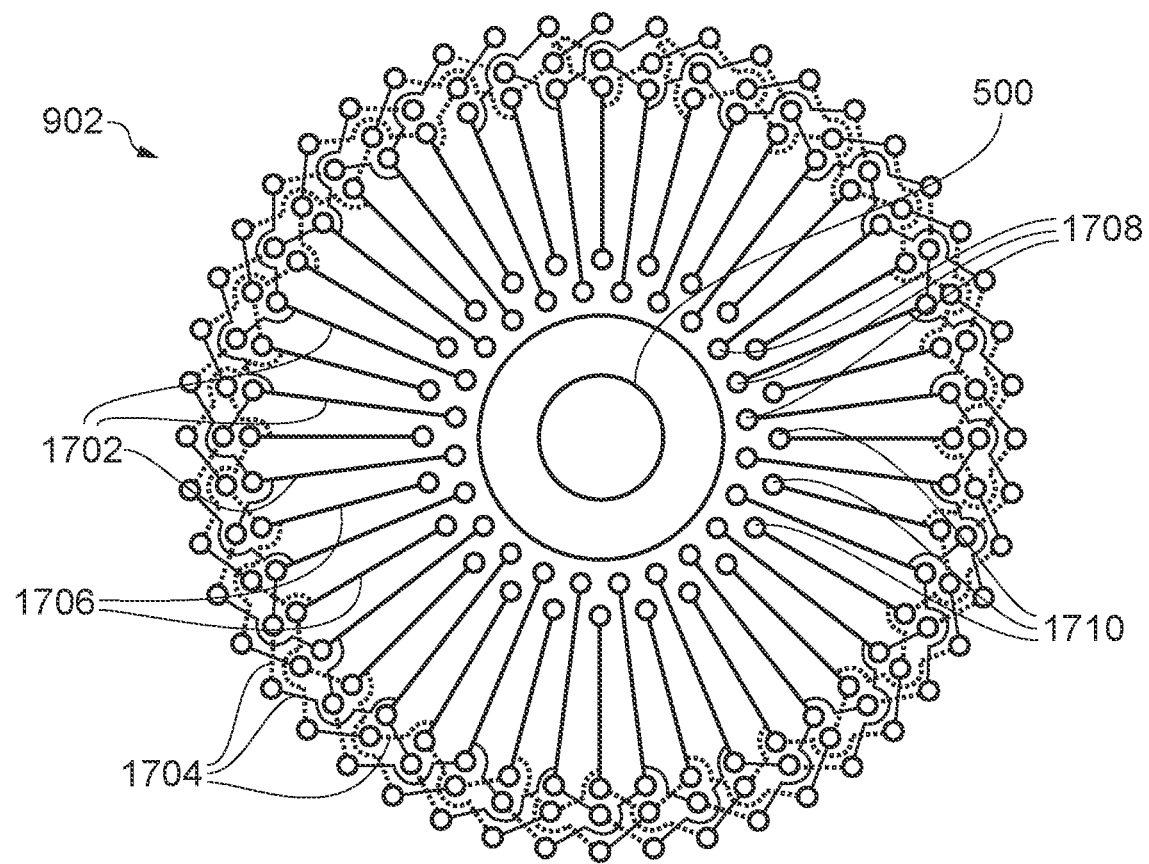
FIG. 17 is a plan view of a schematic of a two-layer rate of change of current sensor according to FIGS. 9a-9c.
Figure 18:
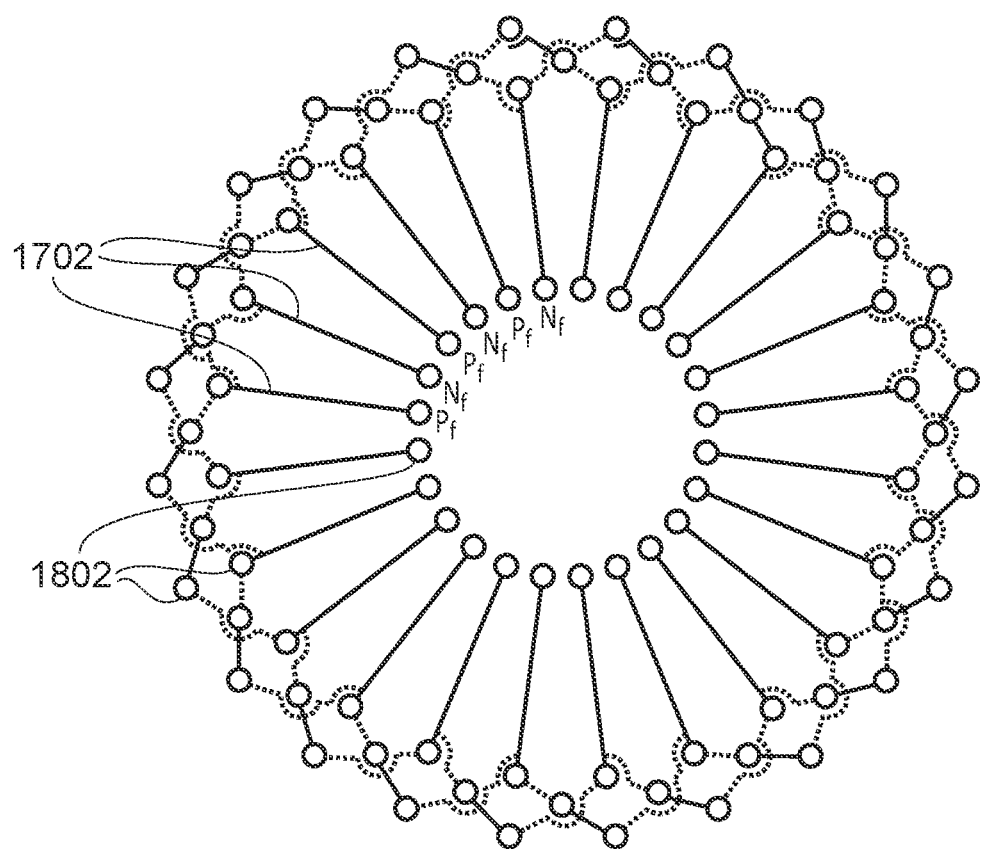
FIG. 18 is a plan view of a schematic of the measurement coils of FIG. 17.
Figure 19:
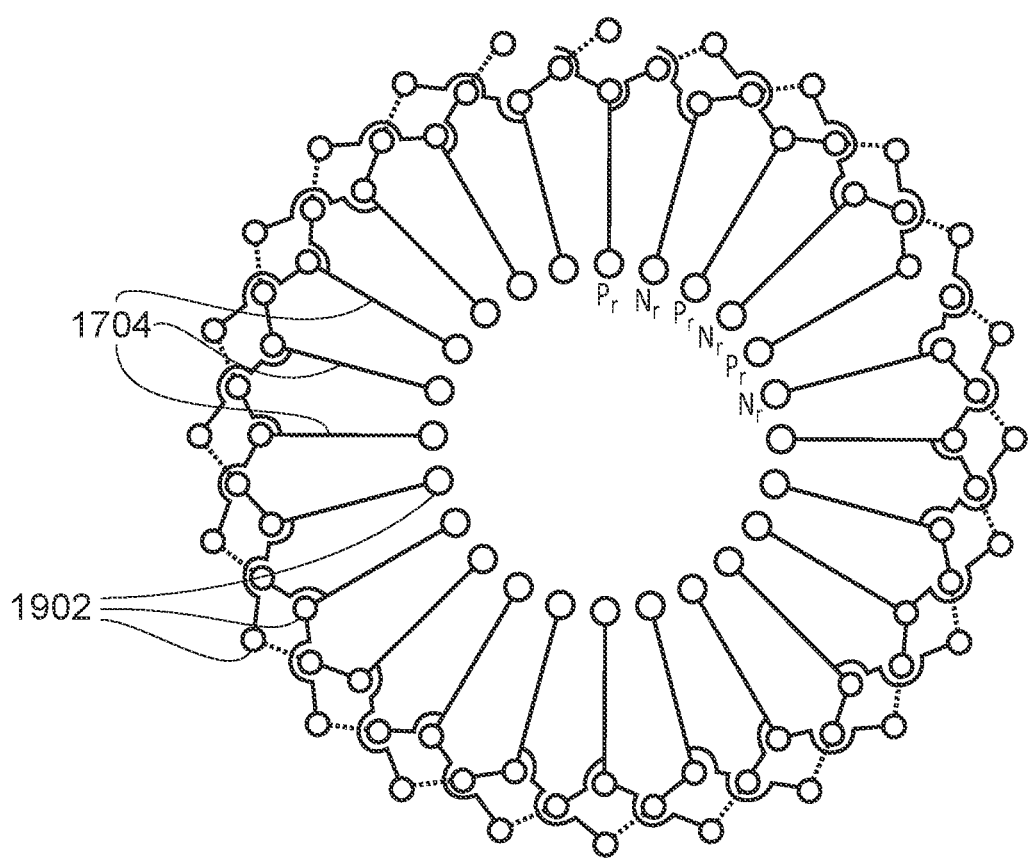
FIG. 19 is a plan view of a schematic of the return coils of FIG. 17.

FIG. 17 shows a 2-dimensional top view of a PCB implementation of a rate of change of current sensor 902. As in FIGS. 9a-9c, the rate of change of current sensor includes a first measurement coil (coil-P) 904, a second measurement coil (coil-N) 908, a first return coil 906 and a second return coil 910. FIGS. 18 and 19 show subsections of FIG. 17, with FIG. 18 showing the conductors which form the first measurement coil 904 and the second measurement coil 908. FIG. 19 shows the conductors which form the first return coil 906 and the second return coil 910. Measurement conductors on the first layer on the substrate are represented as solid lines, measurement conductors on the second layer of the substrate are represented as dashed lines.

The measurement coils and return coils progress around the current-carrying conductor or path 500, for example progressing substantially around the path, for example to surround the path. Each measurement coil is formed, in part, by a number of conductive measurement coil tracks/traces, measurement conductors 1702. The measurement conductors or measurement coil tracks 1702 may be radial elements, in that they may extend in a radial direction from the path for the current-carrying conductor 500 of the sensor. Further measurement conductors 1706 are provided, which form part of the return coils 904, 908. The plurality of measurement conductors 1702, 1706 are arranged to circumferentially surround the current-carrying conductor 500. Circumferential progression of the coil may take place at the outer circumference, using circumferential progression conductors, or "kinks", 1704. These circumferential progression conductors allow the measurement coils to progress circumferentially relative to the current-carrying conductor or path 500, as outlined in the description relating to FIGS. 9a-9c.

FIG. 18 shows the plurality of measurement conductors 1702 which make up the first and second measurement coils. The measurement conductors 1702 include a first plurality of measurement conductors formed on a first layer of the substrate and a second plurality of measurement conductors formed on a second layer of the substrate. Respective measurement conductors of the first plurality of measurement conductors and the second plurality of measurement conductors are located in the same radially extending plane perpendicular to the surface of the substrate. As FIG. 18 shows a top-down perspective of the measurement coils, only the first plurality of measurement conductors, located on the first layer can be seen, as they obscure the view of the second plurality of measurement conductors which are located in the same radial plane.

FIG. 19 shows the plurality of measurement conductors 1704 which make up the first and second return coils. The measurement conductors 1704 include a third plurality of measurement conductors formed on a first layer of the substrate and a fourth plurality of measurement conductors formed on a second layer of the substrate. Respective measurement conductors of the third plurality of measurement conductors and the fourth plurality of measurement conductors are located in the same radially extending plane perpendicular to the surface of the substrate. As FIG. 19 shows a top-down perspective of the measurement coils, only the third plurality of measurement conductors, located on the first layer can be seen, as they obscure the view of the fourth plurality of measurement conductors which are located in the same radial plane. Measurement conductors of the first plurality of measurement conductors are coupled to measurement conductors of the second plurality of measurement conductors using a first plurality of vias 1802, which form a first circle. Measurement conductors of the third plurality of measurement conductors are coupled to measurement conductors of the fourth plurality of measurement conductors using a second plurality of vias 1902, which form a second circle.

Figure 20A:
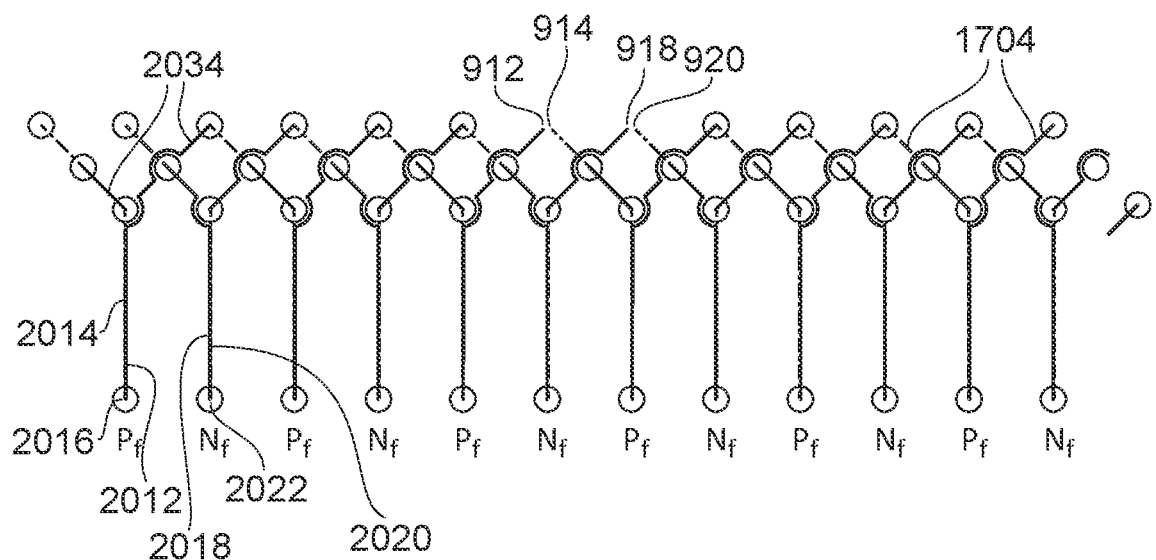
FIG. 20a is a schematic representation of the measurement coils of FIG. 18.
Figure 20B:
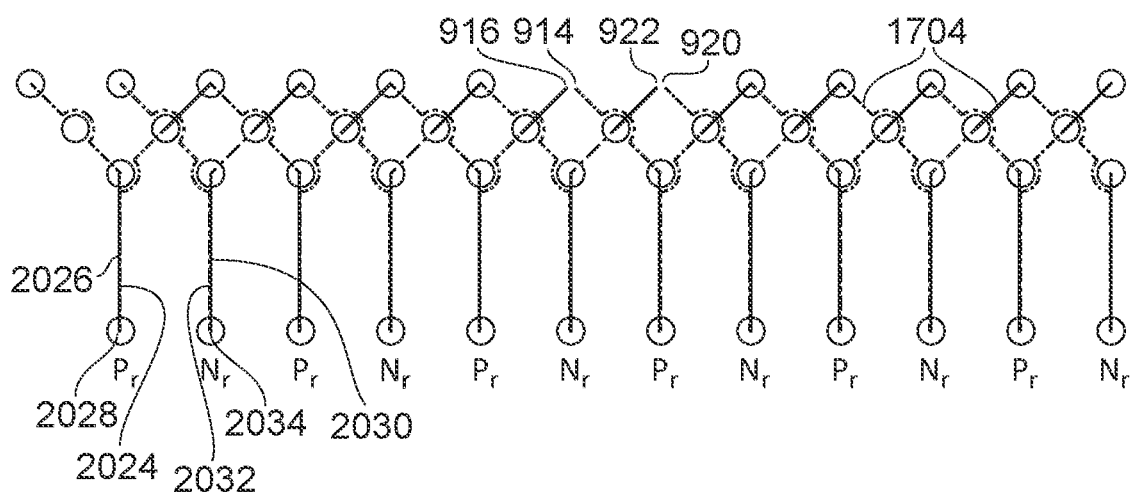
FIG. 20b is a schematic representation of the return coils of FIG. 19.
Figure 20C:
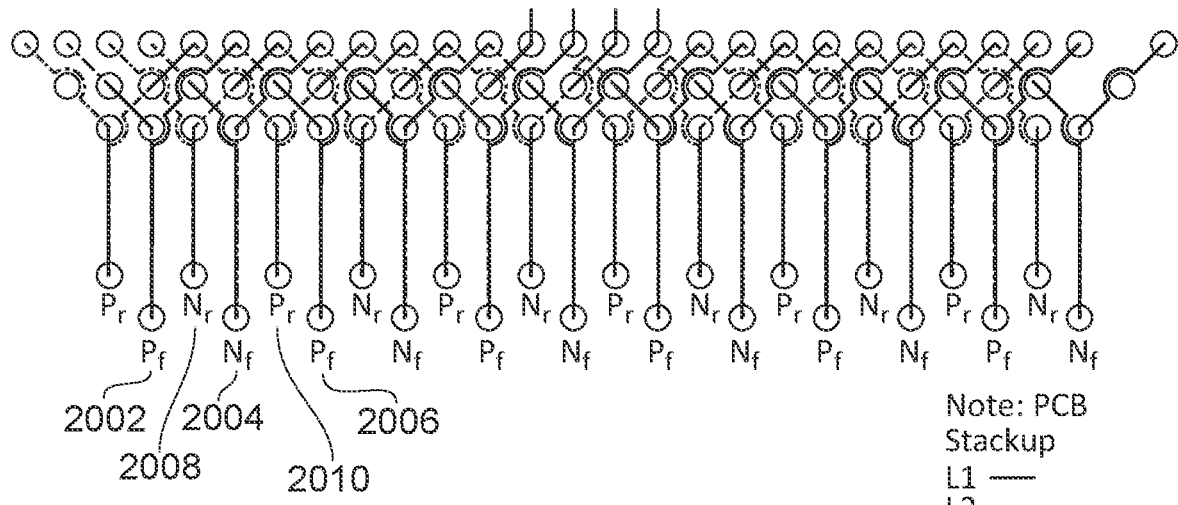
FIG. 20c is a schematic representation of the measurement coils of FIG. 20a and the return coils of FIG. 20b.

FIGS. 20a-20c show schematic diagrams of the arrangement of a two-layer implementation including return coils according to FIGS. 9a-9c. FIG. 20a shows both first measurement coil-P and second measurement coil-N, as in FIG. 18. FIG. 20b shows the first return coil and the second return coil, as in FIG. 19. FIG. 20c shows the complete rate of change of current sensor, including both the first measurement coil 904, the second measurement coil 908, the first return coil 906 and the second return coil 910. A legend is provided on the figure, wherein measurement conductors on different layers of the substrate are represented using different line formats. Measurement conductors are represented as being adjacent to each other, rather than directly in the same radial plane, for ease of understanding.

Whilst FIGS. 20a-20c show the coils arranged linearly (i.e., progressing in a straight line from right to left, or left to right, as if the coils have been straightened out, rather than encircling the central aperture), this is done only for simplicity of presentation. It will be appreciated that the radial conductor elements are actually arranged in a circle around the central aperture or path, and the vias located at the inner and outer edges are also arranged in circles, such that the vias mark the inner and outer circumferences of the measurement conductors, as in FIGS. 17-19. Some aspects of this two-layer implementation are the same as those in the other PCB implementations, and the description with respect to FIGS. 11-16 should also be kept in mind when considering the description of the two-layer-implementation.

Coil-N and coil-P are arranged across the two layers of the circuit board and are interleaved such that a turn of the first measurement coil is formed in a first radially extending plane which is perpendicular to the surface of the circuit board, followed by a circumferentially adjacent turn the second measurement coil formed in a second radially extending plane. Interleaving the turns of the measurement coils in this way allows the measurement coils to both progress around the circuit board, whilst still maintaining, on average, the same distance to the current-carrying conductor.

Turns of coil-N and turns of coil-P are provided in a repeating pattern around the current-carrying conductor or path for the current-carrying conductor 500, such that a turn of coil-P is followed by a turn of coil-N. However, the return coils may further be interleaved in this repeating pattern. A first turn 2008 of the first return coil 906 is provided adjacent to a first turn 2010 of the second return coil 910. This provides a repeating interleaved pattern, such that as you go around the sensor in the circumferential direction a turn 2002 of the first measurement coil 904 is adjacent to a turn 2008 of the first return coil 906, which is adjacent to a turn 2004 of second measurement coil 908 which is adjacent to a turn 2010 of the second return coil 910, which is adjacent to the next turn of the first measurement coil 904, etc.

A turn of the first measurement coil-P 904 may comprise a measurement conductor 2012 of the first plurality of measurement conductors and a measurement conductor 2014 of the second plurality of measurement conductors. Measurement conductors which make up part of a turn of a coil are located in the same radially extending plane perpendicular to the surface of the substrate. The measurement conductor 2012 on the first layer and the measurement conductor 2014 on the second layer may be connected by a via 2016, the via which connects the measurement conductors of the turn being located in the same plane as the measurement conductors.

A turn of the second measurement coil 908 may comprise a measurement conductor 2018 of the first plurality of measurement conductors and a measurement conductor 2020 of the second plurality of measurement conductors. The measurement conductor 2018 on the first layer and the measurement conductor 2020 on the second layer may be connected by a via 2022, where the via 2022 is located in the same plane as the measurement conductors 2018, 2020.

A turn of the first return coil 906 may comprise a measurement conductor 2024 of the third plurality of measurement conductors and a measurement conductor 2026 of the fourth plurality of measurement conductors. The measurement conductor 2024 on the first layer and the measurement conductor 2026 on the second layer may be connected by a via 1728.

A turn of the second return coil 910 may comprise a measurement conductor 2030 of the first plurality of measurement conductors and a measurement conductor 2032 of the fourth plurality of measurement conductors. The measurement conductor 2030 on the first layer and the measurement conductor 2032 on the second layer may be connected by a via 2034.

Notably, the first measurement coil 904, the first return coil 906, the second measurement coil 908 and the second return coil 910 are interleaved in the plane of the substrate, such that a turn of the first measurement coil is followed or preceded in the circumferential direction by a turn of the first return coil, then a turn of the second measurement coil and then a turn of the second return coil.

The turns may be routed such that each turn adds to the combined coil output voltage. The first turn 2002 of the first measurement coil 904 may enter the turn on the first layer and exits on the second layer, resulting in a particular polarity electromagnetic field (EMF) being inducted in the turn resulting from the measurement of the desired magnetic field. The first turn 2004 of the second measurement coil 908 may enter the turn on the second layer and exit the turn on the first layer, resulting in an opposite polarity EMF being induced relative to that induced in the first turn 2002 of the first measurement coil 904. These opposite polarities result in a differential mode voltage at terminals 912 and 918. Each turn of each coil can be routed in this manner from the terminals 912 and 918, increasing the differential mode voltage for each turn added. The turns of the return coils are routed in a fashion that further adds to the differential mode voltage.

The first measurement coil 904, second measurement coil, 908, first return coil 906 and second return coil 910 progress circumferentially around the path 500 using circumferentially progressing elements or conductors 1704. All circumferential progression of the coils occurs at the outer ends of the measurement conductors. This may ensure that the advancement ring of the measurement coils and the return coils takes place in the same area of the substrate, and that the magnetic noise induced in each forward coil cancels with the magnetic noise induced in the respective return coil. The advancement of each coil has identical loop area, resulting in near identical magnetic pickup due to undesired magnetic fields.

The measurement conductors of the first plurality of measurement conductors and the second plurality of measurement conductors are coupled using vias at an inner circumference of the measurement conductors, closer to the path or current-carrying conductor 500. The vias which couple the first plurality of measurement conductors and the second plurality of measurement conductors may be arranged to form a first circle of vias 1708. The vias which couple the third plurality of measurement conductors and the fourth plurality of measurement conductors may be arranged to form a second circle of vias 1710. In this way, the first measurement coil 904 and the second measurement coil 908 are formed using vias of the first circle of vias 1708 and the first return coil 906 and the second return coil 910 are formed using vias of the second circle of vias 1710.

Vias at the inner circumference of the measurement conductors may be staggered, and the forward coils, 904 and 908, use vias of the first circle of vias 1708 and the return coils 906, 910, use vias of the second circle of vias 1710. This means that a turn of the first measurement coil 904 is the same size as a turn of the second measurement coil 908 and that a turn of the first return coil 906 is the same size as a turn of the second return coil 910, and that the coupling into the first and second measurement coils is balanced and that the coupling into the first and second return coils is balanced. First circle of vias 1708 has a first diameter and the second circle of vias 1710 has a second diameter, with the first diameter being smaller than the second diameter, and the first and second circles of vias being concentric circles.

This results in the inner ends of the measurement conductors which make up the first measurement coil 904 and the second measurement coil 908 being the same distance to the current-carrying conductor as each other and the inner ends of the measurement conductors which make up first return coil 906 and the second return coil 910 being the same distance to the current-carrying conductor as each other.

This arrangement results in the measurement coils 904, 908 being positioned in such a manner that they are spatially equal, as both share the same proportion of measurement conductors on each layer of the circuit board and are coupled using vias of the same circle of vias, meaning that the measurement conductors are the same length. It further results in the coils enclosing the same area as they progress around the circuit board. The same is true of the return coils.

Staggering vias in this manner balances the parasitic capacitances of the first and second measurement coils and first and second return coils respectively. It also allows a greater number of turns to be provided for all the coils, as the inner circumference is smaller than the outer circumference and therefore may provide a restriction on the number of vias/turns which achieved. Providing two inner circumferences may increase the number of vias which may be placed at the inner circumference and therefore increase the number of turns that the coils can have.

Figure 21:
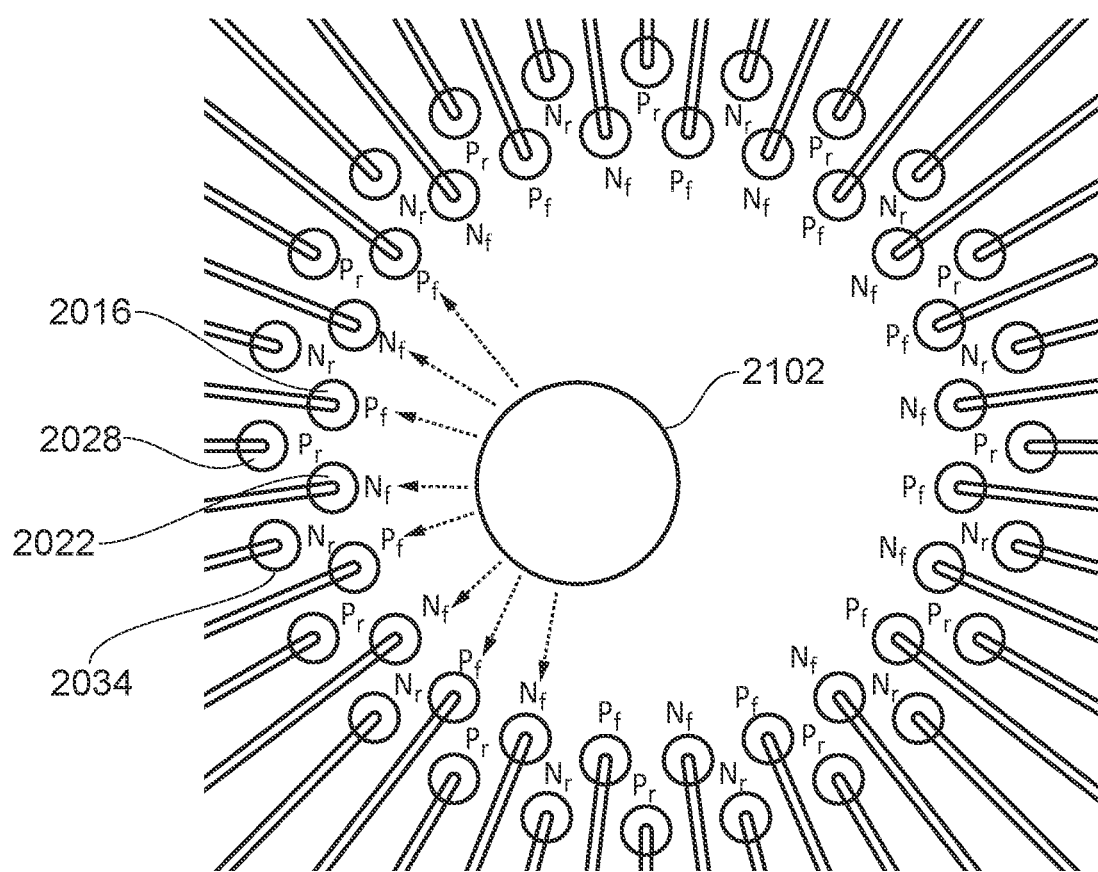
FIG. 21 is a plan view of the via arrangement at the inner circumference of the measurement conductors of FIG. 17.

FIG. 21 shows the arrangement of the first circle of vias and the second circle of vias of FIG. 17. The arrangement of FIG. 21 further includes a current-carrying conductor 2102. Typically, in prior art arrangements, the current-carrying conductor being mis-centred, such that it is not located in the centre of the coils, would result in the capacitive coupling into the coils being un-balanced, as described with relation to FIGS. 3 and 4. However, by alternating the vias of the first circle of vias such that they alternately connect measurement conductors of turns of the first measurement coil and the second measurement coil, the capacitive coupling between the first and second measurement coil and the current-carrying conductor under test should be almost equal.

Similarly, by alternating vias of the second circle of vias such that they alternately connect measurement conductors of turns of the first return coil and the second return coil, the capacitive coupling into the first and second return coils should almost equal.

For example, via 2016 of the first circle of vias forms part of a turn of the first measurement coil 906, via 2022 of the first circle of vias forms part of a turn of the second measurement coil 908. Due to their locations, the electrostatic coupling into the turns of the first and second measurement coil should be the same, or similar. Staggering vias in this manner allows the routing of turns of the first measurement coil 904 and the second measurement coil 908 to be spatially equal, which should mean that only common-mode noise pickup from external magnetic and electrostatic fields occurs.

Both the first and second measurement coils may share the same proportion of time between top and bottom layers, and enclose the same square area in each turn as they travel around the advancement. This ensures that each measurement coil (and return coil where they are provided) utilizes the same amount of conductive trace or conductor on each layer of the circuit board.

Whilst the concept of return coils has been described with respect to FIGS. 17-21 with respect to a two-layer PCB implementation, it is clear that this may also be implemented across four layers of the circuit board. For example, in the implementation of FIGS. 14a-14c, the compensation conductors may be replaced with a first return coil and a second return coil. To implement the first and second return coil across four layers, a fifth plurality of measurement conductors may be provided on the first layer of the substrate, a sixth plurality of measurement conductors may be provided on the second layer of the substrate, a seventh plurality of measurement conductors may be provided on the third layer of the substrate and an eighth plurality of measurement conductors, may be provided on the fourth layer of the substrate. A first return coil and second return coil may be formed using the fifth-eighth plurality of measurement conductors in the same way that the first measurement coil and second measurement coil are formed using the first-fourth plurality of measurement conductors. The first and second return coils may be interleaved with the first and second measurement coils in the plane of the substrate, such that a first radial plane comprises measurement conductors of the first measurement coil and the second measurement coil; and an adjacent second radial plane comprises measurement conductors of the first and second return coils.

The terminals, 912, 916, 918 and 922 of the rate of change of current sensor of FIG. 9 may be connected to further measurement circuitry. As shown in FIGS. 10a-10c, terminals 916 and 922 of the return coils may be coupled to a common reference, for example ground. The terminals 912, 918 of the first and second measurement coils may be coupled to a differential amplifier. This may allow the common capacitively coupled signal of the first measurement coil and the second measurement coil to be cancelled by the amplifier.

However, the connection from the coils to the amplifier or other measurement circuitry can be a potential source of further unwanted electromagnetic pickup, due to the unintended loop area formed by this connection.

Figure 22:
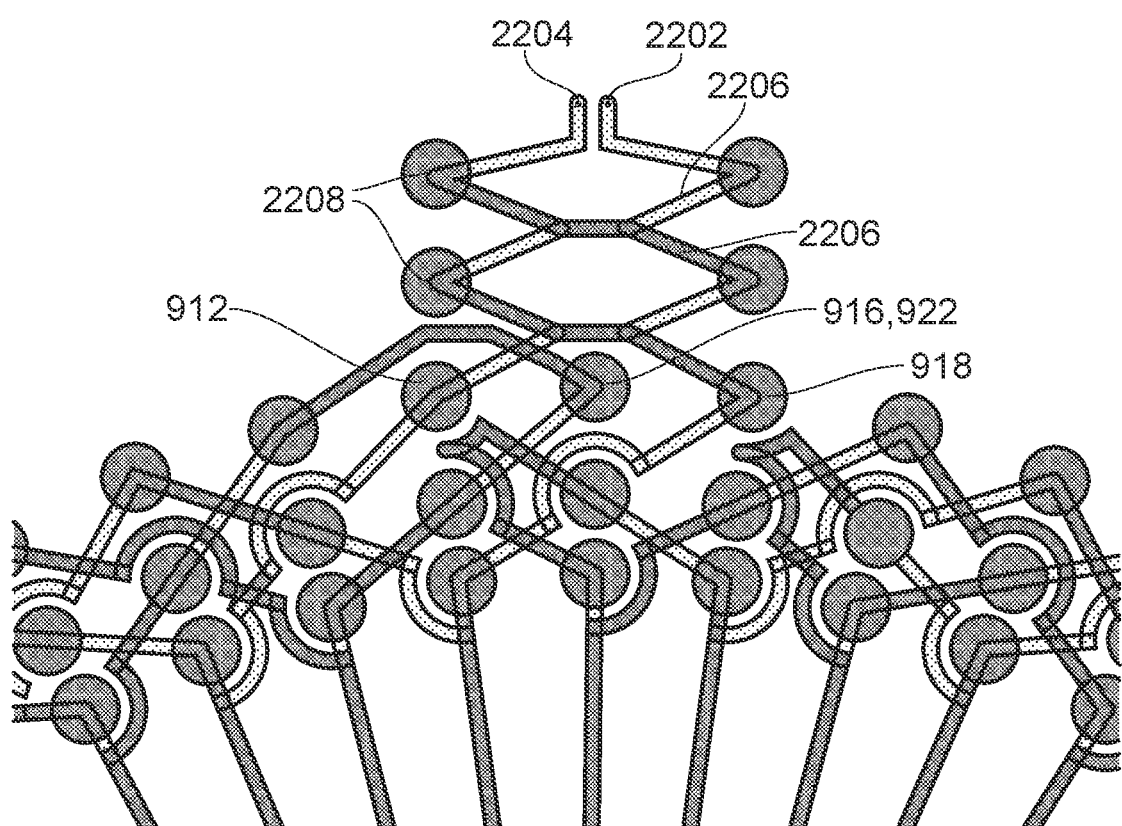
FIG. 22 is a plan view of a twisted-pair connection from the rate of change of current sensor of FIG. 17.

FIG. 22 shows one way in which the unwanted electromagnetic pickup may be reduced. The first ends 912, 918 of the first measurement coil 904 and the second measurement coil 908 may be coupled to measurement circuitry at nodes 2202 and 2204 using a substrate or PCB implemented twisted-pair arrangement. The loops formed by the twisted-pair are arranged such that each conductor of the twisted-pair is on average the same distance from any interfering source and therefore receives the same amount of noise coupling which may be cancelled by taking the difference of the signals. Conductors on the first layer of the substrate are represented as shaded lines, conductors on the second layer of the substrate are represented as clear lines.

The twisted-pair arrangement is constructed on the substrate using a plurality of connection conductors 2206, coupled using a plurality of connection vias 2208. The connection conductors 2206 are arranged to alternate between the first layer and second layer of the substrate using the connection vias 2208. The connection conductors are arranged to zig-zag and cross over each other on the first and second layers of the substrate, forming the twisted-pair.

Notably, the twisted-pair arrangement may be implemented in any of the PCB arrangements described, and any of the schematics of FIGS. 5-10. For example, when implemented with the four-layer rate of change of current sensor of FIGS. 11-14, the twisted-pair arrangement may alternate between the first and fourth layers, the second and third layers, or any combination thereof.

Rather than, or in combination with, the twisted-pair arrangement described with respect to FIG. 22, the connections to outside measurement circuitry may reduce the size of the loop created by the connections by routing the connection conductors on layers of the substrate which have a small dielectric distance. This results in a negligible loop area, reducing the amount of electromagnetic noise pickup. For example, where the rate of change of current sensor is implemented across a first layer and a second layer of a PCB, the connections to further current measurement circuitry may be implemented across the first layer and a further "connection" layer of the PCB, where the dielectric distance between the first layer and the connection layer is small relative to the dielectric distance between the first layer and the second layer of the PCB.

For instance, on a four-layer PCB, the first layer and the second layer may be internal layers of the PCB and may be used for the first and second coils (i.e., the two-layer designs described above). Connections to external measurement circuitry may be made using an external layer (which can be referred to in this example as the "connection" layer) and one of the first layer and the second layer.

FIG. 22 shows a rate of change of current sensor implemented on a PCB or substrate which includes four layers, 2302, 2304, 2306, 2308. The measurement coils are implemented across two of the four layers, for example, the first layer described in FIGS. 17-20 may be layer 2304 and the second layer described in FIGS. 17-20 may be layer 2306. Connections to external measurement circuitry may be the same as the ends of the measurement coils/return coils shown in FIG. 9, including nodes 912, 918, 916 and 922. Nodes 916 and 922 may be coupled together to a common reference or ground.

Figure 23:
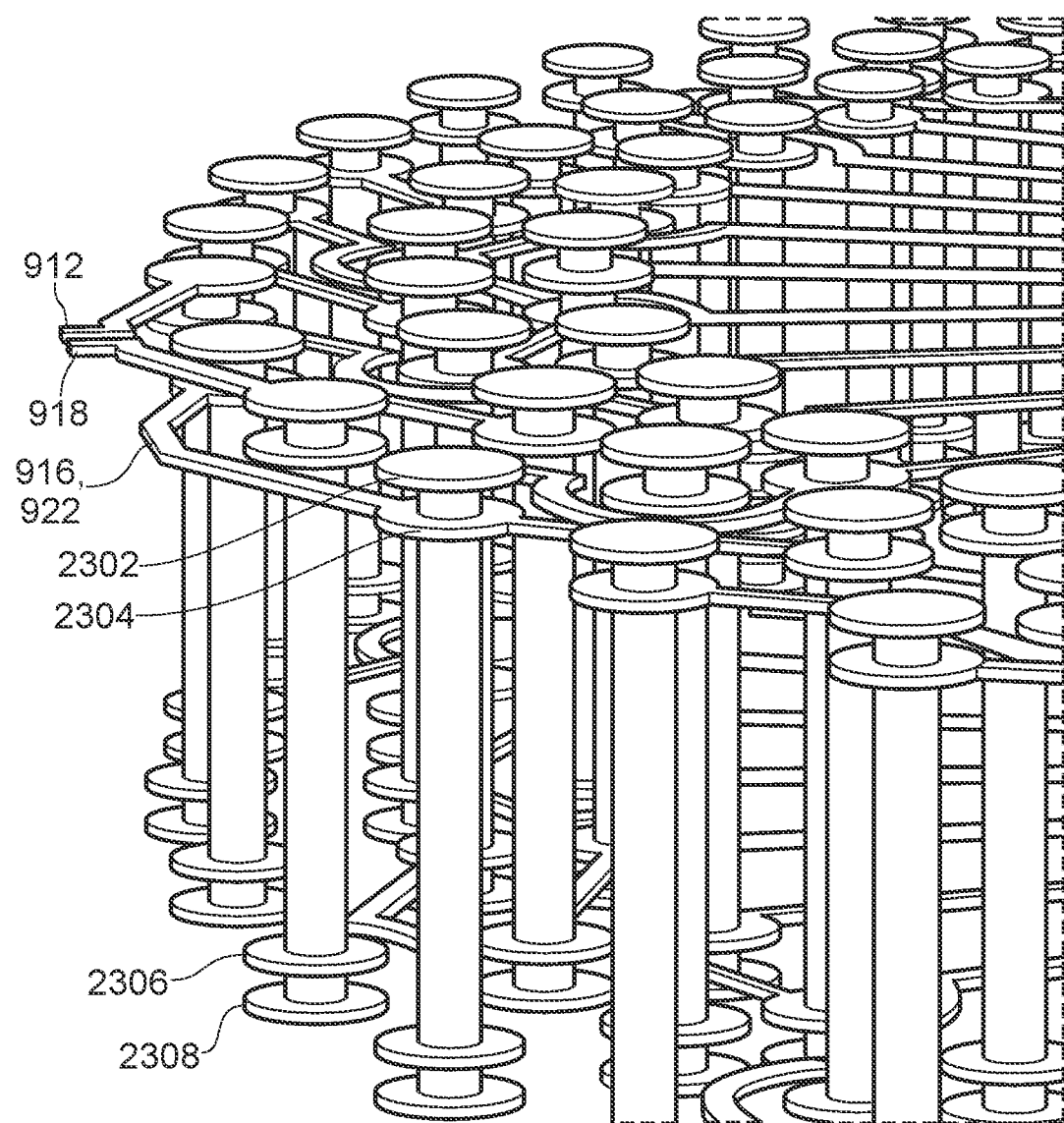
FIG. 23 is a plan view of an alternative connection from the rate of change of current sensor of FIG. 17.

Rather than nodes 916, 922 being routed to the measurement circuitry using the first layer 2304 and nodes 912 and 918 being routed to a common reference using the second layer 2306, they may instead be routed using layers 2302 and 2304. For example, as represented in FIG. 23, nodes 916, 922 can be routed to the measurement circuitry using the first layer 2304 and nodes 912 and 918 being routed to a common reference using layer 2302 (with vias being used to couple the nodes 912 and 918 to layer 2036). Alternatively, nodes 916, 922 could be routed to the measurement circuitry using the layer 2308 (with vias being used to couple the nodes 916, 922 to layer 2308) and nodes 912 and 918 being routed to a common reference using layer 2306. The dielectric distance between layers 2302 and 2304 (and between layers 2306 and 2308) is smaller than the dielectric distance between layers 2304 and 2306. This reduces the size of the loop formed by the connection of nodes 912, 918, 916 and 922 to the measurement circuitry. This further allows a wider dielectric distance between layers of the substrate which are used to route the measurement coils, which increases the area of each coil turn, thereby increasing the sensitivity of the coil and increasing the voltage output.

In general, a 4-layer PCB stack-up can be chosen to have wide dielectric layer between the copper layers used for the measurement and return coil turns, but a thin dielectric layer between layers used for the connection to the further measurement circuitry. This concept applies to any of the PCB designs referenced above, in that the connections to external measurement circuitry are routed using layers with a smaller dielectric distance than those used to route the majority of the turns of the coil.

To improve the sensitivity of the coil, the area enclosed by each turn of each coil might be as large as possible, whilst keeping the area enclosed by a turn of the first measurement coil substantially the same as the area enclosed by a turn of the second measurement coil.

For example, an eight-layer board may be provided and a four-layer implementation may be provided such that the measurement coils are implemented on layers 1, 2, 7 and 8 of the board. This would increase the area of each coil turn however the coils may still be arranged in an alternating, interleaved, fashion across these layers. Similarly, where the circuit is a two-layer implementation, the two layers may be layers 1 and 8 of the circuit board to maximise the area enclosed by the turns.

Further, a board with more layers than the number required to implement the measurement coils may be used to implement shielding from external electrostatic coupling. Whilst providing two measurement coils which progress substantially around a current-carrying conductor or path provides improved electrostatic coupling, in that the coils receive balanced coupling, the electrostatic coupling can be further reduced by adding shielding layers to the PCB. For example, the measurement coils may be implemented on the inner layers of a multi-layer PCB and a shield implemented on the external layers of the PCB. In a six-layer board, a four-layer measurement coil may be implemented on layers two, three, four and five, in the same alternating, interleaved arrangement described above. A shield may be implemented on layers one and six by coating layers one and six in a conductive material. Similarly, a two-layer measurement coil may be implemented on layers 2 and 3 of a four-layer-board, and a shield implemented on layers 1 and 4.

Figure 24:
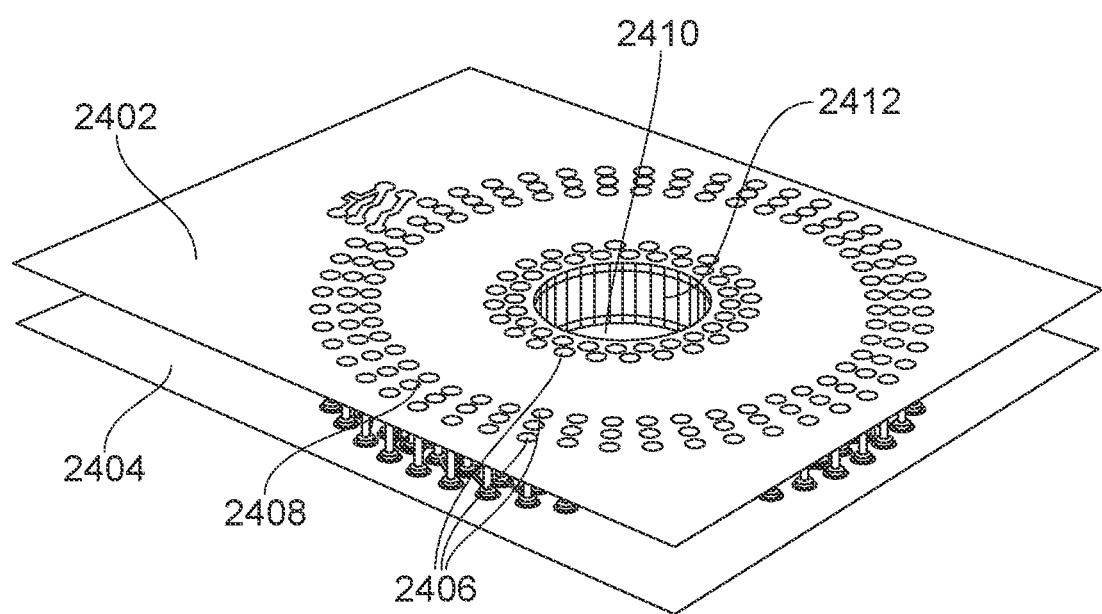
FIG. 24 is a representation of the rate of change of current sensor of FIG. 17 including further electrostatic shielding.

For example, FIG. 24 shows a rate of change of current sensor implemented on a four-layer PCB. A first electrostatic shield layer 2402 and a second electrostatic shield layer 2404 may be provided on layers of the substrate which are external relative to the layers which are used to implement the coils of the rate of change of current sensor.

PCB via technology can involve different levels of manufacturing complexity, which affects the cost and complexity of developing a current measurement coil on a PCB. Through-hole vias are vias which extend through the entire PCB stack, starting at one surface layer and ending on the other surface layer. A blind-via starts on a surface layer and extends part-way through the PCB stack. A buried-via does not extend through a surface layer, and instead begins and ends on internal layers of the PCB stack. Blind-vias and buried-vias tend to be more complex to manufacture than through-hole vias, however they allow higher density PCBs to be designed. Whilst all implementations of the current measurement coils described herein may be manufactured using blind- or buried-vias, this may be undesirable as it increases manufacturing complexity, and the implementations designed herein may all use through-hole vias.

Where the circuit board uses non-blind-vias, for example through-hole vias 2406 as in FIG. 24, the shield conductor material may not be able to cover the entirety of the outer layers, as the vias reach the surface of the circuit board. As such, the shield could be extended to cover all areas of the shielded layer which do not include through-hole vias. For example, outer layers of the substrate may by coated with a conductor across their entire area, except for etched areas 2408 surrounding each of the vias, so as to isolate the inner and outer vias from the shielding layers.

The through-hole vias may be provided with sufficient spacing such that it is possible to manufacture the shielding layers by flooding from the outer most circumference of the coil or substrate to the centre of the substrate.

A hole, aperture or path 500, 2410 may be included on the substrate in the centre of the current measurement coils to allow a current-carrying conductor to be located on the substrate or to pass through the substrate in the centre of the current measurement coils. The interior circumference of the hole may be electrostatically shielded 2412 across all the layers of the circuit board, by plating the inner circumference of the path. Alternatively, rather than a single shield, a plurality of shielding vias may be located around the inner circumference, between the hole and vias at the inner circumference of the measurement conductors, extending across all layers of the circuit board. This may provide shielding at the inside of the coil.

The measurement coils may be implemented on the inner layers of a multi-layer PCB, such that the outer layers may be used to allow routing of a current-carrying conductor. This removes the need to use a separate, physical, wire-based conductor, allowing the current measurement coils to be implemented more compactly. Instead, the system may simply include contacts by which the current-carrying conductor can be connected. On a six-layer PCB, a four-layer rate of change of current sensor may be implemented on layers two, three, four and five, and the routing for the current-carrying conductor provided on layers one and six, with a via in the centre of the measurement coil to connect current-carrying conductors on layers one and six.

If the rate of change of current sensor is implemented on a PCB with eight or more layers, shielding may be implemented between the PCB based current-carrying conductor and the measurement coil. For example, a four-layer rate of change of current sensor may be implemented on layers three to six, shielding may be implemented on layers two and seven and the input current-carrying PCB trace may be implemented on layers one and eight.

Whilst only a small number of examples of shielding and routing current-carrying conductors have been described here, it is clear that where a PCB has 6, 8 or more layers, multiple combinations of the measurement coils, shielding and current-carrying conductor connections may be implemented across different layers of the circuit board.

The rate of change of current sensor may be implemented such that the measurement coils progress substantially around the hole or current-carrying conductor, for example 360° as in FIGS. 5-10. However, the rate of change of current sensor may also be implemented using a combination of shorter coils, each of which progresses less than 360°. For example, the first measurement coil may be implemented as two 180° coils and the second measurement coil may be implemented as two 180° coils.

Figure 25:
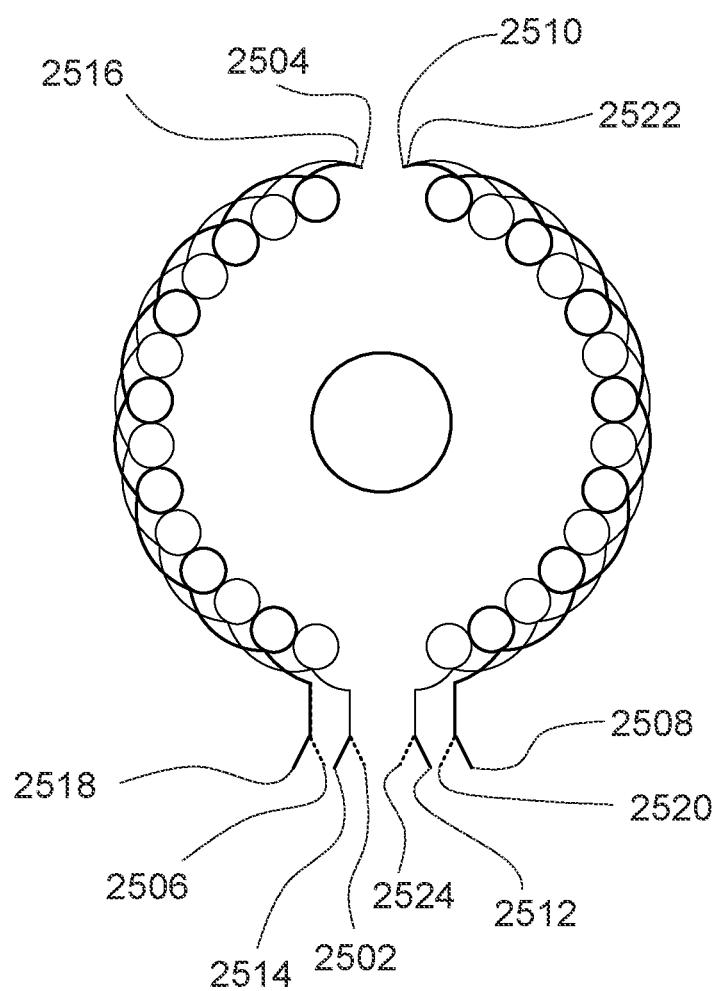
FIG. 25 is an alternative implementation of the rate of change of current sensor made up of multiple coil segments.

For example, FIG. 25 shows a rate of change of current sensor which includes 180° coil segments. The first measurement coil is constructed of two 180° measurement coil segments and two 180° return coil segments.

A first measurement segment begins at node 2502, progressing 180° to node 2504, node 2504 is also connected to a first return segment, which progresses 180° from node 2504 to node 2506. A second measurement segment begins at node 2508, progressing 180° to node 2510, node 2510 is also connected to a second return segment, which progresses 180° from node 2510 to node 2512. In this way, a first measurement coil which progresses 360° is formed from the first measurement segment and the second measurement segment. Similarly, a first return coil which progresses 360° is formed from the first return segment and the second return segment.

A third measurement segment begins at node 2514, progressing 180° to node 2516, node 2516 is also connected to a third return segment, which progresses 180° from node 2516 to node 2518. A fourth measurement segment begins at node 2520, progressing 180° to node 2522, node 2522 is also connected to a fourth return segment, which progresses 180° from node 2522 to node 2524. In this way, a second measurement coil which progresses 360° is formed from the third measurement segment and the fourth measurement segment. Similarly, a second return coil which progresses 360° is formed from the third return segment and the fourth return segment.

This arrangement provides a system in which the first and second measurement coils and return coils still provide balanced coupling, whilst also leaving a gap at the top of the measurement coils. This may allow the rate of change of current sensor to be provided over multiple, for example two, substrates or circuit boards.

The individual measurement coil segments may be located on the same PCB, or alternatively could be located on separate circuit boards. The latter would be useful for the clamp-on variety of a current sensor, or in Brown field applications where it is not possible to run the current-carrying wire through the sensor due to disassembly constraints.

Further, each measurement coil or return coil may be constructed from more than two segments, for example a first measurement coil may be implemented using four measurement segments, each segment providing 90° progression, six measurement segments, each segment providing 60° progression or eight measurement segments, each segment providing 45° progression.

The first measurement coil and second measurement coil of FIG. 25 are identical in construction with the exception that the layers may inverted on the second measurement coil relative to the first measurement coil. In other words, the first measurement coil may start on the first layer while the second measurement coil may start on the second layer. The layer inversion may result in the desired signal, that being the magnetic coupling to the current-carrying conductor, being of opposite polarity between the two coils and the non-desired signal, that being from external magnetic fields or electrostatic fields, being of the same polarity between the two coils. In a circuit, the non-desired signal may therefore be cancelled, whilst the desired signal may add constructively.

Figure 26:
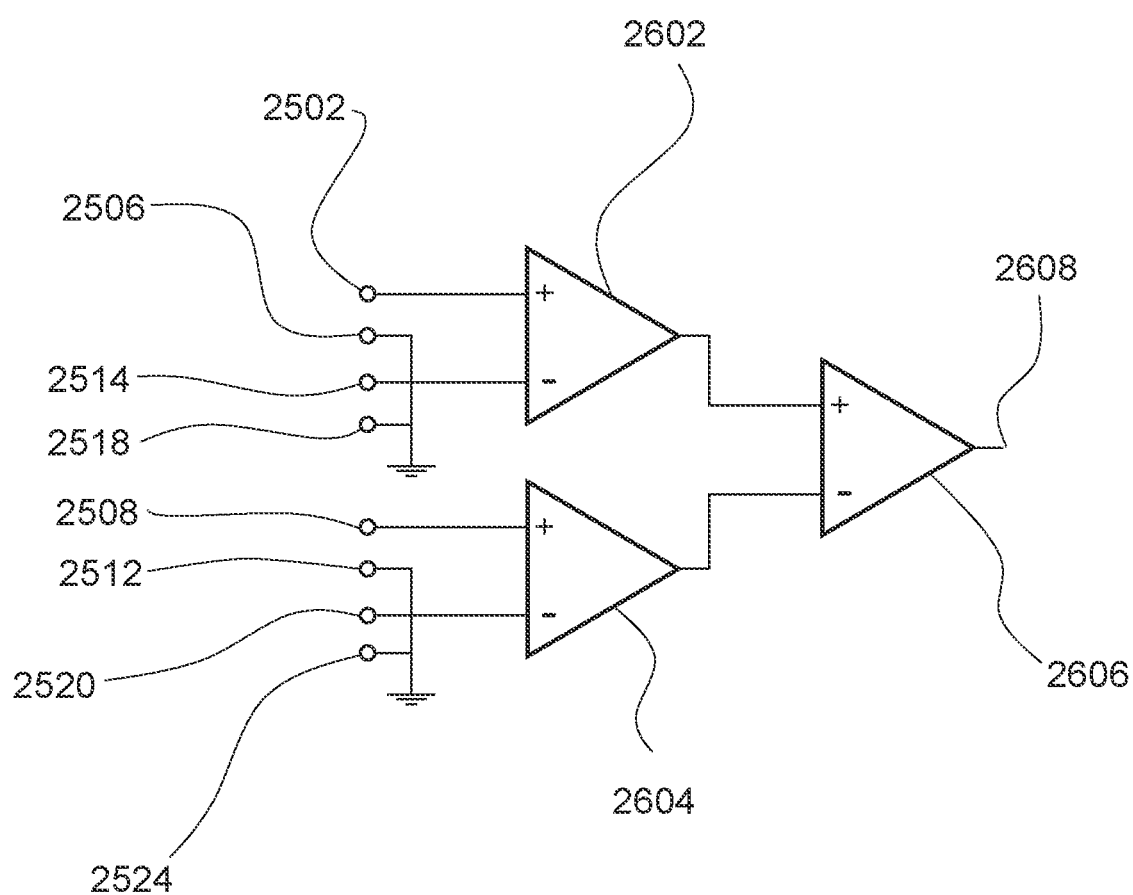
FIG. 26 is a diagram of measurement circuitry and the connection of the rate of change of current sensor of FIG. 25 to the measurement circuitry.

FIG. 26 shows one example of how each node of the circuit of FIG. 25 may be connected to further measurement circuitry. A first differential amplifier, 2602, receives as inputs the signals from nodes 2502 and 2514. Nodes 2506 and 2518 may be connected to a common reference, for example ground. A second differential amplifier, 2604, receives as inputs the signals from nodes 2508 and 2520. Nodes 2512 and 2524 may be connected to a common reference, for example ground. The outputs of the first differential amplifier 2602 and second differential amplifier 2604 may be connected to third differential amplifier 2606. The output of the third differential amplifier 2608 may be the current measurement signal.

Various modifications whether by way of addition, deletion, or substitution of features may be made to the above described examples to provide further examples, any and all of which are intended to be encompassed by the appended claims.

EXAMPLES

Example 1. A rate of change of current sensor, the rate of change of current sensor comprising: a substrate, the substrate comprising a first layer and a second layer, wherein the substrate includes a path for at least one current-carrying conductor; a first plurality of measurement conductors, formed on the first layer of the substrate; a second plurality of measurement conductors, formed on the second layer of the substrate; a first plurality of vias, formed in the substrate, arranged to connect the ends of the first plurality of measurement conductors with the respective ends of the second plurality of measurement conductors, so as to form a first current measurement coil which progresses around the path in a first circumferential direction and a second current measurement coil which progresses around the path in a second circumferential direction, wherein each measurement conductor on the first layer of the substrate is aligned with a respective measurement conductor on the second layer of the substrate in a radial plane that is perpendicular to the surface of the substrate.

Example 2. The rate of change of current sensor according to example 1, wherein the first measurement coil and the second measurement coil are interleaved, such that a first turn of the first measurement coil comprises a measurement conductor of the first plurality of measurement conductors and a measurement conductor of the second plurality of measurement conductors located in a first radial plane, and that a first turn of the second measurement coil comprises a measurement conductor of the first plurality of measurement conductors and a measurement conductor of the second plurality of measurement conductors in a second radial plane.

Example 3. The rate of change of current sensor according to any preceding example, wherein the first circumferential direction and the second circumferential direction are the same circumferential direction.

Example 4. The rate of change of current sensor according to any of examples 1-2, wherein the first circumferential direction and the second circumferential direction are opposite circumferential directions.

Example 5. The rate of change of current sensor according to example 2, the rate of change of current sensor further comprising: a third plurality of measurement conductors, formed on the first layer of the substrate; a fourth plurality of measurement conductors, formed on the second layer of the substrate; and a second plurality of vias; wherein the second plurality of vias are arranged to connect the ends of the third plurality of measurement conductors with respective ends of the fourth plurality of measurement conductors so as to form a first return coil and a second return coil, wherein a first end of the first return coil is coupled to a second end of the first measurement coil, the first return coil progressing around the path in a direction opposite to the first circumferential direction, wherein a first end of the second return coil is coupled to a second end of the second measurement coil, the second return coil progressing around the path in a direction opposite to the second circumferential direction, and wherein a first end of the first measurement coil is suitable for coupling to a measurement circuit and a first end of the second measurement coil is suitable for coupling to the measurement circuit.

Example 6. The rate of change of current sensor according to example 5, wherein the first measurement coil, the first return coil, the second measurement coil, and the second return coil are interleaved, such that: a first turn of the first return coil comprises a measurement conductor of the third plurality of measurement conductors and a measurement conductor of the fourth plurality of measurement conductors located in a third radial plane; a first turn of the second return coil comprises a measurement conductor of the third plurality of measurement conductors and a measurement conductor of the fourth plurality of measurement conductors located in a fourth radial plane; and wherein the first radial plane, the third radial plane, the second radial plane and the fourth radial plane are arranged such that they are adjacent, in that order, in a circumferential direction.

Example 7. The rate of change of current sensor according to any of examples 1-4, wherein a first end of the first measurement coil is suitable for coupling to a measurement circuit and a first end of the second measurement coil is suitable for coupling to the measurement circuit, the first measurement circuit configured to determine the current passing through a current-carrying conductor under measurement.

Example 8. The rate of change of current sensor according to example 7 further comprising: a first connection conductor for connecting the first end of the first measurement coil to the measurement circuit; and a second connection conductor for connecting the first end of the second measurement coil to the measurement circuit, wherein the first connection conductor and the second connection conductor are arranged to form a twisted-pair arrangement on the substrate.

Example 9. The rate of change of current sensor according to example 7, wherein the first measurement coil and the second measurement coil are coupled to the measurement circuit using the first layer and a measurement layer of the substrate, wherein the dielectric distance between the first layer and the measurement layer is smaller than the dielectric distance between the first layer and the second layer.

Example 10. The rate of change of current sensor according to any preceding example, wherein the substrate comprises more than two layers, and wherein the first layer of the substrate and the second layer of the substrate are internal layers of the substrate, such that the current measurement coils are located on internal layers of the substrate, and wherein the substrate comprises a third layer and a fourth layer, the third layer and fourth layer located externally to the first and second layer of the substrate, the third and fourth layers comprising a shield configured to reduce electrostatic coupling to the current measurement coils.

Example 11. The rate of change of current sensor according to any preceding example, wherein the path is a through-hole in the substrate, and the through-hole is plated to provide shielding to the through-hole.

Example 12. The rate of change of current sensor according to any preceding example, wherein: the first plurality of vias comprises a first circle of vias at the inner ends of the measurement conductors of the first and second plurality of measurement conductors, wherein vias of the first circle of vias are alternately used to form the first and second measurement coils by connecting measurement conductors of the first and second plurality of measurement conductors; the second plurality of vias comprises a second circle of vias concentric with the first circle of vias at the inner ends of the measurement conductors of the third and fourth plurality of measurement conductors, wherein vias of the second circle of vias are alternately used to form the first and second return coils by connecting measurement conductors of the third and fourth plurality of measurement conductors; wherein the first circle and the second circle are concentric circles.

Example 13. The rate of change of current sensor according to example 1, wherein the rate of change of current sensor further comprises: a first compensation conductor, coupled to the first measurement coil, the first compensation conductor progressing around the path in a circumferential direction opposite to the first circumferential direction; and a second compensation conductor, coupled to the second measurement coil, the second compensation conductor progressing around the path in a circumferential direction opposite to the second circumferential direction.

Example 14. The rate of change of current sensor according to any preceding example, wherein the current-carrying conductor is provided on the substrate, routed on outer layers of the substrate and then through the centre of the first current measurement coil and the second current measurement coil.

Example 15. A rate of change of current sensor, the rate of change of current sensor comprising: a substrate, the substrate comprising a first layer, a second layer, a third layer and a fourth layer, wherein the substrate includes a path for at least one current-carrying conductor; a first plurality of measurement conductors, formed on the first layer of the substrate; a second plurality of measurement conductors, formed on the second layer of the substrate; a third plurality of measurement conductors, formed on the third layer of the substrate; a fourth plurality of measurement conductors, formed on the fourth layer of the substrate; a first plurality of vias, formed in the substrate, arranged to connect respective ends of the first plurality of measurement conductors, the second plurality of measurement conductors, the third plurality of measurement conductors and the fourth plurality of measurement conductors, so as to form a first current measurement coil which progresses around the path in a first circumferential direction and a second current measurement coil which progresses around the path in a second circumferential direction, wherein each measurement conductor on the first layer of the substrate is aligned with a respective measurement conductor on the second layer of the substrate, the third layer of the substrate and the fourth layer of the substrate, such that the respective measurement conductors form a radial plane which is substantially perpendicular to the surface of the substrate.

Example 16. The rate of change of current sensor according to example 15, wherein the first measurement coil and the second measurement coil are interleaved, such that a first turn of the first measurement coil comprises a measurement conductor of the first plurality of measurement conductors and a measurement conductor of the third plurality of measurement conductors which are located in a first radial plane, and that a first turn of the second measurement coil comprises a measurement conductor of the second plurality of measurement conductors and a measurement conductor of the fourth plurality of measurement conductors located in the first radial plane.

Example 17. The rate of change of current sensor according to of example 16, the rate of change of current sensor further comprising: a fifth plurality of measurement conductors, formed on the first layer of the substrate; a sixth plurality of measurement conductors, formed on the second layer of the substrate; a seventh plurality of measurement conductors, formed on the third layer of the substrate; a eighth plurality of measurement conductors, formed on the fourth layer of the substrate; a second plurality of vias, formed on the substrate, wherein the second plurality of vias are arranged to connect respective ends of the fifth plurality of measurement conductors, the sixth plurality of measurement conductors, the seventh plurality of measurement conductors and the eighth plurality of measurement conductors so as to form a first return coil and a second return coil, wherein a first end of the first return coil is coupled to a second end of the first measurement coil, the first return coil progressing around the path in a direction opposite to the first circumferential direction, wherein a first end of the second return coil is coupled to a second end of the second measurement coil, the second return coil progressing around the path in a direction opposite to the second circumferential direction, and wherein a first end of the first measurement coil is suitable for coupling to a measurement circuit and a first end of the second measurement coil is suitable for coupling to the measurement circuit.

Example 18. The rate of change of current sensor according to example 17, wherein the first return coil and the second return coil are interleaved, such that a first turn of the first return coil comprises a measurement conductor of the fifth plurality of measurement conductors and a measurement conductor of the seventh plurality of measurement conductors located in a second radial plane, and that a first turn of the second return coil comprises a measurement conductor of the sixth plurality of measurement conductors and a measurement conductor of the eighth plurality of measurement conductors located in the second radial plane, and wherein the second radial plane is adjacent to the first radial plane in a circumferential direction.

Example 19. The rate of change of current sensor according to example 15, wherein the rate of change of current sensor further comprises: a first compensation conductor, coupled to the first measurement coil, the first compensation conductor progressing around the path in a circumferential direction opposite to the first circumferential direction; and a second compensation conductor, coupled to the second measurement coil, the second compensation conductor progressing around the path in a circumferential direction opposite to the second circumferential direction.

Example 20. A rate of change of current sensor, the rate of change of current sensor comprising: a substrate, the substrate including a path for a current-carrying conductor; a first measurement coil formed on the substrate, arranged to surround the path in a first plane of the substrate; a second measurement coil formed on the substrate, arranged to surround the path in the first plane of the substrate; wherein the first measurement coil is interleaved with the second measurement coil in a circumferential direction around the path.

The invention claimed is:

1. A current sensor, comprising:
   a substrate comprising a first layer and a second layer, wherein the substrate includes a path for at least one current-carrying conductor;
   a first plurality of measurement conductors formed on the first layer;
   a second plurality of measurement conductors formed on the second layer; and
   a first plurality of vias, formed in the substrate, arranged to connect the ends of the first plurality of measurement conductors with respective ends of the second plurality of measurement conductors, so as to form a first current measurement coil which progresses around the path in a first circumferential direction and a second current measurement coil which progresses around the path in a second circumferential direction,
   wherein each measurement conductor of the first plurality of measurement conductors is aligned with a respective measurement conductor of the second plurality of measurement conductors in a radial plane that is perpendicular to a surface of the substrate.

2. The current sensor according to claim 1, wherein the first current measurement coil and the second current measurement coil are interleaved, such that a first turn of the first current measurement coil comprises a measurement conductor of the first plurality of measurement conductors and a measurement conductor of the second plurality of measurement conductors located in a first radial plane, and that a first turn of the second current measurement coil comprises a measurement conductor of the first plurality of measurement conductors and a measurement conductor of the second plurality of measurement conductors in a second radial plane.

3. The current sensor according to claim 1, wherein the first circumferential direction and the second circumferential direction are a same circumferential direction.

4. The current sensor according to claim 1, wherein the first circumferential direction and the second circumferential direction are opposite circumferential directions.

5. The current sensor according to claim 2, further comprising:
   a third plurality of measurement conductors formed on the first layer;
   a fourth plurality of measurement conductors formed on the second layer; and
   a second plurality of vias;
   wherein the second plurality of vias are arranged to connect the ends of the third plurality of measurement conductors with respective ends of the fourth plurality of measurement conductors so as to form a first return coil and a second return coil,
   wherein a first end of the first return coil is coupled to a second end of the first current measurement coil, the first return coil progressing around the path in a direction opposite to the first circumferential direction,
   wherein a first end of the second return coil is coupled to a second end of the second current measurement coil, the second return coil progressing around the path in a direction opposite to the second circumferential direction, and
   wherein a first end of the first current measurement coil is suitable for coupling to a measurement circuit and a first end of the second current measurement coil is suitable for coupling to the measurement circuit.

6. The current sensor according to claim 5, wherein the first measurement coil, the first return coil, the second current measurement coil, and the second return coil are interleaved, such that:
- a first turn of the first return coil comprises a measurement conductor of the third plurality of measurement conductors and a measurement conductor of the fourth plurality of measurement conductors located in a third radial plane;
- a first turn of the second return coil comprises a measurement conductor of the third plurality of measurement conductors and a measurement conductor of the fourth plurality of measurement conductors located in a fourth radial plane; and
- wherein the first radial plane, the third radial plane, the second radial plane and the fourth radial plane are arranged such that they are adjacent, in that order, in a circumferential direction.

7. The current sensor according to claim 1, wherein a first end of the first current measurement coil is suitable for coupling to a measurement circuit and a first end of the second current measurement coil is suitable for coupling to the measurement circuit, the measurement circuit configured to determine a current passing through a current-carrying conductor under measurement.

8. The current sensor according to claim 7, further comprising:
- a first connection conductor for connecting the first end of the first current measurement coil to the measurement circuit; and
- a second connection conductor for connecting the first end of the second current measurement coil to the measurement circuit,
- wherein the first connection conductor and the second connection conductor are arranged to form a twisted-pair arrangement on the substrate.

9. The current sensor according to claim 7, wherein the first current measurement coil and the second current measurement coil are coupled to the measurement circuit using the first layer and a measurement layer of the substrate, wherein a dielectric distance between the first layer and the measurement layer is smaller than a dielectric distance between the first layer and the second layer.

10. The current sensor according to claim 1, wherein the substrate comprises more than two layers, and
- wherein the first layer and the second layer are internal layers of the substrate, such that the first current measurement coil and the second current measurement coil are located on the internal layers of the substrate, and
- wherein the substrate comprises a third layer and a fourth layer, the third layer and the fourth layer located externally to the first layer and the second layer, and
- wherein the third layer and the fourth layer comprise a shield configured to reduce electrostatic coupling to the first current measurement coil and the second current measurement coil.

11. The current sensor according to claim 1, wherein the path is a through-hole in the substrate, and the through-hole is plated to provide shielding to the through-hole.

12. The current sensor according to claim 5, wherein:
- the first plurality of vias comprises a first circle of vias at inner ends of the measurement conductors of the first plurality of measurement conductors and second plurality of measurement conductors, wherein vias of the first circle of vias are alternately used to form the first current measurement coil and the second current measurement coil by connecting measurement conductors of the first plurality of measurement conductors and the second plurality of measurement conductors; and
- the second plurality of vias comprises a second circle of vias concentric with the first circle of vias at inner ends of the measurement conductors of the third plurality of measurement conductors and the fourth plurality of measurement conductors, wherein vias of the second circle of vias are alternately used to form the first return coil and the second return coil by connecting measurement conductors of the third plurality of measurement conductors and the fourth plurality of measurement conductors;
- the first circle and the second circle are concentric circles.

13. The current sensor according to claim 1, further comprising:
- a first compensation conductor coupled to the first current measurement coil, the first compensation conductor progressing around the path in a circumferential direction opposite to the first circumferential direction; and
- a second compensation conductor coupled to the second current measurement coil, the second compensation conductor progressing around the path in a circumferential direction opposite to the second circumferential direction.

14. The current sensor according to claim 1, wherein a first current-carrying of the at least one current-carrying conductor is provided on the substrate, routed on outer layers of the substrate and then through a centre of the first current measurement coil and the second current measurement coil.

15. A current sensor, comprising:
- a substrate comprising a first layer, a second layer, a third layer, and a fourth layer, wherein the substrate includes a path for at least one current-carrying conductor;
- a first plurality of measurement conductors formed on the first layer;
- a second plurality of measurement conductors formed on the second layer;
- a third plurality of measurement conductors formed on the third layer;
- a fourth plurality of measurement conductors formed on the fourth layer; and
- a first plurality of vias formed in the substrate and arranged to connect respective ends of the first plurality of measurement conductors, the second plurality of measurement conductors, the third plurality of measurement conductors, and the fourth plurality of measurement conductors, so as to form a first current measurement coil which progresses around the path in a first circumferential direction and a second current measurement coil which progresses around the path in a second circumferential direction,
- wherein each measurement conductor on the first layer is aligned with a respective measurement conductor on the second layer, the third layer, and the fourth layer, such that measurement conductors in the second layer, the third layer, and the fourth layer form a radial plane which is substantially perpendicular to a surface of the substrate.

16. The current sensor according to claim 15, wherein the first current measurement coil and the second current measurement coil are interleaved, such that a first turn of the first current measurement coil comprises a measurement conductor of the first plurality of measurement conductors and a measurement conductor of the third plurality of measurement conductors which are located in a first radial plane, and that a first turn of the second current measurement coil comprises a measurement conductor of the second plurality of measurement conductors and a measurement conductor of the fourth plurality of measurement conductors located in the first radial plane.

17. The current sensor according to claim 16, further comprising:
   a fifth plurality of measurement conductors formed on the first layer;
   a sixth plurality of measurement conductors formed on the second layer;
   a seventh plurality of measurement conductors formed on the third layer;
   an eighth plurality of measurement conductors formed on the fourth layer; and
   a second plurality of vias formed on the substrate, wherein the second plurality of vias are arranged to connect respective ends of the fifth plurality of measurement conductors, the sixth plurality of measurement conductors, the seventh plurality of measurement conductors, and the eighth plurality of measurement conductors so as to form a first return coil and a second return coil,
   wherein a first end of the first return coil is coupled to a second end of the first current measurement coil, the first return coil progressing around the path in a direction opposite to the first circumferential direction,
   wherein a first end of the second return coil is coupled to a second end of the second current measurement coil, the second return coil progressing around the path in a direction opposite to the second circumferential direction, and
   wherein a first end of the first current measurement coil is suitable for coupling to a measurement circuit and a first end of the second current measurement coil is suitable for coupling to the measurement circuit.

18. The current sensor according to claim 17, wherein the first return coil and the second return coil are interleaved, such that a first turn of the first return coil comprises a measurement conductor of the fifth plurality of measurement conductors and a measurement conductor of the seventh plurality of measurement conductors located in a second radial plane, and that a first turn of the second return coil comprises a measurement conductor of the sixth plurality of measurement conductors and a measurement conductor of the eighth plurality of measurement conductors located in the second radial plane, and
   wherein the second radial plane is adjacent to the first radial plane in a circumferential direction.

19. The current sensor according to claim 15, further comprises comprising:
   a first compensation conductor coupled to the first current measurement coil, the first compensation conductor progressing around the path in a circumferential direction opposite to the first circumferential direction; and
   a second compensation conductor coupled to the second current measurement coil, the second compensation conductor progressing around the path in a circumferential direction opposite to the second circumferential direction.

20. A current sensor, comprising:
   a substrate including a path for a current-carrying conductor;
   a first current measurement coil formed on the substrate and arranged to surround the path in a first plane of the substrate; and
   a second current measurement coil formed on the substrate and arranged to surround the path in the first plane of the substrate;
   wherein the first current measurement coil is interleaved with the second current measurement coil in a circumferential direction around the path.

* * * * *